United States Patent

Douglas et al.

[11] Patent Number: 5,844,810
[45] Date of Patent: Dec. 1, 1998

[54] SCALED ADAPTIVE LITHOGRAPHY

[75] Inventors: Leonard Richard Douglas, Burnt Hills; Richard Joseph Saia, Schenectady; Kevin Matthew Durocher, Waterford, all of N.Y.

[73] Assignee: General Electric Company, Schenectady, N.Y.

[21] Appl. No.: 453,110

[22] Filed: May 30, 1995

[51] Int. Cl.⁶ .............................. G01B 9/00; G06F 15/46
[52] U.S. Cl. ...................... 364/491; 364/490; 364/167.01
[58] Field of Search ............................ 395/500; 364/578, 364/167.01, 191, 571.01, 488–491

[56] References Cited

U.S. PATENT DOCUMENTS

| | | | |
|---|---|---|---|
| 4,783,695 | 11/1988 | Eichelberger et al. | 257/668 |
| 4,835,704 | 5/1989 | Eichelberger et al. | 364/490 |
| 4,894,115 | 1/1990 | Eichelberger et al. | 134/1.1 |
| 4,933,042 | 6/1990 | Eichelberger et al. | 156/239 |
| 4,972,311 | 11/1990 | Holdgrafer et al. | 364/167.01 |
| 5,019,946 | 5/1991 | Eichelberger et al. | 361/795 |
| 5,019,997 | 5/1991 | Haller | 364/488 |
| 5,161,093 | 11/1992 | Gorzcyca et al. | 361/795 |
| 5,257,178 | 10/1993 | Hatfield et al. | 364/191 |
| 5,285,571 | 2/1994 | Gorczyca et al. | 29/848 |
| 5,324,687 | 6/1994 | Wojnarowski | 438/107 |
| 5,355,306 | 10/1994 | Waldo, III | 364/167.01 |
| 5,506,793 | 4/1996 | Straayer et al. | 364/571.01 |

FOREIGN PATENT DOCUMENTS 2202673  9/1988  United Kingdom ............ H01L 21/60

Primary Examiner—Kevin J. Teska
Assistant Examiner—Matthew Loppnow
Attorney, Agent, or Firm—Ann M. Agosti; Marvin Snyder

[57] ABSTRACT

An adaptive method of providing electrical interconnections for a plurality of feed-through lines each having a respective end extending to at least one substrate surface includes generating an artwork representation for the electrical interconnections using specified feed-through line end positions on the at least one substrate surface. The at least one substrate surface may include a surface of a stack of substrates with at least two substrates having feed-through line ends facing a common direction. Actual positions of the at least two of the feed-through line ends are determined, and a scale factor is estimated using the determined actual positions. Actual positions of others of the feed-through line ends are estimated using the scale factor, and the artwork representation is modified to properly include electrical interconnections to ones of the feed-through line ends which are not in their specified positions. The artwork representation can be converted into a turn point polygon (TPP) format for effective data handling and modification of the artwork representation, and the TPP format can then be can be converted to a rectangular representation. A laser can be controlled in accordance with the rectangular representation of the modified artwork.

14 Claims, 5 Drawing Sheets

SCALED ADAPTIVE LITHOGRAPHY

The invention was made with Government support under contract number F29601-89-C-0014 awarded by the Air Force. The Government has certain rights in the invention.

SPEECH INFORMATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

BACKGROUND OF THE INVENTION

Co-fired packages are used as substrates for multi-chip modules and can include materials such as alumina or aluminum nitride with buried conductors which offer a variety of physical and electrical advantages. Such packages can be used in two dimensional high density interconnect (HDI) processes to reduce the number of metal interconnect layers, to fabricate hermetically sealed modules, and to provide vertical feed-through connections. As disclosed in commonly assigned and concurrently filed Saia et al., "Stacking of Three Dimensional High Density Interconnect Modules with Metal Edge Contacts," U.S. application Ser. No. 08/453,109, still pending, which is herein incorporated by reference, co-fired packages can be used in three dimensional HDI processes to provide edge feed-through connections.

When co-fired substrates are used for two dimensional HDI, an overlay pattern must be aligned with respective ends of the buried feed-through conductor paths (hereinafter referred to as feed-through lines). If the substrate end pitch of a feed-through line is greater than about 20 mils, it would be possible to align a fixed grid pattern of cover pads over the ends. For smaller end pitches, the tolerance of via placement due to movement in the substrate material during firing can hinder the overlay of a fixed grid array of cover pads. Likewise, an end pitch of at least 18 mils is preferred for most three dimensional HDI designs.

Eichelberger et al., U.S. Pat. No. 4,835,704, is a patent in which adaptive lithography was developed to align pattern transfer mask artwork to die positioned on a substrate by compensating for translational and rotational errors in chip placement. In U.S. Pat. 4,835,704, the chip and HDI artwork are both known, fixed arrays.

SUMMARY OF THE INVENTION

It would be desirable to have an adaptive lithography method for situations in which one of two patterns being aligned is not fixed.

The present invention includes a method of adapting a fixed grid lithographic artwork pattern to a variable expanded or contracted artwork array by introducing a scale factor in addition to translational and rotational factors.

The invention can be used in one embodiment, for example, for precision aligning a fixed pattern transfer artwork array to a variable expanded or contracted pattern array that exists on co-fired substrates with thick film feed-through conductor paths. The added alignment accuracy will permit the use of co-fired substrates with a feed-through path via pitch of about 10 mils or greater.

Briefly, according to an embodiment of the present invention, an adaptive method of providing electrical interconnections for a plurality of feed-through lines each having a respective end extending to at least one substrate surface comprises generating an artwork representation for the electrical interconnections using specified feed-through line end positions on at least one substrate surface; determining actual positions of at least two of the feed-through line ends; estimating a scale factor using the actual positions of at least two of the feed-through line ends; estimating actual positions of the other feed-through line ends using the scale factor; modifying the artwork representation for the electrical interconnections for the feed-through lines to properly include electrical interconnections to ones of the feed-through line ends which are not in their specified positions; and forming the electrical interconnections for the feed-through lines using the modified artwork.

A substrate surface may comprise a surface of a stack of substrates with at least two substrates having feed-through line ends facing a common direction. The specified feed-through line end positions can be situated in a row and at least two of the feed-through line ends for which actual positions are determined can be situated at opposite ends of the row, for example. The artwork representation can be converted into a turn point polygon (TPP) format for effective data handling and modification of the artwork representation. A laser can be controlled in accordance with the TPP representation of the modified artwork. In one embodiment, the TPP format is first converted to a rectangular representation which is then used to control the laser.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF A PREFERRED EMBODIMENT OF THE INVENTION

Figure 1:
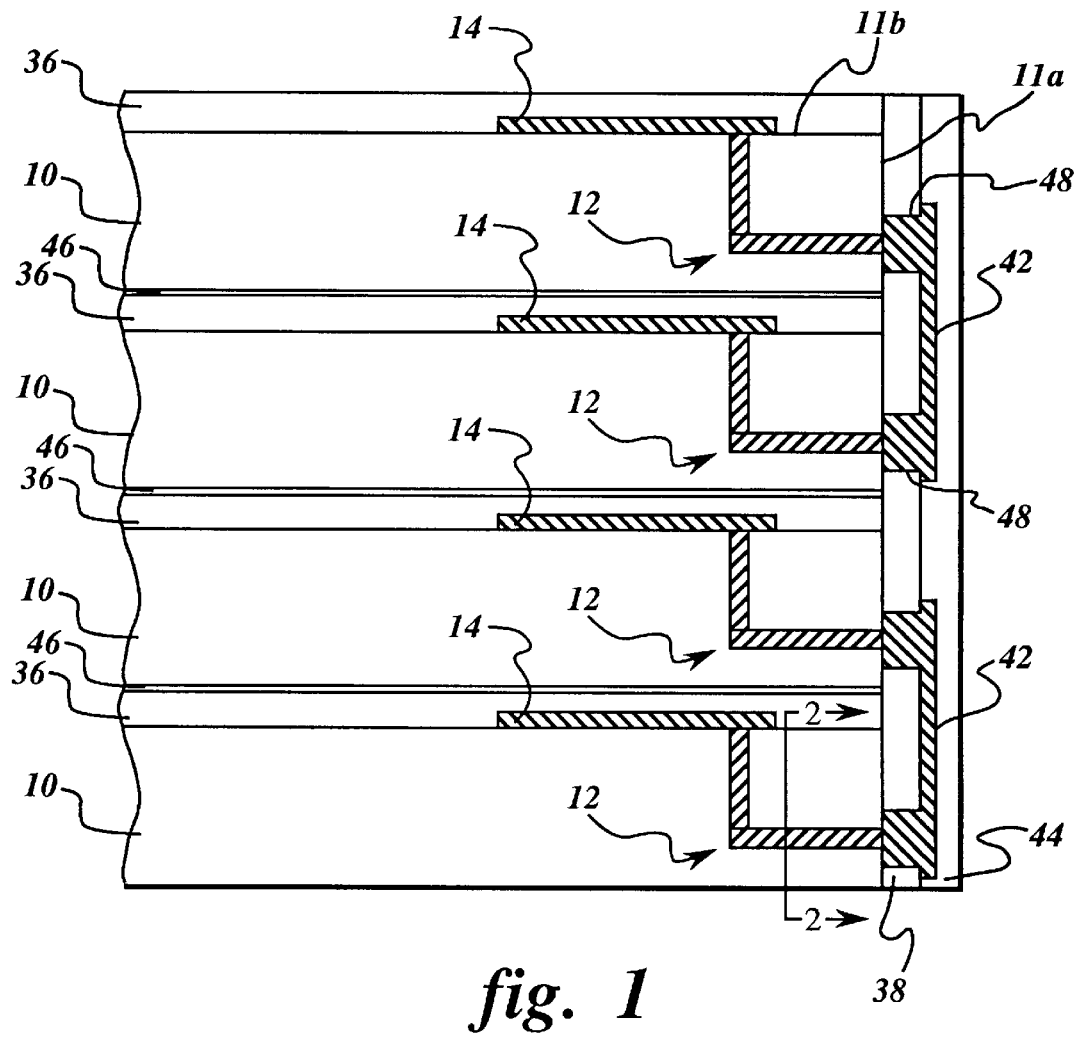
FIG. 1 is a sectional side view of stacked and interconnected two dimensional electronic modules.

FIG. 1 is a sectional side view of a plurality of stacked and interconnected two dimensional electronic modules. As described in aforementioned Saia et al., "Stacking of Three Dimensional High Density Interconnect Modules with Metal Edge Contacts," a method for fabricating a stack of circuit modules includes providing a plurality of substrates 10 having module interconnection layers 36 (defined below). Each of the substrates has a circuit chip (not shown) with chip pads positioned therein and an electrically conductive feed-through line 12 having one end extending to a first surface 11b of the substrate and having another end extending to a second surface 11a of the substrate with the first surface being perpendicular to the second surface.

Each of the module interconnection layers is situated over a respective first surface of each of the substrates and may include, for example, a module dielectric layer having module vias therein and a module pattern of electrical conductors extending through the module vias to couple the selected chip pads to the feed-through lines (not shown). Base metallization layers 14 can be applied on the first surfaces of the substrates prior to the module interconnection layers, if desired. The plurality of substrates are stacked. In one embodiment, an adhesive 46 is used between adjacent substrates. A side interconnection layer is applied over a side surface including the second surfaces 11a of the substrates. The side interconnection layer includes a side dielectric layer 38 having side vias 48 therein aligned with predetermined ones of the feed-through lines and a side pattern of electrical conductors 42 extending through the side vias. A passivation layer 44 can be applied over the side pattern of electrical conductors.

Figure 2:
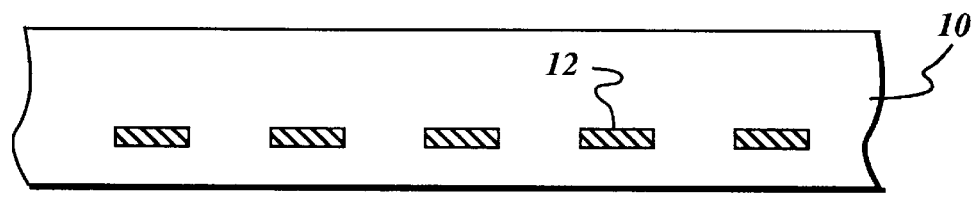
FIG. 2 is a sectional view along line 2—2 of FIG. 1.

FIG. 2 is a sectional view along line 2—2 of FIG. 1. Each substrate 10 can include one or more electrically conductive feed-through lines 12 extending to the substrate edge. Furthermore, if desired, multiple edges (not shown) of each substrate can have feed-through lines exposed.

Figure 3:
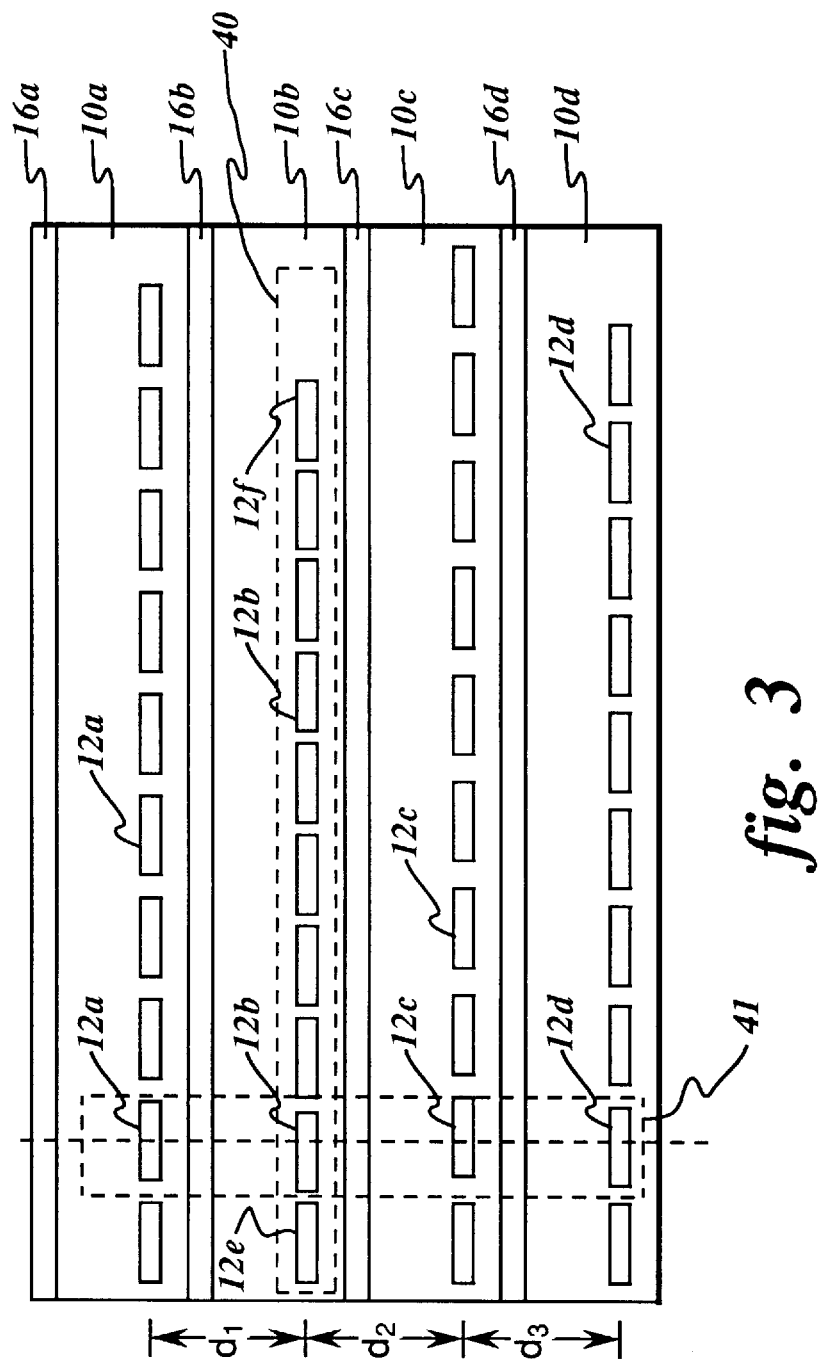
FIG. 3 is a side view of a stack of two dimensional electronic modules illustrating positions of electrically conductive feed-through lines.

FIG. 3 is a side view of a stack of two dimensional electronic modules comprising substrates 10a, 10b, 10c, and 10d and respective module interconnection layers 16a, 16b, 16c, and 16d illustrating positions of electrically conductive feed-through lines 12a, 12b, 12c, and 12d.

Precise alignment and positioning of the feed-through lines is difficult to achieve. One problem, which is especially difficult to overcome for co-fired ceramic substrates, is that the feed-through lines tend to move during substrate fabrication. Another challenge arises when the distances $d_1$, $d_2$, and $d_3$ are varied due to differing module interconnection layer thicknesses or adhesive layer (shown in FIG. 1) thicknesses. Therefore, it can be difficult to accurately predict the positions of feed-through lines.

As an illustrative example, feed-through lines 12a in substrate 10a represent the positions of an aligned row, feed-through lines 12b and 12d in substrates 10b and 10d represent respective rows of feed-through lines which have been compressed with the feed-through lines being closer together, and feed-through lines 12c in substrate 10c represent a row of feed-through lines which has been expanded. Similarly, $d_3$ represents a distance between adjacent rows of feed-through lines which is greater than either of $d_1$ or $d_2$.

As can be seen from FIG. 3, individual feed-through lines within a single row can be shifted in addition to the potential of the adaptive region 40 of the row itself to be translated and/or rotated. A similar situation can be detected with respect to an adaptive region 41 around a column.

Figure 4:
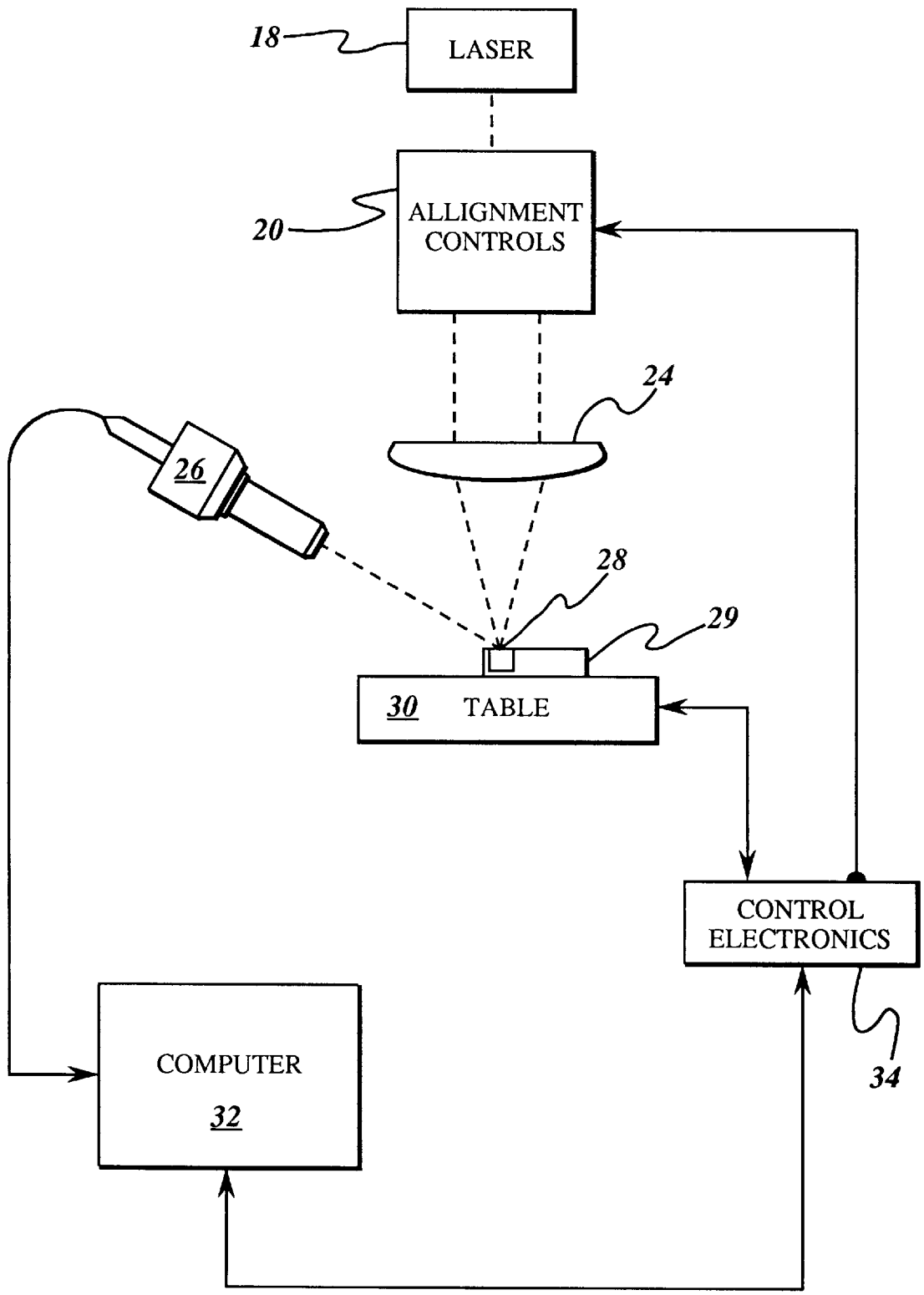
FIG. 4 is an illustration of a system for determining the positions of selected ends of the feed-through lines and estimating the positions of the other feed-through lines.

FIG. 4 is an illustration of a system for detecting the positions of selected ends of the feed-through lines and estimating the positions of other ones of the feed-through lines. FIG. 4 additionally illustrates a laser 18 (with associated alignment controls 20 and lens 24) which can be used in a later discussed step of forming a pattern of electrical conductors for interconnecting selected feed-through lines. As described in aforementioned Eichelberger et al., U.S. Pat. No. 4,835,704, a table 30 can be used to support a workpiece 28 for scanning with a CID (charge inducted device) or CCD (charge coupled device) camera 26. A computer 32 exchanges data with control electronics 34 which can be used to control the table positioning.

In one embodiment of the present invention, the workpiece comprises a stack such as shown in FIG. 3 with the feed-through lines 12a, 12b, 12c, and 12d facing the camera. Preferably the stack is surrounded by a support fixture 29 including a material such as titanium.

Figure 5:
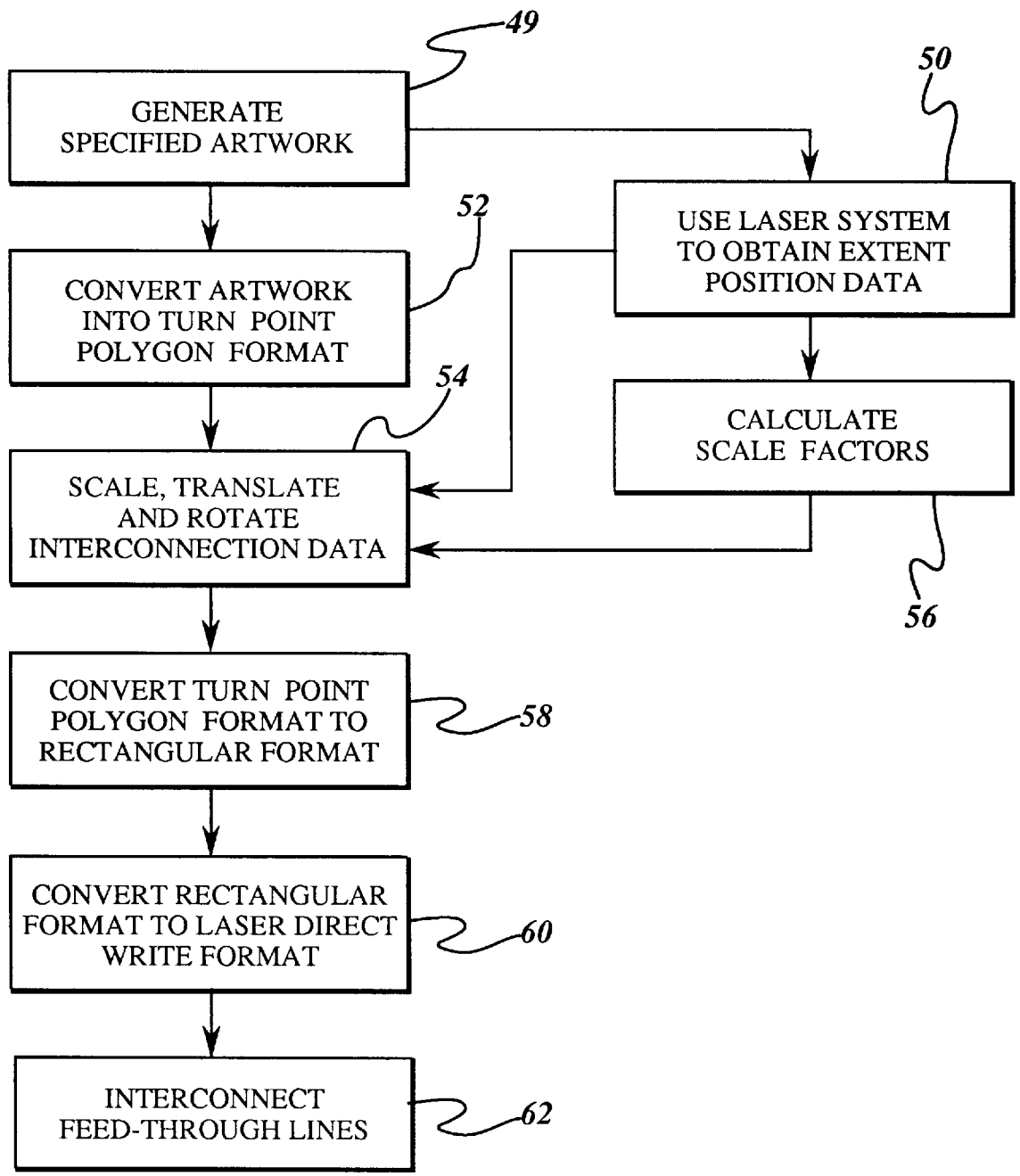
FIG. 5 is a flowchart of steps in one embodiment of the present invention.

FIG. 5 is a flowchart of steps in one embodiment of the present invention. At step 49, ideal case artwork can be generated using a computer aided design system or an automatic routing system. The term "artwork" refers to a pattern in the form of a database (referred to as a "first" database) which describes the ideal positions of the feed-through lines and the interconnect structure for providing interconnects between electronic components and/or feed-through lines. When the ideal artwork is modified, that modified artwork can be used to drive a laser beam under computer control to directly write interconnection patterns in metallization and/or photoresist that have been modified to adjust for the measured and estimated positions of the feed-through lines, for example.

Any computer aided design (CAD) system can interface to an adaptive lithography system with changes in the software which convert to the stripped level of data coding being necessary. In the embodiment of FIG. 5, for example, at step 52, ideal artwork data is converted into turn point polygon (TPP) format (which is stored in a "second" database). Other techniques that may be used include bit maps in binary formats, for example.

At step 49 in FIG. 5, a CAD system can output a drawing interchange file (DXF) which is an ASCII output file of many commercial CAD packages. TPP format describes a closed convex polygon by a listing of respective (x, y) coordinates of all the vertices. The CAD to TPP data conversion can be accomplished using software programmed in a language such as C to convert DXF format to TPP format. For example, Appendix A is a source code listing of a computer program which can be used to convert DXF format to TPP format.

Instead of measuring each individual feed-through line end position, in the present invention the positions of a smaller number of feed-through line ends can be obtained at step 50 by the process discussed with respect to FIG. 4, and the positions of the remainder of the feed-through line ends can then be estimated at step 56 using a technique including the calculation of scale correction factors. In one embodiment what is detected is the positions of the extents (the two feed-through line ends which are farthest apart in a respective substrate, such as 12e and 12f in substrate 10b of FIG. 3). The larger the number of adaptive regions and measured feed-through line end positions, the greater the accuracy of estimations of the other feed-through line end positions and the greater the complexity of the adaptive lithography technique.

For a respective one of the substrates in an adaptive region 40 (shown in FIG. 3), for example, reference points ($x_1$, $y_1$) and ($x_2$, $y_2$) for feed-through lines 12e and 12f can be measured.

Scale factors for the group of feed-through line end positions between the reference points can be calculated at step 56, for example, using the following equations which compare the measured positions to the ideal (specified) positions of the original artwork:

$$\% \ x \ \text{scale} = (\text{measured } x2 - \text{measured } x1)/(\text{specified } x2 - \text{specified } x1)$$

$$\% \ y \ \text{scale} = (\text{measured } y2 - \text{measured } y1)/(\text{specified } y2 - \text{specified } y1)$$

These calculations provide respective (x, y) scale factors for an adaptive region. A database can be generated which describes the actual locations of each of the feed-through line ends. This database can be compared to the ideal case positions listed in the first database, and translation and rotation errors can be calculated for the feed-through line end positions of the adaptive region. The scale, translational errors, and rotational errors can be used to generate a "third" database.

After the data has been converted to TPP format and the scale factors have been calculated, at step 54 the scale transformation is performed in conjunction with translation and rotation with respect to a fixed reference point in the adaptive region.

An adaptive region bounds the adaptive lithography algorithms to specified areas and is described in rectangular format by two (x, y) coordinates of diagonal vertices. HDI metal interconnection patterns and via openings which reside within or pass through the adaptive region can be scaled using the calculated scale factors in conjunction with translational and rotational transformations. The basic formulas for translation, rotation, and scale transformation are as follows:

TRANSLATION $$x' = x + Tx$$

$$y' = y + Ty$$

ROTATION $$x' = xR + (x-xR)\cos\theta - (y-yR)\sin\theta$$

$$y' = yR + (y-yR)\cos\theta - (x-xR)\sin\theta$$

SCALE $$x' = xF + (x-xF)Sx$$

$$y' = yF + (y-yF)Sy,$$

wherein the translational distance is (Tx, Ty) is the distance that an adaptive region has moved, the rotation of the adaptive region point is (xR, yR), and the scale factors for individual feed-through lines within an adaptive region are (Sx, Sy) with a fixed point of (xF, yF).

The three transformations can be combined as follows:

$$xx = (((x-xref[ic]) * scale\_x[ic] + xref[ic]) + ((y-yref[ic]) * rotate[ic]) + xoffset[ic];$$

$$yy = (((y-yref[ic]) * scale)\_y[ic] + yref[ic] - ((x-xref[ic]) * rotate[ic]) + yoffset[ic],$$

wherein (xx, yy) is the transformed (x, y) vertex of TPP; (x, y) is the (x, y) vertex of TPP; (scale_x, scale_y) is the (x, y) scale factors; (x_ref, y_ref) is the fixed reference point; rotate[ic] is the rotation units in radians; and (xoffset, yoffset) is the linear offset from the fixed reference point.

The vertices of a designated TPP structure inside the adaptive region are transformed and output to a "fourth" database. New vertices are added to TPP structures which cross an adaptive region to provide the fixed points for interconnect stretching and bending.

At step 58, the adapted TPP data (the fourth database) is fractured and converted to rectangular format. For example, Appendix B is a source code listing of a computer program which can be used to convert adapted TPP data to rectangular format.

At step 60, the rectangular data is then converted to laser direct write (RLL) format for laser lithography processing. For example, Appendix C is a source code listing of a computer program which can be used to convert rectangular data to RLL format. At step 62, the interconnection steps discussed with respect to FIG. 1 of applying a side dielectric layer and pattern of electrical conductors are performed using the data in the laser direct write format to form vias 48 and fabricate the pattern of electrical conductors 42. The pattern of electrical conductors can be scaled, translated, and rotated in accordance with the RLL format. In an alternative embodiment, software could be designed to convert TPP format directly to RLL format.

The method was reduced to practice using co-fired ceramic packages including 80 feed-through lines having pitches of 18 mils along two opposite edges. The positioning of the feed-through lines on the finished substrates relative to the planned position can be referenced in several ways. The simplest method is to measure the overall length of a row of feed-through lines in an adaptive region. This method does not take into account the rotational error in the placement of the feed-through lines, but the method will provide an indication of the ability to overlay a fixed pitch of cover pads. In more complicated applications, it is possible to obtain feed-through line position information at selected points in a curve or other appropriate configuration using the above discussed information with appropriate modifications to the formulas and software.

A pattern with 14 mil cover pads was applied on the 18 mil feed-through lines in several patterning tests. The process of aforementioned U.S. Pat. No. 4,835,704 was used and, on the substrates with larger placement errors, the lines were not completely covered by the pads. When the scaled turn point polygon adaptive lithography method of the present invention was used, the artwork expanded and contracted as necessary, providing complete line coverage.

Figure 6:
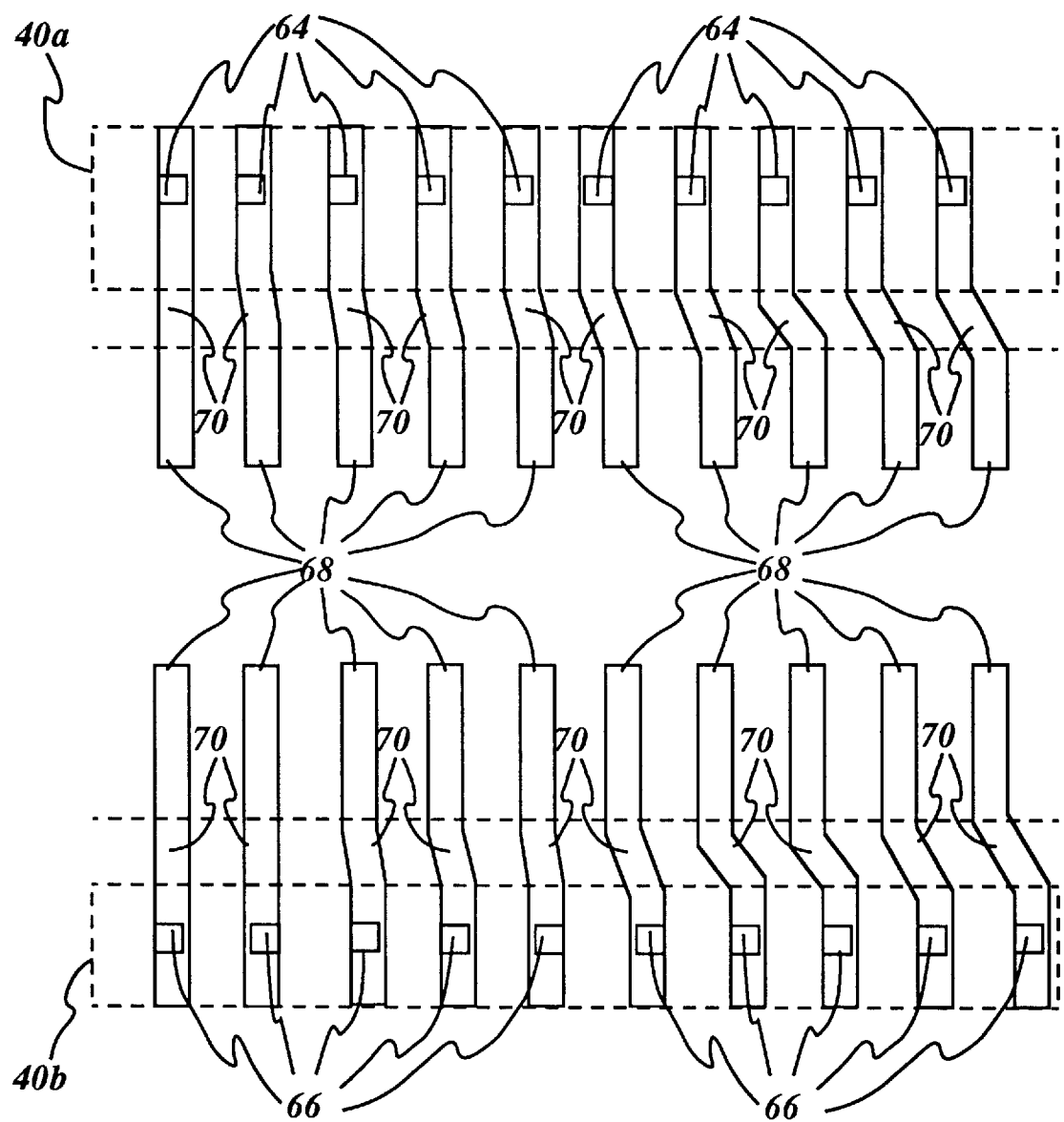
FIG. 6 is a top view of a representative conductor path modification expected from use of the present invention.

FIG. 6 is a top view of a representative conductor path modification expected from use of the present invention. Feed-through line end positions 64 and 66 represent compressed and expanded positions respectively with respect to the fixed artwork portions 68 of a pattern of electrical conductors. Portions 70 of the pattern of electrical conductors link the fixed artwork to adaptive regions 40a and 40b.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

HD-23,619

- 13 -

APPENDIX A

```
/********************************************************************
 ***
 *
 *
 *       Program:        dxf2tpp.c
 *
 *       Version:        1.05[D,U]
 *
 *
 *       SCCS Program:   %M%
 *
 *       SCCS Version:   %I% %G% %U%
 *
 *
 *       Author:         Leonard R. Douglas
 *
 *       Date:           3/18/93
 *
 *       Language:       Microsoft C 6.0  (IBM-PC)
 *
 *
 *       Compile/Link:   cl dxf2tpp.c  (IBM-PC)
 *
 *                       gcc -ansi dxf2tpp.c -lm (SUN1+)
 *
 *
 *       Class:          III General Electric Proprietary Data
 *
 *                       (c) Copyright 1993-95 General Electric Company
 *
 *
 *       Purpose:        DXF to TPP (Turn Point Polygon) format converter
 *
 *
 *       Supported DXF Entities:
 *
 *                       Polylines
 *
 *                       - Open
 *
 *                       - 0 or defined width
 *
 *                       - Tapered
 *
 *                       - Changing width
 *
 *                       - Polyline arcs
 *
 *                       - Equal (x,y) insert scale
 *
 *                       - No twists or crossing allowed on
```

HD-23,619

- 14 -

```
              non-orthogonal segments
          Polygon (actually 0 width polyline)
          Traces
              - limited support
              - Orthogonal only, single segments
          Points
          Lines (line option on)
              - 2 vertex entity import
          Circles
              - Equal (x,y) insert scale
          Blocks
              - 10 levels of nesting
              - Block names 8 characters or less
              - Valid block name characters (A-Z, a-z, 0-9, _)
              - No MINSERT allowed TPP Format:   starting width   ending width
              x1 (vertex#1)    y1 (vertex#1)
              x2 (vertex#2)    y2 (vertex#2)
              xn (vertex#n)    yn (vertex#n)
              terminator       terminator Terminator Masks
          ------------------ continue TPP path  = (LONG_MAX LONG_MAX)
          terminate TPP path = (LONG_MIN LONG_MIN)

LONG_MAX=0, LONG_MIN=1
```

HD-23,619

```
*                      - 15 -
*
*              00    =    continue and mitre joint
*
*              01    =    not used
*
*              10    =    not used
*
*              11    =    terminate
*
*
*           Example:
*
*
*              50              50
*
*              10              10
*
*              20              20
*
*              2147483647      2147483647
*
*              100             100
*
*              40              40
*
*              50              50
*
*              -2147483647     -2147483647
*
*              0               0
*
*              10              10
*
*              10              20
*
*              20              20
*
*              20              10
*
*              10              10
*
*              -2147483647     -2147483647
*
*
*        A block name replacement table (DXF2TPP.TAB) can be used for
*
*        block names greater than 8 characters.
*
*
*        Table format:
*
*
*        line1   text
*
*        line2   original_block_name1    new_block_name1
*
```

HD-23,619

- 16 -

```
*       line3    original_block_name2    new_block_name2
*
*
*
*       example:
*
*
*
*       dxf2tpp.tab -- block name replacement table for teg5.dxf 5/17/94
*
*       VIA2MILX2MIL    {BLK0}
*
*       VIA3MILX3MIL    {BLK1}
*
*       VIA4MILX4MIL    {BLK2}
*
*
*
*       Debug values:
*
*       -------------
*
*
*
*       -d1      output hash table
*
*       -d2      output hash index
*
*       -d4      trace state diagrams
*
*       -d8      output line of dxf file
*
*       -d16     write to dxf2tpp.log
*
*       -d32     output polyline processing
*
*       -d64     trace entered routine
*
*       -d128    trace default entities
*
*       -d256    output all ERROR, WARNING and BLOCKSUB messages
*
*
*
*       Revisions:
*
*       ----------
*
*
*
*       Version 1.01
*
*
*
*       10/12/94   lrd    Beta code for polyline arcs, circles added
*
*
*
*       10/27/94   lrd    Updated comments, documemtation
*
```

HD-23,619

- 17 -

```
         *
         *
         *   10/28/94  lrd   Increased file string sizes from 20 to 80 chars
         *
         *
         *
         *   Version 1.02
         *
         *
         *
         *   11/11/94  lrd   Beta comments for circles and pline arcs removed
         *
         *                   Flags for closed plines added
         *
         *
         *   11/14/94  lrd   Do not purge mec file in conversion directory
         *
         *
         *
         *   11/17/94  lrd   Layer and location output on non-supported parsed
         *
         *                   (LINE,ARC,SOLID)
         *
         *                   Also added layer and location output on WARNING
         *
         *                   and ERROR statments
         *
         *
         *   Version 1.03
         *
         *
         *
         *   11/22/94  lrd   Check for .mec file in directory and prevent purge
         *
         *                   Also added -f to UNIX rm file purges
         *
         *
         *   12/07/94  lrd   Updated comments, documemtation
         *
         *
         *   Version 1.04
         *
         *
         *
         *   01/11/95  lrd   Added support for mirrored negative scaled insert
         *
         *                   of pline arc
         *
         *
         *
         *   02/09/95  lrd   Added support for mirrored negative scaled insert
         *
         *                   of rotated insert
         *
         *
         *
```

HD-23,619

- 18 -

```
*       Version 1.05
*
*
*
*       02/28/95  lrd   Warning and Error messages will only be output for
*
*                       valid HDI and point designated layers
*
*                       Added debug value for ERROR, WARNING and BLOCKSUB
*
*                       messages
*
*
*
*       04/18/95  lrd   Increased LOOKUPSIZE to 200
*
*                       Added date and version strings
*
*
****************************************************************************
**/ char version[]="1.05";
char vdate[]="(04/18/95)";

static  char    sccsid[]="%W% %G%";    /* SCCS header */ include <stdio.h>
include <stdlib.h>
#include <string.h>
#include <errno.h>
include <ctype.h> include "localcpu.h"
include "dxfdef.h"

#define HASH_TAB_SIZE   128
#define MAX_TP          1024           /* max turnpoints */
#define CIRCLE_MAX_TP   30             /* max turnpoints for circle */
#define OUTFILE         "dxf2tpp.log"  /* output file for diag */
#define LOOKUPFILE      "dxf2tpp.tab"  /* lookup table for block names */
#define LOOKUPSIZE      200            /* lookup table size */
#define OPEN            0              /* polyline descriptions */
#define CLOSE           1
#define INIT            2
#define WIDTHCHANGE     3
#define ORTHOCHANGE     4
#define BULGE           5
#define BLOCKDEF        6              /* block defined */
#define NOBLOCKDEF      7              /* no block defined */
#define OUTPUT          0
#define INPUT           1
#define MAIN            0              /* main parser */
#define SUB             1              /* sub parser (block inserts) */
#define MAXNEST         10             /* max number of nested block inserts */
#define START           0
#define FINISH          1
#define M_PI            3.14159265358979323846
```

HD-23,619

- 19 -

```
        #ifdef  IBMPC
          #include <math.h>
          #include <process.h>
          #include <limits.h>
 5        char basedir[]="\\hdi2\\";      /* base directory prefix */
          char os_type='D';
        #endif ifdef  SUN
10        #define LONG_MAX 2147483647
          #define LONG_MIN -2147483647
          char basedir[]="/tmp_mnt/home/zeppo/douglas/hdi2/";/* base directory
        prefix */
          char os_type='U';
15        extern double fabs(double);
          extern double sin(double);
          extern double cos(double);
          extern double atan(double);
          extern double atan2(double,double);
20        extern double sqrt(double);
          extern double pow(double,double);
        #endif FILE *file_ptr_in;              /* pointer for file */
25      FILE *file_ptr_out;             /* pointer for file */
        char stemp[80];                 /* temporary string */
        char dxffile[80];               /* design_file.dxf */
        char filename[9];               /* design_file_name */
        char bstring[9];                /* debug: trace block name */
30      char istring[9];                /* debug: trace insert block name */
        char last_layer[80];            /* record last polyline layer */
        tok_tab *tok_hash[HASH_TAB_SIZE];

int betacode_select=0;          /* beta code select on/off */
35      int betacode=1;                 /* beta code on */
        int debug=0;                    /* debug select */
        int hdi_format=0;               /* output hdi format */
        int tpp_format=1;               /* default output: tpp format */
        int import_line=0;              /* import line only dxf files */
40      int purge_blk=1;                /* purge blocks (*.blk) files */ typedef
        struct look {
          char old[40];
45        char new[40];
          } lookup;
        lookup lookup_table[LOOKUPSIZE];
        int lookup_table_size=0;

50      long block_count=0;             /* supported entities */
        long insert_count=0;
        long trace_count=0;
        long point_count=0;
        long polyline_count=0;
55      long vertex_count=0;
        long seqend_count=0;
        long error_count=0;

long mt0=0;                     /* Laser2 supported layer counts */
60      long mt1=0;
```

HD-23,619

- 20 -

```
        long mt2=0;
        long mt3=0;
        long mt4=0;
        long mt5=0;
 5      long mt6=0;
        long mt7=0;
        long mt8=0;
        long mt9=0;

10      long dr1=0;
        long dr2=0;
        long dr3=0;
        long dr4=0;
        long dr5=0;
15      long dr6=0;
        long dr7=0;
        long dr8=0;
        long dr9=0;

20      long leg=0;
        long alm=0;

long line_count=0;          /* entities not supported */
        long circle_count=0;
25      long arc_count=0;
        long solid_count=0;

double xoffset=0.0;         /* major dxf offsets */
        double yoffset=0.0;
30      double scale=1.0;
        int max_recur_count=0;      /* recursive call counter */
        double pline_start=0.0;     /* global pline start, end widths */
        double pline_end=0.0;
        int segment_next=0;
35      int bulge_next=0;
        int parsed_40;
        int parsed_41;
        long prev_start=0;          /* previous polyline values */
        long prev_end=0;
40      long prev_x0;
        long prev_y0;
        double prev_bulge;
        int ortho=1;
        int ortho_check=1;          /* default ortho transition pline check */
45      int local_vertex_count=0;

insert qindat[MAXNEST];     /* global insert definition for restore */ void main(int, char *[]);   /* function prototypes */
50      char *get_tag(FILE *);
        int get_tag_token(char *);
        void get_params(int,char *[]);
        int hash(char *);
        double get_double(FILE *);
55      char *get_string(FILE *);
        block process_block(FILE *,FILE *,int);
        insert process_insert(FILE *,FILE *,int,block,insert,int);
        trace process_trace(FILE *,FILE *,int,block,int);
        poly process_polyline(FILE *,FILE *,int,int,block,int);
60      point process_point(FILE *,FILE *,int,block,int);
```

HD-23,619

- 21 -

```
                line process_line(FILE *,FILE *,int,block,int);
                circle process_circle(FILE *,FILE *,int,block,int);
                arc process_arc(FILE *,FILE *,int,block,int);
                solid process_solid(FILE *,FILE *,int,block,int);
 5              int write_block(block,FILE *);
                int write_insert(insert,FILE *,int,block,int,int);
                int write_trace(trace,FILE *,int,block);
                int write_poly(poly,FILE *,int,int,block);
                int write_point(point,FILE *,int,block);
10              int write_line(line,FILE *,int,block);
                int write_circle(circle,FILE *,int,block);
                int write_arc(arc,FILE *,int,block);
                int write_solid(solid,FILE *,int,block);
                void write_dxf(FILE *,int,void *);
15              void dwrite_block(FILE *,char *,char *,int,double,double);
                void dwrite_insert(FILE *,char *,char *,int,double,double,double,
                                   double,double);
                void dwrite_point(FILE *,double,double,char *);
                void dwrite_line(FILE *,double,double,double,double,char *);
20              void dwrite_circle(FILE *,double,double,double,char *);
                void dwrite_arc(FILE *,double,double,double,double,double,char *);
                void dwrite_solid(FILE *,double,double,double,double,
                                  double,double,double,double,char *);
                void dwrite_trace(FILE *,double,double,double,double,
25                                double,double,double,double,char *);
                void dwrite_poly(FILE *,double,double,double,double,double,char
                *,int,int,int);
                void trace_on(char *);
                void fix_char(FILE *,char *);
30              void fix_name(char *);
                void record_layer(char *);
                int sub_blockname(FILE *,char *);
                int init_lookup_table(FILE *);

35              /*---------------------------------------------------------------
                ---
                        main() - main parser
                ----------------------------------------------------------------
                -*/
40
                void main (argc, argv)

int     argc;
                char    *argv[];
45              {
                FILE    *bfptr;
                int     i,t;
                int     state=1;            /* starting state */
                tok_tab *temp;
50              int     quit=FALSE;
                int     etype=NOBLOCKDEF;   /* init to no defined blocks */
                block   *bptr;              /* block pointer */
                insert  *inptr;             /* insert pointer */
                block   bldat;              /* block structure */
55              insert  indat;              /* insert struct */
                int     nestinit=0;         /* starting recursive count */ printf ("\n");
                printf ("DXF2TPP Converter  Version %s%c  %s\n",version,os_type,vdate);
60              printf (" (c) Copyright 1993-95 General Electric Company\n\n");
```

HD-23,619

- 22 -

```
        strcpy(bstring,"\0");              /* init */
        strcpy(istring,"\0");              /* init */
 5      get_params(argc, argv);

clean_up(START);
        if (debug&64) { strcpy(stemp,"main()"); trace_on(stemp); }
        init_tok_table();
        if ((file_ptr_out=fopen(OUTFILE,"w"))==NULL) {
10        printf("error opening %s for output\n",OUTFILE);
          exit(2);
        }
        lookup_table_size=init_lookup_table(file_ptr_out);
        fprintf(file_ptr_out,"\n");
15      fprintf(file_ptr_out,"DXF2TPP Converter   Version %s%c
        %s\n",version,os_type,vdate);
        fprintf(file_ptr_out,"(c) Copyright 1993-95 General Electric Company\n\n");
        if ((file_ptr_in=fopen(dxffile,"r"))==NULL) {
          printf("error opening %s for input\n",dxffile);
20        fprintf(file_ptr_out,"error opening %s for input\n",dxffile);
          exit(2);
        }
        if (debug&1) {
          printf("Hash Table\n\n");
25        for (i=0;i<HASH_TAB_SIZE;i++) {
            temp=tok_hash[i];
            while (temp) {
              printf("%-10s\t",temp->tok_name);
              printf("%d\n",temp->tok_value);
30            temp=temp->next;
            }
          }
        }
        strcpy(stemp,"0\0");              /* default layer 0 */
35      strcpy(indat.bname,stemp);        /* initialize */
        strcpy(indat.layer,stemp);        /* initialize */
        indat.flags=0;
        indat.insx0=0.0;
        indat.insy0=0.0;
40      indat.xscale=1.0;
        indat.yscale=1.0;
        indat.rot=0.0;

fprintf(file_ptr_out,"DXF Filename:   %s\n",dxffile);
45      fprintf(file_ptr_out,"Scale Factor:   %1.3f\n",scale);
        fprintf(file_ptr_out,"X Offset:       %1.3f\n",xoffset);
        fprintf(file_ptr_out,"Y Offset:       %1.3f\n\n",yoffset);

while (!quit) {
50        t=get_tag_token(get_tag(file_ptr_in));
          switch(state) {
            case 1 : if (t==ZERO) state=3;
                     else state=2;
                     if (debug&4) printf("State(1): t=%d, state=%d\n",t, state);
55                   break;
            case 2 : state=1;
                     if (debug&4) printf("State(2): t=%d, state=%d\n",t, state);
                     break;
            case 3 : switch(t) {
60                     case SECTION : printf("SECTION\n");
```

HD-23,619

- 23 -

```
                                            fprintf(file_ptr_out,"SECTION\n");
                                            state=4;
                                            break;
                            case ENDSEC   : printf("ENDSEC\n");
 5                                          fprintf(file_ptr_out,"ENDSEC\n");
                                            state=4;
                                            break;
                            case EOFILE   : printf("EOF\n");
                                            fprintf(file_ptr_out,"EOF\n");
10                                          quit=TRUE;
                                            break;
                        }
                        if (debug&4) printf("State(3): t=%d, state=%d\n",t, state);
                        break;
15              case 4 : if (t==TWO) state=5;
                         else state=3;
                         if (debug&4) printf("State(4): t=%d, state=%d\n",t, state);
                         break;
                case 5 : state=1;       /* unlisted tag */
20                       switch(t) {
                            case HEADER   : printf("Found HEADER Section ...\n");
                                            fprintf(file_ptr_out,"Found HEADER Section
...\n");
                                            state=1;
25                                          break;
                            case TABLES   : printf("Found TABLES Section ...\n");
                                            fprintf(file_ptr_out,"Found TABLES Section
...\n");
                                            state=1;
30                                          break;
                            case BLOCKS   : printf("Found BLOCKS Section ...\n");
                                            fprintf(file_ptr_out,"Found BLOCKS Section
...\n");
                                            state=6; /* state=1 for no block proc */
35                                          break;
                            case ENTITIES : printf("Found ENTITIES Section ...\n");
                                            fprintf(file_ptr_out,"Found ENTITIES Section
...\n");
                                            state=6;
40                                          break;
                         }
                         if (debug&4) printf("State(5): t=%d, state=%d\n",t, state);
                         break;
                case 6 : if (t==ZERO) state=7;
45                       else state=1;
                         if (debug&4) printf("State(6): t=%d, state=%d\n",t, state);
                         break;
                case 7 : switch(t) {     /* supported entities */
                            case BLOCK    :
50       bldat=process_block(file_ptr_in,file_ptr_out,MAIN);
                                            /* strcpy(bldat.bname,bptr->bname);
                                            strcpy(bldat.layer,bptr->layer);
                                            bldat.flags=bptr->flags;
                                            bldat.basex0=bptr->basex0;
55                                          bldat.basey0=bptr->basey0; */
                                            etype=BLOCKDEF; /* flag for block process */
                                            block_count++;
                                            break;
                            case INSERT   :
60       indat=process_insert(file_ptr_in,file_ptr_out,etype,bldat,indat,MAIN);
```

RD-23,619

- 24 -

```
                                /*strcpy(indat.bname,inptr->bname);
                                strcpy(indat.layer,inptr->layer);
                                indat.flags=inptr->flags;
                                indat.insx0=inptr->insx0;
 5                              indat.insy0=inptr->insy0;
                                indat.xscale=inptr->xscale;
                                indat.yscale=inptr->yscale;
                                indat.rot=inptr->rot; */

10              write_insert(indat,file_ptr_out,etype,bldat,MAIN,nestinit);
                                if (etype==NOBLOCKDEF) insert_count++;
                                break;
                    case TRACE    :
                process_trace(file_ptr_in,file_ptr_out,etype,bldat,MAIN);
15                              if (etype==NOBLOCKDEF) trace_count++;
                                break;
                    case POLYLINE :
                process_polyline(file_ptr_in,file_ptr_out,INIT,etype,bldat,MAIN);
                                if (etype==NOBLOCKDEF) polyline_count++;
20                              break;
                    case VERTEX   :
                process_polyline(file_ptr_in,file_ptr_out,OPEN,etype,bldat,MAIN);
                                if (etype==NOBLOCKDEF) vertex_count++;
                                break;
25                  case SEQEND   :
                process_polyline(file_ptr_in,file_ptr_out,CLOSE,etype,bldat,MAIN);
                                if (etype==NOBLOCKDEF) seqend_count++;
                                pline_start=0.0;
                                pline_end=0.0;
30                              segment_next=0;
                                bulge_next=0;
                                break;
                    case POINT    :
                process_point(file_ptr_in,file_ptr_out,etype,bldat,MAIN);
35                              if (etype==NOBLOCKDEF) point_count++;
                                break;
                    case LINE     :
                process_line(file_ptr_in,file_ptr_out,etype,bldat,MAIN);
                                if (etype==NOBLOCKDEF) line_count++;
40                              break;
                    case CIRCLE   :
                process_circle(file_ptr_in,file_ptr_out,etype,bldat,MAIN);
                                if (etype==NOBLOCKDEF) circle_count++;
                                break;
45                              /* non-supported entities */
                    case ARC      :
                process_arc(file_ptr_in,file_ptr_out,etype,bldat,MAIN);
                                if (etype==NOBLOCKDEF) arc_count++;
                                break;
50                  case SOLID    :
                process_solid(file_ptr_in,file_ptr_out,etype,bldat,MAIN);
                                if (etype==NOBLOCKDEF) solid_count++;
                                break;
                                /* end non-supported entities */
55                  case ENDBLK   : sprintf(stemp,"%s.blk",bldat.bname);
                                if ((bfptr=fopen(stemp,"a"))==NULL) {
                                 if ((bfptr=fopen(stemp,"w"))==NULL) {
                                   printf("error opening %s for
output\n",stemp);
```

RD-23,619

- 25 -

```
                                          fprintf(file_ptr_out,"error opening %s for
                  output\n",stemp);                    exit(2);
                                                }
 5                                          }
                                          write_dxf(bfptr,0,"ENDBLK");
                                          fclose(bfptr);
                                          etype=NOBLOCKDEF;  /* flag for block process */
                                          break;
10                      case ENDSEC  : printf("ENDSEC\n");
                                          state=4;
                                          break;
                     }
                     if (debug&4) printf("State(7): t=%d, state=%d\n",t, state);
15                   break;
               default: break;
            }
         }
         printf("\nBlock Count    = %ld\n",block_count);
20       printf("Insert Count   = %ld\n",insert_count);
         printf("Polyline Count = %ld*\n",polyline_count);
         printf("Vertex Count   = %ld\n",vertex_count);
         printf("Seqend Count   = %ld\n",seqend_count);
         printf("Trace Count    = %ld*\n",trace_count);
25       printf("Point Count    = %ld*\n",point_count);
         if (import_line)
            printf("Line Count   = %ld*\n",line_count);
         else
            printf("Line Count   = %ld\n",line_count);
30       printf("Circle Count   = %ld*\n",circle_count);
         printf("Arc Count      = %ld\n",arc_count);
         printf("Solid Count    = %ld\n\n",solid_count);

if (import_line) {
35         printf("Total Supported Entities     = %ld*\n",
               (trace_count+point_count+polyline_count+line_count+circle_count));
           printf("Total Non-Supported Entities = %ld\n",
               (arc_count+solid_count));
           if (error_count) printf("Conversion Errors = %ld\n",error_count);
40       }
         else {
           printf("Total Supported Entities     = %ld*\n",
               (trace_count+point_count+polyline_count+circle_count));
           printf("Total Non-Supported Entities = %ld\n",
45             (arc_count+solid_count+line_count));
           if (error_count) printf("Conversion Errors = %ld\n",error_count);
         } fprintf(file_ptr_out,"Block Count    = %ld\n",block_count);
50       fprintf(file_ptr_out,"Insert Count   = %ld\n",insert_count);
         fprintf(file_ptr_out,"Polyline Count = %ld*\n",polyline_count);
         fprintf(file_ptr_out,"Vertex Count   = %ld\n",vertex_count);
         fprintf(file_ptr_out,"Seqend Count   = %ld\n",seqend_count);
         fprintf(file_ptr_out,"Trace Count    = %ld*\n",trace_count);
55       fprintf(file_ptr_out,"Point Count    = %ld*\n",point_count);
         if (import_line)
            fprintf(file_ptr_out,"Line Count   = %ld*\n",line_count);
         else
            fprintf(file_ptr_out,"Line Count   = %ld\n",line_count);
60       fprintf(file_ptr_out,"Circle Count   = %ld*\n",circle_count);
```

HD-23,619

- 26 -

```
                fprintf(file_ptr_out,"Arc Count      = %ld\n",arc_count);
                fprintf(file_ptr_out,"Solid Count    = %ld\n\n",solid_count);

if (import_line) {
5                 fprintf(file_ptr_out,"Total Supported Entities    = %ld*\n",
                        (trace_count+point_count+polyline_count+line_count+circle_count));
                  fprintf(file_ptr_out,"Total Non-Supported Entities = %ld\n",
                        (arc_count+solid_count));
                  if (error_count) fprintf(file_ptr_out,"Conversion Errors =
10              %ld\n",error_count);
                }
                else {
                  fprintf(file_ptr_out,"Total Supported Entities    = %ld*\n",
                        (trace_count+point_count+polyline_count+circle_count));
15                fprintf(file_ptr_out,"Total Non-Supported Entities = %ld\n",
                        (arc_count+solid_count+line_count));
                  if (error_count) fprintf(file_ptr_out,"Conversion Errors =
                %ld\n",error_count);
                }
20              fprintf(file_ptr_out,"\nEntity Counts Per Standard HDI Layer:\n\n");
                fprintf(file_ptr_out,"mt0 = %ld\n",mt0);
                fprintf(file_ptr_out,"mt1 = %ld\n",mt1);
                fprintf(file_ptr_out,"mt2 = %ld\n",mt2);
                fprintf(file_ptr_out,"mt3 = %ld\n",mt3);
25              fprintf(file_ptr_out,"mt4 = %ld\n",mt4);
                fprintf(file_ptr_out,"mt5 = %ld\n",mt5);
                fprintf(file_ptr_out,"mt6 = %ld\n",mt6);
                fprintf(file_ptr_out,"mt7 = %ld\n",mt7);
                fprintf(file_ptr_out,"mt8 = %ld\n",mt8);
30              fprintf(file_ptr_out,"mt9 = %ld\n",mt9);
                fprintf(file_ptr_out,"dr1 = %ld\n",dr1);
                fprintf(file_ptr_out,"dr2 = %ld\n",dr2);
                fprintf(file_ptr_out,"dr3 = %ld\n",dr3);
                fprintf(file_ptr_out,"dr4 = %ld\n",dr4);
35              fprintf(file_ptr_out,"dr5 = %ld\n",dr5);
                fprintf(file_ptr_out,"dr6 = %ld\n",dr6);
                fprintf(file_ptr_out,"dr7 = %ld\n",dr7);
                fprintf(file_ptr_out,"dr8 = %ld\n",dr8);
                fprintf(file_ptr_out,"dr9 = %ld\n",dr9);
40              fprintf(file_ptr_out,"leg = %ld\n",leg);
                fprintf(file_ptr_out,"alm = %ld\n\n",alm);

if (purge_blk) clean_up(FINISH);
                fclose(file_ptr_in);
45              fclose(file_ptr_out);
                }

/*-----------------------------------------------------------------------
                ---
50                      get_tag() - DXF line parser
                -------------------------------------------------------------------------
                -*/
                char *get_tag(dxf)
                FILE    *dxf;
55              {
                int     i;

if (debug&64) { strcpy(stemp,"get_tag()"); trace_on(stemp); }
                fgets(tag_str,80,dxf);
60              if (feof(dxf)) {
```

HD-23,619

- 27 -

```
              printf("get_tag() eof -- ");
              strcpy(tag_str,"EOF\0");
              return &tag_str[0];
              exit(3);
 5            }
         if (tag_str[strlen(tag_str)-1]=='\n')          /* remove new line char */
              tag_str[strlen(tag_str)-1]='\0';
         i=strspn(tag_str," \t");         /* finds 1st char following spaces or tabs
         */
10       return &tag_str[i];     /* return pointer to string */
         }

/*-----------------------------------------------------------------------
         ---
15            get_tag_token() - lookup and return token
         ------------------------------------------------------------------------
         -*/ int get_tag_token(s)
20       char    *s;
         {
         tok_tab *t;

if (debug&64) { strcpy(stemp,"get_tag_token()"); trace_on(stemp); }
25       if (debug&8) printf("DXF String = %s\n",s);
         t=tok_hash[hash(s)];    /* hash s to get class of word */
         while (t) {             /* get anchor t to linked list of words */
            if (!strcmp(t->tok_name,s)) return t->tok_value;       /* return int value
         */
30         t=t->next;           /* next link */
            }
         return(0);              /* not found */
         }

35       /*-----------------------------------------------------------------------
         ---
              init_tok_table() - init token table linked list
         ------------------------------------------------------------------------
         -*/
40
         init_tok_table()
         {
         tok_tab *t;
         int     j;
45
         if (debug&64) { strcpy(stemp,"init_tok_table()"); trace_on(stemp); }
         t=tok_table;            /* set to beginning of tok_table */
         while (t->tok_name) {   /* not NULL in "string" field */
            j=hash(t->tok_name);          /* hash to get class, return index */
50         t->next=tok_hash[j];          /* set link, hash table entry for class */
            tok_hash[j]=t;                /* copy struct to j index location */
            t++;                          /* next struct */
            }
         }
55
         /*-----------------------------------------------------------------------
         ---
              hash() - hash function
         ------------------------------------------------------------------------
60       -*/
```

HD-23,619

- 28 -

```
        int hash(s)
        char    *s;
        {
5       int     i=0;

if (debug&64) { strcpy(stemp,"hash()"); trace_on(stemp); }
        while (*s) i=(i+(*s++))&(HASH_TAB_SIZE-1);
        /* while !null increment pointer AND result */
10      if (debug&2) printf("Hash() Index = %d\n",i);
        return i;
        }

/*-------------------------------------------------------------
15      ---
                process_block() - parse block definition
        ------------------------------------------------------------
        -*/

20      block process_block(dxf,fout,proc)
        FILE    *dxf;
        FILE    *fout;
        int     proc;
        {
25      int     quit=FALSE;
        int     t;
        block   *block_ptr;
        static  block   block_dat;

30      if (debug&64) { strcpy(stemp,"process_block()"); trace_on(stemp); }
        strcpy(stemp,"0\0");                    /* default layer 0 */
        block_ptr=&block_dat;                   /* allocate memory */
        strcpy(block_ptr->bname,stemp);         /* initialize */
        strcpy(block_ptr->layer,stemp);         /* initialize */
35      block_ptr->flags=0;
        block_ptr->basex0=0.0;
        block_ptr->basey0=0.0;

if (debug&16) fprintf(fout,"BLOCK\n");
40      while (!quit) {
          t=get_tag_token(get_tag(dxf));
          switch(t) {
            case EOFILE    : quit=TRUE;
                             printf("process_block() eof\n");
45                           break;
            case ZERO      : quit=TRUE;
                             break;
            case TWO       : strcpy(block_ptr->bname,get_string(dxf));
                             fix_char(fout,block_ptr->bname);
50                           fix_name(block_ptr->bname);
                             break;
            case EIGHT     : strcpy(block_ptr->layer,get_string(dxf));
                             break;
            case SEVENTY   : block_ptr->flags=get_int(dxf);
55                           break;
            case TEN       : block_ptr->basex0=get_double(dxf);
                             break;
            case TWENTY    : block_ptr->basey0=get_double(dxf);
                             break;
60          default        : strcpy(stemp,get_string(dxf));
```

HD-23,619

- 29 -

```
                    if (debug&128) fprintf(fout,"default: %s\n",stemp);
                    break;
         }
       }
 5     if (proc==MAIN) write_block(block_dat,fout);
       return(block_dat);
     }

/*---------------------------------------------------------------------
10   ---
          process_insert() - parse insert definition
     ----------------------------------------------------------------------
     -*/

15   insert process_insert(dxf,fout,etype,bldat,indat,proc)
     FILE    *dxf;
     FILE    *fout;
     int     etype;
     block   bldat;
20   insert  indat;
     int     proc;
     {
     int     quit=FALSE;
     int     t;
25   insert  *insert_ptr;
     static  insert  insert_dat;
     double  sinr=0.0;
     double  cosr=1.0;
     double  tx0,ty0;
30   double  rx0,ry0;

if (debug&64) { strcpy(stemp,"process_insert()"); trace_on(stemp); }
     strcpy(stemp,"0\0");                 /* default layer 0 */
     insert_ptr=&insert_dat;              /* allocate memory */
35   strcpy(insert_ptr->bname,stemp);     /* initialize */
     strcpy(insert_ptr->layer,stemp);     /* initialize */
     insert_ptr->flags=0;
     insert_ptr->insx0=0.0;
     insert_ptr->insy0=0.0;
40   insert_ptr->xscale=1.0;
     insert_ptr->yscale=1.0;
     insert_ptr->rot=0.0;

if (debug&16) fprintf(fout,"INSERT\n");
45   while (!quit) {
       t=get_tag_token(get_tag(dxf));
       switch(t) {
         case EOFILE   : quit=TRUE;
                         printf("process_insert() eof (block:%s)\n",insert_ptr-
50   >bname);
                         break;
         case ZERO     : quit=TRUE;
                         break;
         case TWO      : strcpy(insert_ptr->bname,get_string(dxf));
55                       fix_char(fout,insert_ptr->bname);
                         fix_name(insert_ptr->bname);
                         break;
         case EIGHT    : strcpy(insert_ptr->layer,get_string(dxf));
                         break;
60       case SIXTY6   : insert_ptr->flags=get_int(dxf);
```

HD-23,619

- 30 -

```
                              break;
               case TEN       : insert_ptr->insx0=get_double(dxf);
                              break;
               case TWENTY    : insert_ptr->insy0=get_double(dxf);
                              break;
               case FORTY1    : insert_ptr->xscale=get_double(dxf);
                                if (insert_ptr->xscale==0.0) {
                                  insert_ptr->xscale=1.0;
                                  if (debug&256) printf("WARNING: Insert Scale Factor Of
    0.0, Changed To 1.0\n");
                                  fprintf(fout,"WARNING: Insert Scale Factor Of 0.0,
    Changed To 1.0\n");
                                }
                              break;
               case FORTY2    : insert_ptr->yscale=get_double(dxf);
                                if (insert_ptr->yscale==0.0) {
                                  insert_ptr->yscale=1.0;
                                  if (debug&256) printf("WARNING: Insert Scale Factor Of
    0.0, Changed To 1.0\n");
                                  fprintf(fout,"WARNING: Insert Scale Factor Of 0.0,
    Changed To 1.0\n");
                                }
                              break;
               case FIFTY     : insert_ptr->rot=get_double(dxf);
                              break;
               default        : strcpy(stemp,get_string(dxf));
                                if (debug&128) fprintf(fout,"default: %s\n",stemp);
                              break;
             }
           }

/* nested insert, apply offsets */
           if (proc==SUB) {
             while (indat.rot>=360.0) indat.rot-=360.0;
             while (indat.rot<   0.0) indat.rot+=360.0;
             /*
             if      (indat.rot==  0.0) {sinr= 0.0; cosr= 1.0;}
             else if (indat.rot== 90.0) {sinr= 1.0; cosr= 0.0;}
             else if (indat.rot==180.0) {sinr= 0.0; cosr=-1.0;}
             else if (indat.rot==270.0) {sinr=-1.0; cosr= 0.0;}
             */
             sinr=sin(indat.rot*M_PI/180);
             cosr=cos(indat.rot*M_PI/180);

while (insert_ptr->rot>=360.0) insert_ptr->rot-=360.0;
             while (insert_ptr->rot<   0.0) insert_ptr->rot+=360.0;

/* mirrored negative scaled insert of rotated insert */
             if (indat.xscale<0.0) {
               insert_ptr->rot+=(360-(insert_ptr->rot*2.0));
             }
             if (indat.yscale<0.0) {
               insert_ptr->rot+=(360-(insert_ptr->rot*2.0));
             } tx0=indat.insx0-bldat.basex0;
             ty0=indat.insy0-bldat.basey0;
             rx0=indat.xscale*(insert_ptr->insx0-bldat.basex0);
             ry0=indat.yscale*(insert_ptr->insy0-bldat.basey0);
             insert_ptr->insx0=(rx0*cosr-ry0*sinr+bldat.basex0+tx0);
```

- 31 -

```
            insert_ptr->insy0=(rx0*sinr+ry0*cosr+bldat.basey0+ty0);
            insert_ptr->rot+=indat.rot;
            insert_ptr->xscale*=indat.xscale;
            insert_ptr->yscale*=indat.yscale;
            }
      return(insert_dat);
      }

/*---------------------------------------------------------------------
      ---
            process_trace() - parse trace definition
      ---------------------------------------------------------------------
      -*/ trace process_trace(dxf,fout,etype,bldat,proc)
      FILE    *dxf;
      FILE    *fout;
      int     etype;
      block   bldat;
      int     proc;
      {
      int     quit=FALSE;
      int     t;
      trace   *trace_ptr;
      static  trace   trace_dat;

if (debug&64) { strcpy(stemp,"process_trace()"); trace_on(stemp); }
      strcpy(stemp,"0\0");                    /* default layer 0 */
      trace_ptr=&trace_dat;                   /* allocate memory */
      strcpy(trace_ptr->layer,stemp);         /* initialize */
      trace_ptr->x0=0.0;
      trace_ptr->y0=0.0;
      trace_ptr->x1=0.0;
      trace_ptr->y1=0.0;
      trace_ptr->x2=0.0;
      trace_ptr->y2=0.0;
      trace_ptr->x3=0.0;
      trace_ptr->y3=0.0;

if (debug&16) fprintf(fout,"TRACE\n");
      while (!quit) {
        t=get_tag_token(get_tag(dxf));
        switch(t) {
          case EOFILE  : quit=TRUE;
                         printf("process_trace() eof\n");
                         break;
          case ZERO    : quit=TRUE;
                         break;
          case EIGHT   : strcpy(trace_ptr->layer,get_string(dxf));
                         break;
          case TEN     : trace_ptr->x0=get_double(dxf);
                         break;
          case TWENTY  : trace_ptr->y0=get_double(dxf);
                         break;
          case ELEVEN  : trace_ptr->x1=get_double(dxf);
                         break;
          case TWENTY1 : trace_ptr->y1=get_double(dxf);
                         break;
          case TWELVE  : trace_ptr->x2=get_double(dxf);
                         break;
```

HD-23,619

- 32 -

```
              case TWENTY2   : trace_ptr->y2=get_double(dxf);
                              break;
              case THIRTEEN  : trace_ptr->x3=get_double(dxf);
                              break;
              case TWENTY3   : trace_ptr->y3=get_double(dxf);
                              break;
              default        : strcpy(stemp,get_string(dxf));
                               if (debug&128) fprintf(fout,"default: %s\n",stemp);
                               break;
          }
      }
      if (proc==MAIN) write_trace(trace_dat,fout,etype,bldat);
      return(trace_dat);
  }

/*--------------------------------------------------------------------
  ---
         process_polyline() - parse polyline definition
  --------------------------------------------------------------------
  -*/ poly process_polyline(dxf,fout,tp,etype,bldat,proc)
  FILE    *dxf;
  FILE    *fout;
  int     tp;
  int     etype;
  block   bldat;
  int     proc;
  {
  int     quit=FALSE;
  int     t;
  poly    *poly_ptr;
  static poly    poly_dat;

parsed_40=0;              /* initialize */
      parsed_41=0;

if (debug&64) { strcpy(stemp,"process_polyline()"); trace_on(stemp); }
      strcpy(stemp,"0\0");                   /* default layer 0 */
      poly_ptr=&poly_dat;                    /* allocate memory */
      strcpy(poly_ptr->layer,stemp);         /* initialize */
      poly_ptr->vflag=0;
      poly_ptr->flags=0;
      poly_ptr->x0=0.0;
      poly_ptr->y0=0.0;
      poly_ptr->start=pline_start;           /* update pline w/ global original
  */
      poly_ptr->end=pline_end;
      poly_ptr->bulge=0.0;

if (debug&16) fprintf(fout,"POLYLINE\n");
      while (!quit) {
        t=get_tag_token(get_tag(dxf));
        switch(t) {
          case EOFILE    : quit=TRUE;
                           printf("process_polyline() eof\n");
                           break;
          case ZERO      : quit=TRUE;
                           if (debug&32) printf("case 0\n");
                           break;
```

RD-23,619

- 33 -

```
              case EIGHT   : strcpy(poly_ptr->layer,get_string(dxf));
                             if (debug&32) printf("case 8 %s\n",poly_ptr->layer);
                             switch (tp) {
                                case INIT : strcpy(last_layer,poly_ptr->layer);
                                            break;
                                case OPEN : if (strcmp(last_layer,poly_ptr->layer)) {
                                               if ((valid_layer(poly_ptr-
>layer))||(valid_layer(last_layer))) {
                                                   printf("WARNING: Change In Polyline
Layer (VERTEX:%s,%s@(%ld,%ld))\n",
                                                          last_layer,poly_ptr-
>layer,(long)poly_ptr->x0,(long)poly_ptr->y0);
                                                   fprintf(fout,"WARNING: Change In
Polyline Layer (VERTEX:%s,%s@(%ld,%ld))\n",
                                                          last_layer,poly_ptr-
>layer,(long)poly_ptr->x0,(long)poly_ptr->y0);
                                                   }
                                               strcpy(poly_ptr->layer,last_layer);
                                               }
                                            break;
                                case CLOSE: if (strcmp(last_layer,poly_ptr->layer)) {
                                               if ((valid_layer(poly_ptr-
>layer))||(valid_layer(last_layer))) {
                                                   printf("WARNING: Change In Polyline
Layer (SEQEND:%s,%s@(%ld,%ld))\n",
                                                          last_layer,poly_ptr-
>layer,(long)poly_ptr->x0,(long)poly_ptr->y0);
                                                   fprintf(fout,"WARNING: Change In
Polyline Layer (SEQEND:%s,%s@(%ld,%ld))\n",
                                                          last_layer,poly_ptr-
>layer,(long)poly_ptr->x0,(long)poly_ptr->y0);
                                                   }
                                               strcpy(poly_ptr->layer,last_layer);
                                               }
                                            break;
                                }
                             break;
              case SIXTY6  : poly_ptr->vflag=get_int(dxf);
                             if (debug&32) printf("case 66 %d\n",poly_ptr->vflag);
                             break;
              case SEVENTY : poly_ptr->flags=get_int(dxf);
                             if (debug&32) printf("case 70 %d\n",poly_ptr->flags);
                             break;
              case TEN     : poly_ptr->x0=get_double(dxf);
                             if (debug&32) printf("case 10 %f\n",poly_ptr->x0);
                             break;
              case TWENTY  : poly_ptr->y0=get_double(dxf);
                             if (debug&32) printf("case 20 %f\n",poly_ptr->y0);
                             break;
              case FORTY   : poly_ptr->start=get_double(dxf);
                             if (debug&32) printf("case 40 %f\n",poly_ptr->start);
                             if (tp==INIT) pline_start=poly_ptr->start;
                             parsed_40=1;
                             break;
              case FORTY1  : poly_ptr->end=get_double(dxf);
                             if (debug&32) printf("case 41 %f\n",poly_ptr->end);
                             if (tp==INIT) pline_end=poly_ptr->end;
                             parsed_41=1;
                             break;
              case FORTY2  : poly_ptr->bulge=get_double(dxf);
```

HD-23,619

- 34 -

```
                        if (debug&32) printf("case 42 %f\n",poly_ptr->bulge);
                        break;
            default     : strcpy(stemp,get_string(dxf));
                        if (debug&128) fprintf(fout,"default: %s\n",stemp);
                        break;
        }
    }
    if (proc==MAIN) write_poly(poly_dat,fout,tp,etype,bldat);
    return(poly_dat);
}

/*---------------------------------------------------------------------------
---
        process_point() - parse point definition
---------------------------------------------------------------------------
-*/ point process_point(dxf,fout,etype,bldat,proc)
FILE    *dxf;
FILE    *fout;
int     etype;
block   bldat;
int     proc;
{
    int     quit=FALSE;
    int     t;
    point   *point_ptr;
    static  point   point_dat;

if (debug&64) { strcpy(stemp,"process_point()"); trace_on(stemp); }
    strcpy(stemp,"0\0");                    /* default layer 0 */
    point_ptr=&point_dat;                   /* allocate memory */
    strcpy(point_ptr->layer,stemp);         /* initialize */
    point_ptr->x0=0.0;
    point_ptr->y0=0.0;

if (debug&16) fprintf(fout,"POINT\n");
    while (!quit) {
      t=get_tag_token(get_tag(dxf));
      switch(t) {
        case EOFILE     : quit=TRUE;
                        printf("process_point() eof\n");
                        break;
        case ZERO       : quit=TRUE;
                        break;
        case EIGHT      : strcpy(point_ptr->layer,get_string(dxf));
                        break;
        case TEN        : point_ptr->x0=get_double(dxf);
                        break;
        case TWENTY     : point_ptr->y0=get_double(dxf);
                        break;
        default         : strcpy(stemp,get_string(dxf));
                        if (debug&128) fprintf(fout,"default: %s\n",stemp);
                        break;
      }
    }
    if (proc==MAIN) write_point(point_dat,fout,etype,bldat);
    return(point_dat);
}
```

HD-23,619

- 35 -

```
/*---------------------------------------------------------------
---
        process_line() - parse line definition
---------------------------------------------------------------
-*/ line process_line(dxf,fout,etype,bldat,proc)
FILE    *dxf;
FILE    *fout;
int     etype;
block   bldat;
int     proc;
{
int     quit=FALSE;
int     t;
line    *line_ptr;
static line     line_dat;

if (debug&64) { strcpy(stemp,"process_line()"); trace_on(stemp); }
strcpy(stemp,"0\0");                    /* default layer 0 */
line_ptr=&line_dat;                     /* allocate memory */
strcpy(line_ptr->layer,stemp);          /* initialize */
line_ptr->x0=0.0;
line_ptr->y0=0.0;
line_ptr->x1=0.0;
line_ptr->y1=0.0;

if (debug&16) fprintf(fout,"POINT\n");
while (!quit) {
  t=get_tag_token(get_tag(dxf));
   switch(t) {
     case EOFILE  : quit=TRUE;
                    printf("process_line() eof\n");
                    break;
     case ZERO    : quit=TRUE;
                    break;
     case EIGHT   : strcpy(line_ptr->layer,get_string(dxf));
                    break;
     case TEN     : line_ptr->x0=get_double(dxf);
                    break;
     case TWENTY  : line_ptr->y0=get_double(dxf);
                    break;
     case ELEVEN  : line_ptr->x1=get_double(dxf);
                    break;
     case TWENTY1 : line_ptr->y1=get_double(dxf);
                    break;
     default      : strcpy(stemp,get_string(dxf));
                    if (debug&128) fprintf(fout,"default: %s\n",stemp);
                    break;
    }
  }
if (proc==MAIN) write_line(line_dat,fout,etype,bldat);
return(line_dat);
}

/*---------------------------------------------------------------
---
        get_double() - cast and return double
---------------------------------------------------------------
-*/
```

HD-23,619

- 36 -

```c
        double get_double(f)
        FILE    *f;
        {
        return (atof(get_tag(f)));
        }

/*-------------------------------------------------------------------
        ---
              get_string() - parse and return string
        -------------------------------------------------------------------
        -*/ char *get_string(f)
        FILE    *f;
        {
        char s[80];
        int     i;

if (debug&64) { strcpy(stemp,"get_string()"); trace_on(stemp); }
        fgets(s,80,f);
        for (i=0;i<80;i++) if (isupper(s[i])) s[i]=tolower(s[i]);
        if (s[strlen(s)-1]=='\n') s[strlen(s)-1]='\0';   /* remove new line char */
        i=strspn(s," \t");        /* finds 1st char following spaces or tabs */
        return &s[i];    /* return pointer to string */
        }

/*-------------------------------------------------------------------
        ---
              get_int() - cast and return int
        -------------------------------------------------------------------
        -*/ int get_int(f)
        FILE    *f;
        {
        if (debug&64) { strcpy(stemp,"get_int()"); trace_on(stemp); }
        return atoi(get_tag(f));
        }

/*-------------------------------------------------------------------
        ---
              write_block() - output dxf block definition
        -------------------------------------------------------------------
        -*/ int write_block(bl,fout)
        block   bl;
        FILE    *fout;
        {
        char    bfile[80];
        FILE    *bout;

if (debug&64) { strcpy(stemp,"write_block()"); trace_on(stemp); }
        sprintf(bfile,"%s.blk",bl.bname);
        sprintf(stemp,"echo block written > block.tmp");
        system(stemp);
        if ((bout=fopen(bfile,"w"))==NULL) {
          printf("error opening %s for output\n",bfile);
          fprintf(fout,"error opening %s for output\n",bfile);
```

RD-23,619

- 37 -

```
         exit(2);
         }
      if ((debug&16)||(!strcmp(bl.bname,bstring))) {
         fprintf(fout,"block name %s\n",bl.bname);
5        fprintf(fout,"block layer %s\n",bl.layer);
         fprintf(fout,"flags %d\n",bl.flags);
         fprintf(fout,"%f\n",bl.basex0);
         fprintf(fout,"%f\n",bl.basey0);
         }
10    dwrite_block(bout,bl.bname,bl.layer,bl.flags,bl.basex0,bl.basey0);
      fclose(bout);
      return(0);
      }

15    /*---------------------------------------------------------------
      ---
            write_insert() - sub parser, direct entity processing
      -----------------------------------------------------------------
20    -*/ int write_insert(indat,fout,etype,bldat,proc,count)
      insert   indat;
      FILE     *fout;
      int      etype;
25    block    bldat;
      int      proc;
      int      count;   /* recursive call counter */
      {
      char     infile[80];
30    char     otfile[80];
      int      t;
      FILE     *iin;              /* ptr to input block file */
      FILE     *iout;             /* ptr to output block file */

35    block    *fbptr;            /* .blk file block def */
      insert   *inptr;            /* local entity definitions */
      trace    *trptr;
      poly     *plptr;
      point    *ptptr;
40    line     *lnptr;
      circle   *crptr;
      arc      *arptr;
      solid    *slptr;
      block    fbldat;
45    insert   lindat;            /* local insert structure */
      trace    ltrdat;
      poly     lpldat;
      point    lptdat;
      line     llndat;
50    circle   lcrdat;
      arc      lardat;
      solid    lsldat;
      double   sinr=0.0;
      double   cosr=1.0;
55    int      quit=FALSE;

if (debug&64) { strcpy(stemp,"write_insert()"); trace_on(stemp); } if (count>=MAXNEST) {
60      printf("ERROR: Maximum Block Insert Nest Level Exceeded (10)\n");
```

RD-23,619

- 38 -

```
                                fprintf(fout,"ERROR: Maximum Block Insert Nest Level Exceeded (10)\n");
                                error_count++;
                                exit(2);
                                }
 5                         if (proc==MAIN) init_gindat();
                           /* save insert values */
                           gindat[count]=indat;

if (etype==BLOCKDEF) {    /* will append to existing files */
10                            sprintf(otfile,"%s.blk",bldat.bname);
                              if ((iout=fopen(otfile,"a"))==NULL) {
                                if ((iout=fopen(otfile,"w"))==NULL) {
                                   printf("error opening %s for output\n",otfile);
                                   fprintf(fout,"error opening %s for output\n",otfile);
15                                 exit(2);
                                 }
                               }
                            }
                           if (etype==NOBLOCKDEF) {
20                            sprintf(infile,"%s.blk",indat.bname);
                              if ((iin=fopen(infile,"r"))==NULL) {
                                 printf("error opening %s for input\n",infile);
                                 fprintf(fout,"error opening %s for input\n",infile);
                                 return(1);
25                            }
                           }
                           if ((debug&16)||(!strcmp(indat.bname,istring))) {
                              fprintf(fout,"block name %s\n",indat.bname);
                              fprintf(fout,"insert layer %s\n",indat.layer);
30                            fprintf(fout,"flags %d\n",indat.flags);
                              fprintf(fout,"%f\n",indat.insx0);
                              fprintf(fout,"%f\n",indat.insy0);
                              fprintf(fout,"%f\n",indat.xscale);
                              fprintf(fout,"%f\n",indat.yscale);
35                            fprintf(fout,"%f\n",indat.rot);
                              fprintf(fout,"nest level: %d\n",count);
                            }
                           while (indat.rot>=360.0) indat.rot-=360.0;
                           while (indat.rot<   0.0) indat.rot+=360.0;
40                         /*
                           if      (indat.rot==  0.0) {sinr= 0.0; cosr= 1.0;}
                           else if (indat.rot==  90.0) {sinr= 1.0; cosr= 0.0;}
                           else if (indat.rot==180.0) {sinr= 0.0; cosr=-1.0;}
                           else if (indat.rot==270.0) {sinr=-1.0; cosr= 0.0;}
45                         */
                           sinr=sin(indat.rot*M_PI/180);
                           cosr=cos(indat.rot*M_PI/180);

if (etype==BLOCKDEF) {
50
                             dwrite_insert(iout,indat.bname,indat.layer,indat.flags,indat.insx0,indat.in
                           sy0,
                                                              indat.xscale,indat.yscale,indat.rot);
                            }
55                         if (etype==NOBLOCKDEF) {
                             fbldat=process_block(iin,fout,SUB);   /* extract inserted block
                           information */
                             /*strcpy(fbldat.bname,fbptr->bname);
                             strcpy(fbldat.layer,fbptr->layer);
60                           fbldat.flags=fbptr->flags;
```

HD-23,619

- 39 -

```
                fbldat.basex0=fbptr->basex0;
                fbldat.basey0=fbptr->basey0;   */
                fbptr=&fbldat;                        /* transfer ptr to this function */
                while (!quit) {
 5                t=get_tag_token(get_tag(iin));
                  switch(t) {
                    case EOFILE  : quit=TRUE;
                                   printf("write_insert() eof (block:%s)\n",indat.bname);
                                   break;
10                  case ENDBLK  : quit=TRUE;
                                   break;
                    case INSERT  : if (debug&16) fprintf(fout,"inserting insert
             (%s)\n",indat.bname);
                                   insert_count++;
15                                 if ((count+1)>max_recur_count) {
                                     max_recur_count=count+1;
                                     printf("block insert nest level:
             %d\n",max_recur_count);
                                   }
20                                 lindat=process_insert(iin,fout,etype,bldat,indat,SUB);
                                                   /* recursive call */
                                   /*strcpy(lindat.bname,inptr->bname);
                                   strcpy(lindat.layer,inptr->layer);
                                   lindat.flags=inptr->flags;
25                                 lindat.insx0=inptr->insx0;
                                   lindat.insy0=inptr->insy0;
                                   lindat.xscale=inptr->xscale;
                                   lindat.yscale=inptr->yscale;
                                   lindat.rot=inptr->rot;    */
30                                 write_insert(lindat,fout,etype,fbldat,SUB,count+1);
                                   /* restore previous insert values */
                                   indat=gindat[count];
                                   /* return from recursive call */
                                   break;
35                  case TRACE   : if (debug&16) fprintf(fout,"inserting trace
             (%s)\n",indat.bname);
                                   ltrdat=process_trace(iin,fout,etype,bldat,SUB);
                                   insert_trace(fout,ltrdat,fbldat,indat,sinr,cosr,etype);
                                   trace_count++;
40                                 break;
                    case POLYLINE: if (debug&16) fprintf(fout,"inserting polyline
             (%s)\n",indat.bname);
                                   lpldat=process_polyline(iin,fout,INIT,etype,bldat,SUB);

45           insert_poly(fout,lpldat,fbldat,indat,sinr,cosr,INIT,etype);
                                   polyline_count++;
                                   break;
                    case VERTEX  : if (debug&16) fprintf(fout,"inserting polyline
             (%s)\n",indat.bname);
50                                 lpldat=process_polyline(iin,fout,OPEN,etype,bldat,SUB);

insert_poly(fout,lpldat,fbldat,indat,sinr,cosr,OPEN,etype);
                                   vertex_count++;
                                   break;
55                  case SEQEND  : if (debug&16) fprintf(fout,"inserting polyline
             (%s)\n",indat.bname);

lpldat=process_polyline(iin,fout,CLOSE,etype,bldat,SUB);

60           insert_poly(fout,lpldat,fbldat,indat,sinr,cosr,CLOSE,etype);
```

HD-23,619

- 40 -

```
                            pline_start=0.0;
                            pline_end=0.0;
                            segment_next=0;
                            bulge_next=0;
  5                         seqend_count++;
                            break;
            case POINT   : if (debug&16) fprintf(fout,"inserting point
  (%s)\n",indat.bname);
                            lptdat=process_point(iin,fout,etype,bldat,SUB);
 10                         insert_point(fout,lptdat,fbldat,indat,sinr,cosr,etype);
                            point_count++;
                            break;
            case LINE    : if (debug&16) fprintf(fout,"inserting line
  (%s)\n",indat.bname);
 15                         llndat=process_line(iin,fout,etype,bldat,SUB);
                            insert_line(fout,llndat,fbldat,indat,sinr,cosr,etype);
                            line_count++;
                            break;
            case CIRCLE  : if (debug&16) fprintf(fout,"inserting circle
 20  (%s)\n",indat.bname);
                            lcrdat=process_circle(iin,fout,etype,bldat,SUB);

insert_circle(fout,lcrdat,fbldat,indat,sinr,cosr,etype);
                            circle_count++;
 25                         break;
            case ARC     : if (debug&16) fprintf(fout,"inserting arc
  (%s)\n",indat.bname);
                            lardat=process_arc(iin,fout,etype,bldat,SUB);
                            insert_arc(fout,lardat,fbldat,indat,sinr,cosr,etype);
 30                         arc_count++;
                            break;
            case SOLID   : if (debug&16) fprintf(fout,"inserting solid
  (%s)\n",indat.bname);
                            lsldat=process_solid(iin,fout,etype,bldat,SUB);
 35                         insert_solid(fout,lsldat,fbldat,indat,sinr,cosr,etype);
                            solid_count++;
                            break;
            default      : strcpy(stemp,get_string(iin));
                            if (debug&128) fprintf(fout,"default: %s\n",stemp);
 40                         break;
         }
       }
     }
     if (etype==NOBLOCKDEF) fclose(iin);
 45  if (etype==BLOCKDEF) fclose(iout);
     return(0);
     }

/*------------------------------------------------------------------------
 50  ---
              write_trace() - output trace definition to outfile
     ------------------------------------------------------------------------
     -*/

55  int write_trace(tr,fout,etype,bldat)
     trace   tr;
     FILE    *fout;
     int     etype;
     block   bldat;
 60  {
```

RD-23,619

- 41 -

```
          char    tfile[80];
          FILE    *trout;

5        if (debug&64) { strcpy(stemp,"write_trace()"); trace_on(stemp); }
          if (etype==BLOCKDEF)    /* will append to existing files */
            sprintf(tfile,"%s.blk",bldat.bname);
          if (etype==NOBLOCKDEF) {
            sprintf(tfile,"%s.%s",filename,tr.layer);
            if (valid_point(tr.layer)) {
10            printf("ERROR: TRACE Entity In Designated Point Layer
          (METAL:%s@(%ld,%ld))\n",
                          tr.layer,(long)tr.x0,(long)tr.y0);
              fprintf(fout,"ERROR: TRACE Entity In Designated Point Layer
          (METAL:%s@(%ld,%ld))\n",
15                        tr.layer,(long)tr.x0,(long)tr.y0);
              error_count++;
              return(0);
              }
            }
20
          if ((trout=fopen(tfile,"a"))==NULL) {
            if ((trout=fopen(tfile,"w"))==NULL) {
              printf("error opening %s for output\n",tfile);
              fprintf(fout,"error opening %s for output\n",tfile);
25            exit(2);
              }
            }
          if (debug&16) {
            fprintf(fout,"layer %s\n",tr.layer);
30          fprintf(fout,"%f\n",tr.x0);              /*     0-------2     */
            fprintf(fout,"%f\n",tr.y0);              /*     |       |     */
            fprintf(fout,"%f\n",tr.x1);              /*     1-------3     */
            fprintf(fout,"%f\n",tr.y1);
            fprintf(fout,"%f\n",tr.x2);
35          fprintf(fout,"%f\n",tr.y2);
            fprintf(fout,"%f\n",tr.x3);
            fprintf(fout,"%f\n",tr.y3);
            }
          if (etype==BLOCKDEF) {
40          dwrite_trace(trout,tr.x0,tr.y0,tr.x1,tr.y1,
                              tr.x2,tr.y2,tr.x3,tr.y3,tr.layer);
            }
          if (etype==NOBLOCKDEF) {
            scale_trace(&tr);
45          if (hdi_format) {
              fprintf(trout,"%8ld ",(long)tr.x1);
              fprintf(trout,"%8ld ",(long)tr.y1);
              fprintf(trout,"%8ld ",(long)tr.x2);
              fprintf(trout,"%8ld\n",(long)tr.y2);
50            }
            if (tpp_format) {                        /* vertical polyline */
              if ((tr.x2-tr.x1)<(tr.y2-tr.y1)) {
                fprintf(trout,"%8ld ",(long)(fabs(tr.x2-tr.x1))); /* start/end width */
55              fprintf(trout,"%8ld\n",(long)(fabs(tr.x2-tr.x1)));
                fprintf(trout,"%8ld ",(long)(tr.x1+(tr.x2-tr.x1)/2));
                fprintf(trout,"%8ld\n",(long)tr.y1);
                fprintf(trout,"%8ld ",(long)(tr.x1+(tr.x2-tr.x1)/2));
                fprintf(trout,"%8ld\n",(long)tr.y2);
60              }
```

HD-23,619

- 42 -

```
       else {
          fprintf(trout,"%8ld ",(long)(fabs(tr.y2-tr.y1))); /* start/end width
     */
          fprintf(trout,"%8ld\n",(long)(fabs(tr.y2-tr.y1)));
          fprintf(trout,"%8ld ",(long)tr.x1);
          fprintf(trout,"%8ld\n",(long)(tr.y1+(tr.y2-tr.y1)/2));
          fprintf(trout,"%8ld ",(long)tr.x2);
          fprintf(trout,"%8ld\n",(long)(tr.y1+(tr.y2-tr.y1)/2));
          }
       fprintf(trout,"%ld %ld\n",LONG_MIN,LONG_MIN);
       record_layer(tr.layer);
       }
   }
fclose(trout);
return(0);
}

/*-------------------------------------------------------------------------
---
       write_poly() - output polyline definition to outfile
-------------------------------------------------------------------------
-*/ int write_poly(pl,fout,tp,etype,bldat)
poly    pl;
FILE    *fout;
int     tp;     /* continue or end turn point */
int     etype;
block   bldat;
{
char    plfile[80];
FILE    *plout;

if (debug&64) { strcpy(stemp,"write_poly()"); trace_on(stemp); }
if (etype==BLOCKDEF)                    /* will append to existing files */
   sprintf(plfile,"%s.blk",bldat.bname);
if (etype==NOBLOCKDEF) {
   sprintf(plfile,"%s.%s",filename,pl.layer);
   if (valid_point(pl.layer)) {
      printf("ERROR: POLYLINE Entity In Designated Point Layer
(METAL:%s@(%ld,%ld)\n",
                  pl.layer,(long)pl.x0,(long)pl.y0);
      fprintf(fout,"ERROR: POLYLINE Entity In Designated Point Layer
(METAL:%s@(%ld,%ld)\n",
                  pl.layer,(long)pl.x0,(long)pl.y0);
      error_count++;
      return(0);
      }
   }
if ((plout=fopen(plfile,"a"))==NULL) {
   if ((plout=fopen(plfile,"w"))==NULL) {
      printf("error opening %s for output\n",plfile);
      fprintf(fout,"error opening %s for output\n",plfile);
      exit(2);
      }
   }
if (debug&16) {
   fprintf(fout,"layer %s\n",pl.layer);
   fprintf(fout,"vflag %d\n",pl.vflag);
   fprintf(fout,"flags %d\n",pl.flags);
```

HD-23,619

- 43 -

```
                    fprintf(fout,"%f\n",pl.x0);
                    fprintf(fout,"%f\n",pl.y0);
                    fprintf(fout,"%f\n",pl.start);
                    fprintf(fout,"%f\n",pl.end);
 5                  fprintf(fout,"%f\n",pl.bulge);
                    } if (etype==BLOCKDEF)
                    dwrite_poly(plout,pl.start,pl.end,pl.x0,pl.y0,pl.bulge,pl.layer,
10                              pl.vflag,pl.flags,tp);

if (etype==NOBLOCKDEF) {
                  scale_poly(&pl);

15                  if (tp==OPEN) {
                       if (segment_next) {
                          tp=WIDTHCHANGE;       /* if segment_next was set in previous call */
                          segment_next=0;
                          }
20                     if ((parsed_40)&&(parsed_41)) {
                          segment_next=1;       /* if change in start and end widths */
                          }
                       if ((parsed_40)||(parsed_41)) {
                          tp=WIDTHCHANGE;       /* if change in start or end widths */
25                        if (parsed_40) parsed_40=0;
                          if (parsed_41) parsed_41=0;
                          }
                                               /* determine ortho transition */
                       if ((ortho_check)&&(pl.start!=0.0)&&(pl.end!=0.0)) {
30                        if (local_vertex_count==2) {
                             if (((prev_x0==(long)pl.x0)||(prev_y0==(long)pl.y0)))
                                ortho=1;
                             else {
                                if (((prev_x0!=(long)pl.x0)&&(prev_y0!=(long)pl.y0)))
35                                 ortho=0;
                                }
                             }
                          if (((prev_x0!=(long)pl.x0)&&(prev_y0!=(long)pl.y0))&&
                             (ortho)&&(local_vertex_count>2)) {
40                           if ((prev_start==(long)pl.start)&&(prev_end==(long)pl.end)&&
                                (prev_start==prev_end)) {
                                ortho=0;         /* ortho to non-ortho transition */
                                tp=ORTHOCHANGE;  /* change in orthogonality */
                                }
45                           }
                          else {
                             if (((prev_x0==(long)pl.x0)||(prev_y0==(long)pl.y0))&&
                                (!ortho)&&(local_vertex_count>2)) {
                                if ((prev_start==(long)pl.start)&&(prev_end==(long)pl.end)&&
50                                 (prev_start==prev_end)) {
                                   ortho=1;       /* non-ortho to ortho transition */
                                   tp=ORTHOCHANGE; /* change in orthogonality */
                                   }
                                }
55                           }
                          }
                       } if (tpp_format) {
60                     if (tp==INIT) {
```

HD-23,619

- 44 -

```
                fprintf(plout,"%8ld ",(long)pl.start);
                fprintf(plout,"%8ld\n",(long)pl.end);
                prev_start=(long)pl.start;
                prev_end=(long)pl.end;
 5              if (prev_start!=prev_end) segment_next=1;
                local_vertex_count=0;
                ortho=1;
                }
            if (tp==OPEN) {
10            if (bulge_next) {
                expand_bulge(pl,fout,plout);
                bulge_next=0;
                }
              fprintf(plout,"%8ld ",(long)pl.x0);
15            fprintf(plout,"%8ld\n",(long)pl.y0);
              if (pl.bulge!=0.0) {
                prev_bulge=pl.bulge;
                bulge_next=1;
                }
20            local_vertex_count++;
              prev_x0=(long)pl.x0;
              prev_y0=(long)pl.y0;
              }
            if (tp==WIDTHCHANGE) {      /* change in start/stop widths */
25            if (bulge_next) {
                expand_bulge(pl,fout,plout);
                bulge_next=0;
                }
              fprintf(plout,"%8ld ",(long)pl.x0);
30            fprintf(plout,"%8ld\n",(long)pl.y0);
              if (pl.bulge!=0.0) {
                prev_bulge=pl.bulge;
                bulge_next=1;
                }
35            prev_x0=(long)pl.x0;
              prev_y0=(long)pl.y0;
              local_vertex_count++;
                        /* segment plines w/ different start/stop values */
              if (!((prev_start==(long)pl.start)&&(prev_end==(long)pl.end)&&
40              (prev_start==prev_end))) {
                fprintf(plout,"%ld %ld\n",LONG_MAX,LONG_MAX);     /* term pline */
                fprintf(plout,"%8ld ",(long)pl.start);    /* new start,end width */
                fprintf(plout,"%8ld\n",(long)pl.end);
                prev_start=(long)pl.start;
45              prev_end=(long)pl.end;
                if (prev_start!=prev_end) segment_next=1;
                fprintf(plout,"%8ld ",(long)pl.x0);       /* open new pline */
                fprintf(plout,"%8ld\n",(long)pl.y0);
                local_vertex_count=1;
50              prev_x0=(long)pl.x0;
                prev_y0=(long)pl.y0;
                }
              }
            if (tp==ORTHOCHANGE) {      /* orthogonal change */
55            fprintf(plout,"%ld %ld\n",LONG_MAX,LONG_MAX);     /* term pline */
              fprintf(plout,"%8ld ",(long)pl.start);    /* new start,end width */
              fprintf(plout,"%8ld\n",(long)pl.end);
              prev_start=(long)pl.start;
              prev_end=(long)pl.end;
60            if (prev_start!=prev_end) segment_next=1;
```

HD-23,619

- 45 -

```
                    fprintf(plout,"%8ld ",(long)prev_x0);      /* previous vertex */
                    fprintf(plout,"%8ld\n",(long)prev_y0);
                    if (bulge_next) {
                     expand_bulge(pl,fout,plout);
 5                   bulge_next=0;
                    }
                    fprintf(plout,"%8ld ",(long)pl.x0);        /* new vertex */
                    fprintf(plout,"%8ld\n",(long)pl.y0);
                    if (pl.bulge!=0.0) {
10                   prev_bulge=pl.bulge;
                     bulge_next=1;
                    }
                    local_vertex_count=2;
                    prev_x0=(long)pl.x0;
15                  prev_y0=(long)pl.y0;
                   }
                                                               /* terminate polygon */
              if (tp==CLOSE) {
                fprintf(plout,"%ld %ld\n",LONG_MIN,LONG_MIN);
20              record_layer(pl.layer);
               }
              }
             }
            fclose(plout);
25          return(0);
            }

/*------------------------------------------------------------------
            ---
30                 write_point() - output point definition to outfile
            ------------------------------------------------------------------
            -*/ int write_point(pt,fout,etype,bldat)
35          point    pt;
            FILE     *fout;
            int      etype;
            block    bldat;
            {
40          char     ptfile[80];
            FILE     *ptout;
            int      width=-1;      /* trap for point in TPP file */ if (debug&64) { strcpy(stemp,"write_point()"); trace_on(stemp); }
45          if (etype==BLOCKDEF)                   /* will append to existing files */
              sprintf(ptfile,"%s.blk",bldat.bname);
            if (etype==NOBLOCKDEF)
              sprintf(ptfile,"%s.%s",filename,pt.layer);
            if ((ptout=fopen(ptfile,"a"))==NULL) {
50            if ((ptout=fopen(ptfile,"w"))==NULL) {
                printf("error opening %s for output\n",ptfile);
                fprintf(fout,"error opening %s for output\n",ptfile);
                exit(2);
              }
55          }
            if (debug&16) {
              fprintf(fout,"layer %s\n",pt.layer);
              fprintf(fout,"%f\n",pt.x0);
              fprintf(fout,"%f\n",pt.y0);
60          }
```

HD-23,619

- 46 -

```
      if (etype==BLOCKDEF) {
        dwrite_point(ptout,pt.x0,pt.y0,pt.layer);
      }
      if (etype==NOBLOCKDEF) {
 5      scale_point(&pt);
        if (valid_point(pt.layer)) {
          fprintf(ptout,"%8ld ",(long)pt.x0);
          fprintf(ptout,"%8ld\n",(long)pt.y0);
          record_layer(pt.layer);
10      }
        else {
          if (valid_layer(pt.layer)) {
            if (debug&256) printf("WARNING: POINT Entity In Designated Metal
     Layer (POINT:%s@(%ld,%ld))\n",
15                                  pt.layer,(long)pt.x0,(long)pt.y0);
            fprintf(fout,"WARNING: POINT Entity In Designated Metal Layer
     (POINT:%s@(%ld,%ld))\n",
                                     pt.layer,(long)pt.x0,(long)pt.y0);
          }
20        fprintf(ptout,"%8d",width);      /* -1 width */
          fprintf(ptout,"%8d\n",width);    /* -1 width */
          fprintf(ptout,"%8ld ",(long)pt.x0);
          fprintf(ptout,"%8ld\n",(long)pt.y0);
          fprintf(ptout,"%ld %ld\n",LONG_MIN,LONG_MIN);   /* term line */
25        record_layer(pt.layer);
        }
      }
      fclose(ptout);
      return(0);
30    }

/*------------------------------------------------------------------
         ---
            write_line() - output line definition to outfile
35       -------------------------------------------------------------------
      -*/ int write_line(ln,fout,etype,bldat)
      line    ln;
40    FILE    *fout;
      int     etype;
      block   bldat;
      {
      char    lnfile[80];
45    FILE    *lnout;
      int     width=0;

if (debug&64) { strcpy(stemp,"write_line()"); trace_on(stemp); }
      if (etype==BLOCKDEF)                    /* will append to existing files */
50      sprintf(lnfile,"%s.blk",bldat.bname);
      if (etype==NOBLOCKDEF) {
        sprintf(lnfile,"%s.%s",filename,ln.layer);
        if (valid_point(ln.layer)) {
          printf("ERROR: LINE Entity In Designated Point Layer
55   (METAL:%s@(%ld,%ld)\n",
                                 ln.layer,(long)ln.x0,(long)ln.y0);
          fprintf(fout,"ERROR: LINE Entity In Designated Point Layer
     (METAL:%s@(%ld,%ld)\n",
                                 ln.layer,(long)ln.x0,(long)ln.y0);
60        error_count++;
```

HD-23,619

- 47 -

```
            return(0);
            }
         }
         if ((lnout=fopen(lnfile,"a"))==NULL) {
           if ((lnout=fopen(lnfile,"w"))==NULL) {
             printf("error opening %s for output\n",lnfile);
             fprintf(fout,"error opening %s for output\n",lnfile);
             exit(2);
             }
           }
         if (debug&16) {
           fprintf(fout,"layer %s\n",ln.layer);
           fprintf(fout,"%f\n",ln.x0);
           fprintf(fout,"%f\n",ln.y0);
           fprintf(fout,"%f\n",ln.x1);
           fprintf(fout,"%f\n",ln.y1);
           }
         if (etype==BLOCKDEF) {
           dwrite_line(lnout,ln.x0,ln.y0,ln.x1,ln.y1,ln.layer);
           } if (etype==NOBLOCKDEF) {
           scale_line(&ln);
           if (import_line) {
             fprintf(lnout,"%8d",width);        /* 0 width */
             fprintf(lnout,"%8d\n",width);      /* 0 width */
             fprintf(lnout,"%8ld ",(long)ln.x0);  /* start */
             fprintf(lnout,"%8ld\n",(long)ln.y0);
             fprintf(lnout,"%8ld ",(long)ln.x1);  /* end */
             fprintf(lnout,"%8ld\n",(long)ln.y1);
             fprintf(lnout,"%ld %ld\n",LONG_MIN,LONG_MIN);    /* term line */
             record_layer(ln.layer);
             }
           else {
             if (valid_layer(ln.layer)) {
               if (debug&256) printf("WARNING: Non-Supported Entity
         (LINE:%s@(%ld,%ld))\n",
                                   ln.layer,(long)ln.x0,(long)ln.y0);
               fprintf(fout,"WARNING: Non-Supported Entity (LINE:%s@(%ld,%ld))\n",
                                   ln.layer,(long)ln.x0,(long)ln.y0);
               error_count++;
               }
             }
           }
         fclose(lnout);
         return(0);
         }

/*---------------------------------------------------------------------
---
            write_dxf() - output dxf line w/ tag
---------------------------------------------------------------------
-*/ void write_dxf(dxf,tag,value)

FILE    *dxf;
         int     tag;
         void    *value;
         {
```

```
        if (debug&64) { strcpy(stemp,"write_dxf()"); trace_on(stemp); }
          fprintf(dxf,"%3d\n",tag);
          if (tag <= 9)
            fprintf(dxf,"%s\n",(char *)value);
 5        else
            if (tag <= 59)
              fprintf(dxf,"%f\n",*(double *)value);
            else
              fprintf(dxf,"%d\n",*(int *)value);
10      }

/*---------------------------------------------------------------
        ---
              dwrite_block() - output dxf block definition
15      ---------------------------------------------------------------
        --*/ void dwrite_block(dxf,name,layer,flags,insert_x,insert_y)
20      FILE    *dxf;
        char    *name;
        char    *layer;
        int     flags;
        double  insert_x;
25      double  insert_y;
        {
        double null_num = 0.0;

if (debug&64) { strcpy(stemp,"dwrite_block()"); trace_on(stemp); }
30      write_dxf(dxf,8,layer);
        write_dxf(dxf,2,name);
        write_dxf(dxf,70,&flags);
        write_dxf(dxf,10,&insert_x);
        write_dxf(dxf,20,&insert_y);
35      write_dxf(dxf,30,&null_num);
        }

/*---------------------------------------------------------------
        ---
40            dwrite_insert() - output dxf insert definition
        ---------------------------------------------------------------
        --*/ void
45      dwrite_insert(dxf,name,layer,flags,insert_x,insert_y,xscale,yscale,rot)

FILE    *dxf;
        char    *name;
        char    *layer;
50      int     flags;
        double  insert_x;
        double  insert_y;
        double  xscale;
        double  yscale;
55      double  rot;
        {
        double null_num = 0.0;

if (debug&64) { strcpy(stemp,"dwrite_insert()"); trace_on(stemp); }
60      write_dxf(dxf,0,"INSERT");
```

HD-23,619

- 49 -

```
        write_dxf(dxf,8,layer);
        write_dxf(dxf,2,name);
        write_dxf(dxf,66,&flags);
        write_dxf(dxf,10,&insert_x);
 5      write_dxf(dxf,20,&insert_y);
        write_dxf(dxf,30,&null_num);
        write_dxf(dxf,41,&xscale);
        write_dxf(dxf,42,&yscale);
        write_dxf(dxf,50,&rot);
10      }

/*---------------------------------------------------------------
        ---
                dwrite_point() - output dxf point definition
15      ---------------------------------------------------------------
        -*/ void dwrite_point(dxf,x,y,layer)

20      FILE    *dxf;
        double  x,y;
        char    *layer;
        {
        char name[9];
25
        if (debug&64) { strcpy(stemp,"dwrite_point()"); trace_on(stemp); }
        write_dxf(dxf,0,"POINT");
        write_dxf(dxf,8,layer);
        write_dxf(dxf,10,&x);
30      write_dxf(dxf,20,&y);
        }

/*---------------------------------------------------------------
        ---
35              dwrite_line() - output dxf line definition
        ---------------------------------------------------------------
        -*/ void dwrite_line(dxf,x0,y0,x1,y1,layer)
40
        FILE    *dxf;
        double  x0,y0,x1,y1;
        char    *layer;
        {
45      char name[9];

if (debug&64) { strcpy(stemp,"dwrite_line()"); trace_on(stemp); }
        write_dxf(dxf,0,"LINE");
        write_dxf(dxf,8,layer);
50      write_dxf(dxf,10,&x0);
        write_dxf(dxf,20,&y0);
        write_dxf(dxf,11,&x1);
        write_dxf(dxf,21,&y1);
        }
55
        /*---------------------------------------------------------------
        ---
                dwrite_trace() - output dxf trace definition
        ---------------------------------------------------------------
60      -*/
```

HD-23,619

- 50 -

```
        void dwrite_trace(dxf,x0,y0,x1,y1,x2,y2,x3,y3,layer)

/* Autocad trace definition:

x0,y0 ---------------- x2,y2
                          |              |
                    x1,y1 ---------------- x3,y3              */

FILE    *dxf;
        double  x0,y0,
                x1,y1,
                x2,y2,
                x3,y3;
        char    *layer;
        {
        if (debug&64) { strcpy(stemp,"dwrite_trace()"); trace_on(stemp); }
        write_dxf(dxf,0,"TRACE");
        write_dxf(dxf,8,layer);
        write_dxf(dxf,10,&x0);
        write_dxf(dxf,20,&y0);
        write_dxf(dxf,11,&x1);
        write_dxf(dxf,21,&y1);
        write_dxf(dxf,12,&x2);
        write_dxf(dxf,22,&y2);
        write_dxf(dxf,13,&x3);
        write_dxf(dxf,23,&y3);
        }

/*---------------------------------------------------------------
                dwrite_poly() - output dxf polyline definition
        ----------------------------------------------------------------*/ void dwrite_poly(dxf,start,end,x0,y0,bulge,layer,vflag,flags,tp)
        FILE    *dxf;
        double  start,end,x0,y0,bulge;
        char    *layer;
        int     vflag,flags,tp;
        {
        double null_num = 0.0;
        /* int vertices_follow_flag = 1; */ if (debug&64) { strcpy(stemp,"dwrite_poly()"); trace_on(stemp); }
        if (tp==INIT) {
          write_dxf(dxf,0,"POLYLINE");
          write_dxf(dxf,8,layer);
          write_dxf(dxf,66,&vflag);
          write_dxf(dxf,10,&null_num);
          write_dxf(dxf,20,&null_num);
          write_dxf(dxf,30,&null_num);
          if (flags) write_dxf(dxf,70,&flags);
          write_dxf(dxf,40,&start);
          write_dxf(dxf,41,&end);
          }
        if (tp==OPEN) {
          write_dxf(dxf,0,"VERTEX");
          write_dxf(dxf,8,layer);
```

HD-23,619

- 51 -

```
      write_dxf(dxf,10,&x0);
      write_dxf(dxf,20,&y0);
      write_dxf(dxf,30,&null_num);
      if (parsed_40) {
        write_dxf(dxf,40,&start);
        parsed_40=0;
        }
      if (parsed_41) {
        write_dxf(dxf,41,&end);
        parsed_41=0;
        }
      if (bulge!=0.0) write_dxf(dxf,42,&bulge);
      }
   if (tp==CLOSE) {
     write_dxf(dxf,0,"SEQEND");
     write_dxf(dxf,8,layer);
     }
   }

/*---------------------------------------------------------------
        dwrite_text() - output dxf text definition
   ------------------------------------------------------------
-*/ void dwrite_text(dxf,x1,y1,string,layer)

FILE    *dxf;
double  x1,y1;
char    *string;
char    *layer;
{
double null_num = 0.0;
double text_size = 0.1;
int vertices_follow_flag = 1;

if (debug&64) { strcpy(stemp,"dwrite_text()"); trace_on(stemp); }
write_dxf(dxf,0,"TEXT");
write_dxf(dxf,8,layer);
write_dxf(dxf,10,&x1);
write_dxf(dxf,20,&y1);
write_dxf(dxf,30,&null_num);
write_dxf(dxf,40,&text_size);
write_dxf(dxf,1,string);
}

/*---------------------------------------------------------------
        insert_trace() - perform insert correction on trace
   ------------------------------------------------------------
-*/ int insert_trace(fout,trdat,bldat,indat,sinr,cosr,etype)

FILE    *fout;
trace   trdat;
block   bldat;
insert  indat;
double  sinr;
double  cosr;
```

HD-23,619

- 52 -

```
        int     etype;
        {
        double  tx0,ty0;
        double  rx0,ry0;
 5      double  rx1,ry1;
        double  rx2,ry2;
        double  rx3,ry3;

if (debug&64) { strcpy(stemp,"insert_trace()"); trace_on(stemp); }
10      if (debug&16) fprintf(fout,"inserting trace (%s)\n",indat.bname);
        if (!strcmp(bldat.layer,"0")) strcpy(bldat.layer,indat.layer);
        if (!strcmp(trdat.layer,"0")) strcpy(trdat.layer,indat.layer);

tx0=indat.insx0-bldat.basex0;   /* normalize insert offset */
15      ty0=indat.insy0-bldat.basey0;   /* no rotation (x0=x0+indat.insx0) */
        rx0=indat.xscale*(trdat.x0-bldat.basex0);
        ry0=indat.yscale*(trdat.y0-bldat.basey0);
        rx1=indat.xscale*(trdat.x1-bldat.basex0);
        ry1=indat.yscale*(trdat.y1-bldat.basey0);
20      rx2=indat.xscale*(trdat.x2-bldat.basex0);
        ry2=indat.yscale*(trdat.y2-bldat.basey0);
        rx3=indat.xscale*(trdat.x3-bldat.basex0);
        ry3=indat.yscale*(trdat.y3-bldat.basey0);
        trdat.x0=(rx0*cosr-ry0*sinr+bldat.basex0+tx0);
25      trdat.y0=(rx0*sinr+ry0*cosr+bldat.basey0+ty0);
        trdat.x1=(rx1*cosr-ry1*sinr+bldat.basex0+tx0);
        trdat.y1=(rx1*sinr+ry1*cosr+bldat.basey0+ty0);
        trdat.x2=(rx2*cosr-ry2*sinr+bldat.basex0+tx0);
        trdat.y2=(rx2*sinr+ry2*cosr+bldat.basey0+ty0);
30      trdat.x3=(rx3*cosr-ry3*sinr+bldat.basex0+tx0);
        trdat.y3=(rx3*sinr+ry3*cosr+bldat.basey0+ty0);
        write_trace(trdat,fout,etype,bldat);
        return(0);
        }
35
        /*-------------------------------------------------------------------
           ---
                insert_poly() - perform insert correction on polyline
           -------------------------------------------------------------------
40      -*/ int insert_poly(fout,pldat,bldat,indat,sinr,cosr,tp,etype)

FILE    *fout;
45      poly    pldat;
        block   bldat;
        insert  indat;
        double  sinr;
        double  cosr;
50      int     tp;
        int     etype;
        {
        double  tx0,ty0;
        double  rx0,ry0;
55
        if (debug&64) { strcpy(stemp,"insert_poly()"); trace_on(stemp); }
        if (debug&16) fprintf(fout,"inserting polyline (%s)\n",indat.bname);
        if (!strcmp(bldat.layer,"0")) strcpy(bldat.layer,indat.layer);
        if (!strcmp(pldat.layer,"0")) strcpy(pldat.layer,indat.layer);
60
```

HD-23,619

- 53 -

```
      if (tp==INIT) {
        if
      ((fabs(indat.xscale)==fabs(indat.yscale))||(pldat.start==pldat.end==0.0)) {
          pldat.start*=fabs(indat.xscale);        /* fabs for mirror def */
          pldat.end*=fabs(indat.yscale);
          }
        else {
          if (valid_layer(pldat.layer)) {
            printf("ERROR: (X,Y) Scale Not Equal, Width Not Scaled
      (PLINE:%s@(%ld,%ld))\n",
                      pldat.layer,(long)pldat.x0,(long)pldat.y0);
            fprintf(fout,"ERROR: (X,Y) Scale Not Equal, Width Not Scaled
      (PLINE:%s@(%ld,%ld))\n",
                      pldat.layer,(long)pldat.x0,(long)pldat.y0);
            error_count++;
            }
          }
        }
      if (tp==OPEN) {
        if
      ((fabs(indat.xscale)==fabs(indat.yscale))||(pldat.start==pldat.end==0.0)) {
          pldat.start*=fabs(indat.xscale);
          pldat.end*=fabs(indat.yscale);
          }
        else {
          if (valid_layer(pldat.layer)) {
            printf("ERROR: (X,Y) Scale Not Equal, Width Not Scaled
      (PLINE:%s@(%ld,%ld))\n",
                      pldat.layer,(long)pldat.x0,(long)pldat.y0);
            fprintf(fout,"ERROR: (X,Y) Scale Not Equal, Width Not Scaled
      (PLINE:%s@(%ld,%ld))\n",
                      pldat.layer,(long)pldat.x0,(long)pldat.y0);
            error_count++;
            }
          }

/* mirrored negative scaled insert pline arc */
        if (indat.xscale<0.0) pldat.bulge*=-1;
        if (indat.yscale<0.0) pldat.bulge*=-1;

tx0=indat.insx0-bldat.basex0;    /* normalize insert offset */
        ty0=indat.insy0-bldat.basey0;    /* no rotation (x0=x0+indat.insx0) */
        rx0=indat.xscale*(pldat.x0-bldat.basex0);
        ry0=indat.yscale*(pldat.y0-bldat.basey0);
        pldat.x0=(rx0*cosr-ry0*sinr+bldat.basex0+tx0);
        pldat.y0=(rx0*sinr+ry0*cosr+bldat.basey0+ty0);
        } write_poly(pldat,fout,tp,NOBLOCKDEF,bldat);
      return(0);
      }

/*---------------------------------------------------------------
      ---
            insert_point() - perform insert correction on point
      ---------------------------------------------------------------
      -*/ int insert_point(fout,ptdat,bldat,indat,sinr,cosr,etype)
```

HD-23,619

- 54 -

```
        FILE    *fout;
        point   ptdat;
        block   bldat;
        insert  indat;
 5      double  sinr;
        double  cosr;
        int     etype;
        {
        double  tx0,ty0;
10      double  rx0,ry0;

if (debug&64) { strcpy(stemp,"insert_point()"); trace_on(stemp); }
        if (debug&16) fprintf(fout,"inserting point (%s)\n",indat.bname);
        if (!strcmp(bldat.layer,"0")) strcpy(bldat.layer,indat.layer);
15      if (!strcmp(ptdat.layer,"0")) strcpy(ptdat.layer,indat.layer);

tx0=indat.insx0-bldat.basex0;   /* normalize insert offset */
        ty0=indat.insy0-bldat.basey0;   /* no rotation (x0=x0+indat.insx0) */
        rx0=indat.xscale*(ptdat.x0-bldat.basex0);
20      ry0=indat.yscale*(ptdat.y0-bldat.basey0);
        ptdat.x0=(rx0*cosr-ry0*sinr+bldat.basex0+tx0);
        ptdat.y0=(rx0*sinr+ry0*cosr+bldat.basey0+ty0);
        write_point(ptdat,fout,NOBLOCKDEF,bldat);
        return(0);
25      }

/*-------------------------------------------------------------------
        ---
                insert_line() - perform insert correction on line
30        ---------------------------------------------------------------------
        -*/ int insert_line(fout,lndat,bldat,indat,sinr,cosr,etype)

35      FILE    *fout;
        line    lndat;
        block   bldat;
        insert  indat;
        double  sinr;
40      double  cosr;
        int     etype;
        {
        double  tx0,ty0;
        double  rx0,ry0;
45      double  rx1,ry1;

if (debug&64) { strcpy(stemp,"insert_line()"); trace_on(stemp); }
        if (debug&16) fprintf(fout,"inserting line (%s)\n",indat.bname);
        if (!strcmp(bldat.layer,"0")) strcpy(bldat.layer,indat.layer);
50      if (!strcmp(lndat.layer,"0")) strcpy(lndat.layer,indat.layer);

tx0=indat.insx0-bldat.basex0;   /* normalize insert offset */
        ty0=indat.insy0-bldat.basey0;   /* no rotation (x0=x0+indat.insx0) */
        rx0=indat.xscale*(lndat.x0-bldat.basex0);
55      ry0=indat.yscale*(lndat.y0-bldat.basey0);
        rx1=indat.xscale*(lndat.x1-bldat.basex0);
        ry1=indat.yscale*(lndat.y1-bldat.basey0);
        lndat.x0=(rx0*cosr-ry0*sinr+bldat.basex0+tx0);
        lndat.y0=(rx0*sinr+ry0*cosr+bldat.basey0+ty0);
60      lndat.x1=(rx1*cosr-ry1*sinr+bldat.basex0+tx0);
```

HD-23,619

- 55 -

```
lndat.y1=(rx1*sinr+ry1*cosr+bldat.basey0+ty0);
write_line(lndat,fout,NOBLOCKDEF,bldat);
return(0);
}
/*---------------------------------------------------------------
---
        trace_on() - debug tracer
-----------------------------------------------------------------
-*/ void trace_on(procstr)
char    *procstr;
{
printf("\033[s");        /* save cursor position */
printf("\033[1;60H%20s",procstr);
printf("\033[u");        /* unsave cursor position */
}

/*---------------------------------------------------------------
---
        scale_trace() - apply scale, offset
-----------------------------------------------------------------
-*/ int scale_trace(tr)
trace   *tr;
{
tr->x0*=scale;          tr->x0+=xoffset;
tr->y0*=scale;          tr->y0+=yoffset;
tr->x1*=scale;          tr->x1+=xoffset;
tr->y1*=scale;          tr->y1+=yoffset;
tr->x2*=scale;          tr->x2+=xoffset;
tr->y2*=scale;          tr->y2+=yoffset;
tr->x3*=scale;          tr->x3+=xoffset;
tr->y3*=scale;          tr->y3+=yoffset;
return(0);
}

/*---------------------------------------------------------------
---
        scale_poly() - apply scale, offset
-----------------------------------------------------------------
-*/ int scale_poly(pl)
poly    *pl;
{
pl->x0*=scale;          pl->x0+=xoffset;
pl->y0*=scale;          pl->y0+=yoffset;
pl->start*=scale;
pl->end*=scale;
return(0);
}

/*---------------------------------------------------------------
---
        clean_up() - system call for file purge
-----------------------------------------------------------------
-*/
```

RD-23,619

- 56 -

```
     int clean_up(clean_type)
     int     clean_type;
     {
5    FILE    *temp_ptr;
     int     mec_exists=0;

if (clean_type==START) {
       if ((temp_ptr=fopen("dxf.tmp","r"))!=NULL) {
10        fclose(temp_ptr);
          printf("deleting dxf.tmp file ...\n");
          if (os_type=='D')
            sprintf(stemp,"del dxf.tmp");
          if (os_type=='U')
15          sprintf(stemp,"rm -f dxf.tmp");
          system(stemp);
       }
       sprintf(stemp,"%s.mec",filename);
       if ((temp_ptr=fopen(stemp,"r"))!=NULL) {
20        fclose(temp_ptr);
          mec_exists=1;
       }
       if (os_type=='D')
          sprintf(stemp,"rename %s dxf.tmp",dxffile);
25     if (os_type=='U')
          sprintf(stemp,"mv %s dxf.tmp",dxffile);
       system(stemp);
       if (mec_exists) {
          if (os_type=='D')
30           sprintf(stemp,"rename %s.mec mec.tmp",filename);
          if (os_type=='U')
             sprintf(stemp,"mv %s.mec mec.tmp",filename);
          system(stemp);
       }
35     printf("deleting *.blk and %s.* files ...\n",filename);
       if (os_type=='D')
          sprintf(stemp,"del *.blk");
       if (os_type=='U')
          sprintf(stemp,"rm -f *.blk");
40     system(stemp);
       if (os_type=='D')
          sprintf(stemp,"del %s.*",filename);
       if (os_type=='U')
          sprintf(stemp,"rm -f %s.*",filename);
45     system(stemp);
       if (os_type=='D')
          sprintf(stemp,"rename dxf.tmp %s",dxffile);
       if (os_type=='U')
          sprintf(stemp,"mv dxf.tmp %s",dxffile);
50     system(stemp);
       if (mec_exists) {
          if (os_type=='D')
             sprintf(stemp,"rename mec.tmp %s.mec",filename);
          if (os_type=='U')
55           sprintf(stemp,"mv mec.tmp %s.mec",filename);
          system(stemp);
       }
       printf("\n");
     }
60   if (clean_type==FINISH) {       /* check for block creation */
```

HD-23,619

- 57 -

```
    if ((temp_ptr=fopen("block.tmp","r"))!=NULL) {
      fclose(temp_ptr);
      if (os_type=='D')
        sprintf(stemp,"del *.blk");
      if (os_type=='U')
        sprintf(stemp,"rm -f *.blk");
      system(stemp);
      if (os_type=='D')
        sprintf(stemp,"del block.tmp");
      if (os_type=='U')
        sprintf(stemp,"rm -f block.tmp");
      system(stemp);
    }
  }
}

/*-------------------------------------------------------------------
---
        scale_point() - apply scale, offset
-------------------------------------------------------------------
-*/ int scale_point(pt)
point   *pt;
{
pt->x0*=scale;       pt->x0+=xoffset;
pt->y0*=scale;       pt->y0+=yoffset;
return(0);
}

/*-------------------------------------------------------------------
---
        scale_line() - apply scale, offset
-------------------------------------------------------------------
-*/ int scale_line(ln)
line    *ln;
{
ln->x0*=scale;       ln->x0+=xoffset;
ln->y0*=scale;       ln->y0+=yoffset;
ln->x1*=scale;       ln->x1+=xoffset;
ln->y1*=scale;       ln->y1+=yoffset;
return(0);
}

/*-------------------------------------------------------------------
---
        init_gindat() - init structure
-------------------------------------------------------------------
-*/ init_gindat()

{
int     i;

strcpy(stemp,"0\0");                /* default layer 0 */
for (i=0;i<MAXNEST;i++) {
  strcpy(gindat[i].bname,stemp);    /* initialize */
```

RD-23,619

- 58 -

```
  strcpy(gindat[i].layer,stemp);
  gindat[i].flags=0;
  gindat[i].insx0=0.0;
  gindat[i].insy0=0.0;
  gindat[i].xscale=1.0;
  gindat[i].yscale=1.0;
  gindat[i].rot=0.0;
  }
}
/*---------------------------------------------------------------------
      get_params() - extract from command line
------------------------------------------------------------------------
-*/ void get_params(argc,argv)
int    argc;
char   *argv[];
{
int    i;

if (debug&64) { strcpy(stemp,"get_params()"); trace_on(stemp); }
if (debug&64) printf("get_params()\n");
if (argc<2) {
  printf("Correct usage: dxf2tpp [filename] [options]\n\n");
  printf("Options:\n\n");
  printf("   -s[n]   n=scale factor\n");
  printf("   -x[n]   n=X offset\n");
  printf("   -y[n]   n=Y offset\n\n");
  printf("Default: scale factor=1, x offset=0, y offset=0\n");
  exit(1);
  }
sprintf(filename,"%s",argv[1]);
sprintf(dxffile,"%s.dxf",filename);
for (i=2;i<argc;i++) {
  if (argv[i][0]=='-') {
    switch (argv[i][1]) {
      case 'b': case 'B':
        sprintf(bstring,"%s",&argv[i][2]);
        break;
      case 'd': case 'D':
        debug=atoi(&argv[i][2]);      /* at address [i][2] */
        if (debug&1) printf("debug = %d\n",debug);
        break;
      case 'h': case 'H':
        hdi_format=1;
        if (debug&1) printf("HDI format enabled\n");
        break;
      case 'i': case 'I':
        sprintf(istring,"%s",&argv[i][2]);
        break;
      case 'l': case 'L':
        import_line=1;
        if (debug&1) printf("DXF Line entity import enabled\n");
        break;
      case 'n': case 'N':
        betacode_select=atoi(&argv[i][2]);    /* at address [i][2] */
        if (debug&1) printf("betacode_select = %d\n",betacode_select);
        break;
```

HD-23,619

- 59 -

```
            case 'o': case 'O':
               ortho_check=0;
               if (debug&1) printf("ortho check disabled\n");
               break;
            case 'p': case 'P':
               purge_blk=0;
               if (debug&1) printf("block purge disabled\n");
               break;
            case 's': case 'S':
               scale=atof(&argv[i][2]);        /* at address [i][2] */
               if (debug&1) printf("scale = %1.3f\n",scale);
               break;
            case 't': case 'T':
               tpp_format=0;
               if (debug&1) printf("TPP format disabled\n");
               break;
            case 'x': case 'X':
               xoffset=atof(&argv[i][2]);      /* at address [i][2] */
               if (debug&1) printf("x offset = %1.3f\n",xoffset);
               break;
            case 'y': case 'Y':
               yoffset=atof(&argv[i][2]);      /* at address [i][2] */
               if (debug&1) printf("y offset = %1.3f\n",yoffset);
               break;
            default:
               break;
            }
         }
      }
   }

/*-------------------------------------------------------------------
---
      fix_char() - replaces illegal DOS file characters
-------------------------------------------------------------------
-*/ void fix_char(fout,s)
FILE   *fout;
char   *s;
{
int i=0;
int j;
        /* fix illegal characters (*) */
while(s[i]!='\0') { if (s[i]=='*') s[i]='{'; i++; }
if (i>8) {
  if (!sub_blockname(fout,s)) {
     printf("ERROR: Illegal Block Name: > 8 Characters (%s)\n",s);
     fprintf(fout,"ERROR: Illegal Block Name: > 8 Characters (%s)\n",s);
     error_count++;
     }
  }
}

/*-------------------------------------------------------------------
---
      fix_name() - fixes illegal DOS block names
-------------------------------------------------------------------
-*/
```

HD-23,619

- 60 -

```
void fix_name(s)
char    *s;
{
/* not including CLOCK$ */
if (!strcmp(s,"con")) sprintf(s,"co");
if (!strcmp(s,"aux")) sprintf(s,"au");
if (!strcmp(s,"com1")) sprintf(s,"co}1");
if (!strcmp(s,"com2")) sprintf(s,"co}2");
if (!strcmp(s,"com3")) sprintf(s,"co}3");
if (!strcmp(s,"com4")) sprintf(s,"co}4");
if (!strcmp(s,"lpt1")) sprintf(s,"lp}1");
if (!strcmp(s,"lpt2")) sprintf(s,"lp}2");
if (!strcmp(s,"lpt3")) sprintf(s,"lp}3");
if (!strcmp(s,"nul")) sprintf(s,"nu");
if (!strcmp(s,"prn")) sprintf(s,"pr");
}

/*--------------------------------------------------------------
        record_layer() - laser2 layer counts
----------------------------------------------------------------
-*/ void record_layer(layer)
char    *layer;
{
if (!strcmp(layer,"mt0")) mt0++;
if (!strcmp(layer,"mt1")) mt1++;
if (!strcmp(layer,"mt2")) mt2++;
if (!strcmp(layer,"mt3")) mt3++;
if (!strcmp(layer,"mt4")) mt4++;
if (!strcmp(layer,"mt5")) mt5++;
if (!strcmp(layer,"mt6")) mt6++;
if (!strcmp(layer,"mt7")) mt7++;
if (!strcmp(layer,"mt8")) mt8++;
if (!strcmp(layer,"mt9")) mt9++;

if (!strcmp(layer,"dr1")) dr1++;
if (!strcmp(layer,"dr2")) dr2++;
if (!strcmp(layer,"dr3")) dr3++;
if (!strcmp(layer,"dr4")) dr4++;
if (!strcmp(layer,"dr5")) dr5++;
if (!strcmp(layer,"dr6")) dr6++;
if (!strcmp(layer,"dr7")) dr7++;
if (!strcmp(layer,"dr8")) dr8++;
if (!strcmp(layer,"dr9")) dr9++;

if (!strcmp(layer,"leg")) leg++;
if (!strcmp(layer,"alm")) alm++;
}

/*--------------------------------------------------------------
        sub_blockname() - substitute > 8 character block names
----------------------------------------------------------------
-*/ int sub_blockname(fout,s)
FILE    *fout;
char    *s;
```

HD-23,619

- 61 -

```
        {
        int i;

if (lookup_table_size==0) return(0);
        for (i=0;i<lookup_table_size;i++) {
          if (!strcmp(s,lookup_table[i].old)) {
            if (debug&256) {
              printf("BLOCKSUB: Replacing Block %s With %s\n",s,
                             lookup_table[i].new);
              fprintf(fout,"BLOCKSUB: Replacing Block %s With %s\n",s,
                             lookup_table[i].new);
            }
            strcpy(s,lookup_table[i].new);
            return(1);
          }
        }
        return(0);
        }

/*-----------------------------------------------------------------
                init_lookup_table() - initialize lookup table
-----------------------------------------------------------------*/ int init_lookup_table(fout)
FILE    *fout;
{
FILE    *temp_ptr;
int i=0;
char stemp1[40];
char stemp2[40];

if ((temp_ptr=fopen(LOOKUPFILE,"r"))!=NULL) {
          fgets(stemp,80,temp_ptr);      /* purge header */
          while (!feof(temp_ptr)) {
            fscanf(temp_ptr,"%s %s",stemp1,stemp2);
            if (!feof(temp_ptr)) {
              strcpy(lookup_table[i].old,stemp1);
              strcpy(lookup_table[i].new,stemp2);
              i++;
            }
          }
          fclose(temp_ptr);
          if (i>=LOOKUPSIZE) {
            printf("ERROR: Block Name Replacement Table Size Exceeded\n");
            fprintf(fout,"ERROR: Block Name Replacement Table Size Exceeded\n");
            error_count++;
            return(0);
          }
          else
            return(i);
        }
        else
          return(0);
}

/*-----------------------------------------------------------------
                expand_bulge() - output TPP bulge definition
```

HU-23,619

```
expand_bulge(pl,fout,plout)
poly    pl;
FILE    *fout,*plout;
{
int     i;
double  theta_included,theta_delta,theta_start;
double  delta_x,delta_y;
double  theta_acute1,theta_acute2,theta_acute3;
double  temp_x0,temp_y0;
double  center_x,center_y;
double  radius;
double  opposite;
int     turnpoints;

/* bulge definition: tangent of 1/4 the included angle for an arc segment,
made negative if the arc goes clockwise from the start point to the end
point.  Bulge of 0 indicates a straight segment, and a bulge of 1 is a
semicircle */

/* 2 M_PI Radians = 360 degrees */
theta_included=4.0*(atan(prev_bulge));
theta_acute1=atan2((prev_y0-pl.y0),(prev_x0-pl.x0));    /* angle of chord
*/
theta_acute2=(M_PI-theta_included)/2.0;   /* of equilateral triangle side
*/ opposite=sqrt(pow((prev_x0-pl.x0)/2.0,2)+pow((prev_y0-pl.y0)/2.0,2));
radius=fabs(opposite/(sin(theta_included/2.0)));
delta_x=sin(theta_included/2.0)*radius;             /* base */
delta_y=cos(theta_included/2.0)*radius;             /* height */ if (prev_bulge>0.0) theta_acute3=M_PI-theta_acute1;
else theta_acute3=(2.0*M_PI)-theta_acute1;

center_x=prev_x0+delta_x*cos(theta_acute3)+delta_y*sin(theta_acute3);
center_y=prev_y0+delta_y*cos(theta_acute3)-delta_x*sin(theta_acute3);

theta_start=atan2((prev_y0-center_y),(prev_x0-center_x));

turnpoints=(int)fabs(((theta_included*(radius/scale))/
                (2.0*M_PI*(radius/scale)))*(double)CIRCLE_MAX_TP);

theta_delta=theta_included/turnpoints;
for(i=0;i<turnpoints;i++) {
  theta_start+=theta_delta;
  temp_x0=center_x+(radius*(cos(theta_start)));
  temp_y0=center_y+(radius*(sin(theta_start)));
  fprintf(plout,"%8ld ",(long)temp_x0);
  fprintf(plout,"%8ld\n",(long)temp_y0);
  }
}

/*-------------------------------------------------------------------
---
        process_circle() - parse circle definition
-------------------------------------------------------------------
-*/
```

HD-23,619

- 63 -

```
        circle process_circle(dxf,fout,etype,bldat,proc)
        FILE    *dxf;
        FILE    *fout;
 5      int     etype;
        block   bldat;
        int     proc;
        {
        int     quit=FALSE;
10      int     t;
        circle  *circle_ptr;
        static  circle  circle_dat;

if (debug&64) { strcpy(stemp,"process_circle()"); trace_on(stemp); }
15      strcpy(stemp,"0\0");                    /* default layer 0 */
        circle_ptr=&circle_dat;                 /* allocate memory */
        strcpy(circle_ptr->layer,stemp);        /* initialize */
        circle_ptr->x0=0.0;
        circle_ptr->y0=0.0;
20      circle_ptr->radius=0.0;

if (debug&16) fprintf(fout,"CIRCLE\n");
        while (!quit) {
          t=get_tag_token(get_tag(dxf));
25        switch(t) {
            case EOFILE  : quit=TRUE;
                           printf("process_circle() eof\n");
                           break;
            case ZERO    : quit=TRUE;
30                         break;
            case EIGHT   : strcpy(circle_ptr->layer,get_string(dxf));
                           break;
            case TEN     : circle_ptr->x0=get_double(dxf);
                           break;
35          case TWENTY  : circle_ptr->y0=get_double(dxf);
                           break;
            case FORTY   : circle_ptr->radius=get_double(dxf);
                           break;
            default      : strcpy(stemp,get_string(dxf));
40                         if (debug&128) fprintf(fout,"default: %s\n",stemp);
                           break;
          }
        }
        if (proc==MAIN) write_circle(circle_dat,fout,etype,bldat);
45      return(circle_dat);
        }

/*---------------------------------------------------------------
50              write_circle() - output circle definition to outfile
        ---------------------------------------------------------------
        -*/ int write_circle(cr,fout,etype,bldat)
55      circle  cr;
        FILE    *fout;
        int     etype;
        block   bldat;
        {
60      char    crfile[80];
```

HD-23,619

- 64 -

```
         FILE    *crout;
         int     width=0;      /* 0-width circle in TPP file */ if (debug&64) { strcpy(stemp,"write_circle()"); trace_on(stemp); }
5        if (etype==BLOCKDEF)                  /* will append to existing files */
           sprintf(crfile,"%s.blk",bldat.bname);
         if (etype==NOBLOCKDEF)
           sprintf(crfile,"%s.%s",filename,cr.layer);
         if ((crout=fopen(crfile,"a"))==NULL) {
10         if ((crout=fopen(crfile,"w"))==NULL) {
             printf("error opening %s for output\n",crfile);
             fprintf(fout,"error opening %s for output\n",crfile);
             exit(2);
             }
15         }
         if (debug&16) {
           fprintf(fout,"layer %s\n",cr.layer);
           fprintf(fout,"%f\n",cr.x0);
           fprintf(fout,"%f\n",cr.y0);
20         fprintf(fout,"%f\n",cr.radius);
           }
         if (etype==BLOCKDEF) {
           dwrite_circle(crout,cr.x0,cr.y0,cr.radius,cr.layer);
           }
25       if (etype==NOBLOCKDEF) {
           scale_circle(&cr);
           fprintf(crout,"%8d",width);    /* 0 width */
           fprintf(crout,"%8d\n",width);  /* 0 width */
           expand_circle(cr,fout,crout);
30         fprintf(crout,"%ld %ld\n",LONG_MIN,LONG_MIN);      /* term line */
           record_layer(cr.layer);
           }
         fclose(crout);
         return(0);
35       }

/*------------------------------------------------------------
         ---
                 scale_circle() - apply scale, offset
40       ------------------------------------------------------------
         -*/ int scale_circle(cr)
         circle *cr;
45       {
         cr->x0*=scale;         cr->x0+=xoffset;
         cr->y0*=scale;         cr->y0+=yoffset;
         cr->radius*=scale;
         return(0);
50       }

/*------------------------------------------------------------
         ---
                 dwrite_circle() - output dxf circle definition
55       ------------------------------------------------------------
         -*/ void dwrite_circle(dxf,x,y,radius,layer)
60         FILE    *dxf;
```

HD-23,619

- 65 -

```
               double  x,y;
               double  radius;
               char    *layer;
               {
  5            char name[9];

if (debug&64) { strcpy(stemp,"dwrite_circle()"); trace_on(stemp); }
               write_dxf(dxf,0,"CIRCLE");
               write_dxf(dxf,8,layer);
 10            write_dxf(dxf,10,&x);
               write_dxf(dxf,20,&y);
               write_dxf(dxf,40,&radius);
               }

15            /*-------------------------------------------------------------
               ---
                        insert_circle() - perform insert correction on circle
               --------------------------------------------------------------
               -*/
 20
               int insert_circle(fout,crdat,bldat,indat,sinr,cosr,etype)

FILE    *fout;
               circle  crdat;
 25            block   bldat;
               insert  indat;
               double  sinr;
               double  cosr;
               int     etype;
 30            {
               double  tx0,ty0;
               double  rx0,ry0;

if (debug&64) { strcpy(stemp,"insert_circle()"); trace_on(stemp); }
 35            if (debug&16) fprintf(fout,"inserting circle (%s)\n",indat.bname);
               if (!strcmp(bldat.layer,"0")) strcpy(bldat.layer,indat.layer);
               if (!strcmp(crdat.layer,"0")) strcpy(crdat.layer,indat.layer);

if (fabs(indat.xscale)==fabs(indat.yscale)) {
 40              crdat.radius*=fabs(indat.xscale);         /* fabs for mirror def */
                 }
               else {
                 if (valid_layer(crdat.layer)) {
                   printf("ERROR: (X,Y) Scale Not Equal, Width Not Scaled
 45            (CIRCLE:%s@(%ld,%ld))\n",
                           crdat.layer,(long)crdat.x0,(long)crdat.y0);
                   fprintf(fout,"ERROR: (X,Y) Scale Not Equal, Width Not Scaled
               (CIRCLE:%s@(%ld,%ld))\n",
                           crdat.layer,(long)crdat.x0,(long)crdat.y0);
 50              error_count++;
                 }
               } tx0=indat.insx0-bldat.basex0;   /* normalize insert offset */
 55            ty0=indat.insy0-bldat.basey0;   /* no rotation (x0=x0+indat.insx0) */
               rx0=indat.xscale*(crdat.x0-bldat.basex0);
               ry0=indat.yscale*(crdat.y0-bldat.basey0);
               crdat.x0=(rx0*cosr-ry0*sinr+bldat.basex0+tx0);
               crdat.y0=(rx0*sinr+ry0*cosr+bldat.basey0+ty0);
 60            write_circle(crdat,fout,NOBLOCKDEF,bldat);
```

HD-23,619

- 66 -

```
        return(0);
    }

/*---------------------------------------------------------------
    ---
            expand_circle() - output TPP circle definition
    ---------------------------------------------------------------
    -*/ expand_circle(cr,fout,crout)
    circle  cr;
    FILE    *fout,*crout;
    {
    int     i;
    double  theta_delta,theta_start;
    long    temp_x0,temp_y0;
    int     turnpoints;

turnpoints=CIRCLE_MAX_TP;
    theta_start=0.0;
    theta_delta=(2.0*M_PI)/turnpoints;
    for(i=0;i<turnpoints;i++) {
      theta_start+=theta_delta;
      temp_x0=cr.x0+(cr.radius*(cos(theta_start)));
      temp_y0=cr.y0+(cr.radius*(sin(theta_start)));
      fprintf(crout,"%8ld ",(long)temp_x0);
      fprintf(crout,"%8ld\n",(long)temp_y0);
      }
    }

/*---------------------------------------------------------------
    ---
            process_arc() - parse arc definition
    ---------------------------------------------------------------
    -*/ arc process_arc(dxf,fout,etype,bldat,proc)
    FILE    *dxf;
    FILE    *fout;
    int     etype;
    block   bldat;
    int     proc;
    {
    int     quit=FALSE;
    int     t;
    arc     *arc_ptr;
    static arc      arc_dat;

if (debug&64) { strcpy(stemp,"process_arc()"); trace_on(stemp); }
    strcpy(stemp,"0\0");                    /* default layer 0 */
    arc_ptr=&arc_dat;                       /* allocate memory */
    strcpy(arc_ptr->layer,stemp);           /* initialize */
    arc_ptr->x0=0.0;
    arc_ptr->y0=0.0;

if (debug&16) fprintf(fout,"ARC\n");
    while (!quit) {
      t=get_tag_token(get_tag(dxf));
      switch(t) {
        case EOFILE    : quit=TRUE;
```

RD-23,619

- 67 -

```
                              printf("process_arc() eof\n");
                              break;
                case ZERO    : quit=TRUE;
                              break;
    case EIGHT               : strcpy(arc_ptr->layer,get_string(dxf));
                              break;
                case TEN     : arc_ptr->x0=get_double(dxf);
                              break;
                case TWENTY  : arc_ptr->y0=get_double(dxf);
                              break;
                case FORTY   : arc_ptr->radius=get_double(dxf);
                              break;
                case FIFTY   : arc_ptr->start=get_double(dxf);
                              break;
    case FIFTY1              : arc_ptr->end=get_double(dxf);
                              break;
                default      : strcpy(stemp,get_string(dxf));
                              if (debug&128) fprintf(fout,"default: %s\n",stemp);
                              break;
            }
        }
    if (proc==MAIN) write_arc(arc_dat,fout,etype,bldat);
    return(arc_dat);
    }

/*-------------------------------------------------------------------------
---
        write_arc() - output arc definition to outfile
-------------------------------------------------------------------------
-*/ int write_arc(ar,fout,etype,bldat)
    arc     ar;
    FILE    *fout;
    int     etype;
    block   bldat;
    {
    char    arfile[80];
    FILE    *arout;

if (debug&64) { strcpy(stemp,"write_arc()"); trace_on(stemp); }
    if (etype==BLOCKDEF)                    /* will append to existing files */
      sprintf(arfile,"%s.blk",bldat.bname);
    if (etype==NOBLOCKDEF)
      sprintf(arfile,"%s.%s",filename,ar.layer);
    if ((arout=fopen(arfile,"a"))==NULL) {
      if ((arout=fopen(arfile,"w"))==NULL) {
        printf("error opening %s for output\n",arfile);
        fprintf(fout,"error opening %s for output\n",arfile);
        exit(2);
        }
      }
    if (debug&16) {
      fprintf(fout,"layer %s\n",ar.layer);
      fprintf(fout,"%f\n",ar.x0);
      fprintf(fout,"%f\n",ar.y0);
      fprintf(fout,"%f\n",ar.radius);
      fprintf(fout,"%f\n",ar.start);
      fprintf(fout,"%f\n",ar.end);
      }
```

RD-23,619

- 68 -

```
        if (etype==BLOCKDEF) {
          dwrite_arc(arout,ar.x0,ar.y0,ar.radius,ar.start,ar.end,ar.layer);
        }
        if (etype==NOBLOCKDEF) {
          if (valid_layer(ar.layer)) {
            scale_arc(&ar);
            if (debug&256) printf("WARNING: Non-Supported Entity
(ARC:%s@(%ld,%ld))\n",
                            ar.layer,(long)ar.x0,(long)ar.y0);
            fprintf(fout,"WARNING: Non-Supported Entity (ARC:%s@(%ld,%ld))\n",
                            ar.layer,(long)ar.x0,(long)ar.y0);
            /*
            record_layer(ar.layer);
            */
          }
        }
        fclose(arout);
        return(0);
        }

/*-------------------------------------------------------------------
        ---
              scale_arc() - apply scale, offset
        --------------------------------------------------------------------
        -*/ int scale_arc(ar)
        arc    *ar;
        {
        ar->x0*=scale;          ar->x0+=xoffset;
        ar->y0*=scale;          ar->y0+=yoffset;
        ar->radius*=scale;
        ar->start*=scale;
        ar->end*=scale;
        return(0);
        }

/*-------------------------------------------------------------------
        ---
              dwrite_arc() - output dxf arc definition
        --------------------------------------------------------------------
        -*/ void dwrite_arc(dxf,x,y,radius,start,end,layer)
        FILE   *dxf;
        double x,y;
        double radius,start,end;
        char   *layer;
        {
        char name[9];

if (debug&64) { strcpy(stemp,"dwrite_arc()"); trace_on(stemp); }
        write_dxf(dxf,0,"ARC");
        write_dxf(dxf,8,layer);
        write_dxf(dxf,10,&x);
        write_dxf(dxf,20,&y);
        write_dxf(dxf,40,&radius);
        write_dxf(dxf,50,&start);
        write_dxf(dxf,51,&end);
```

HD-23,619

- 69 -

```
          }
          /*------------------------------------------------------------
          ---
   5             insert_arc() - perform insert correction on arc
          ------------------------------------------------------------
          -*/ int insert_arc(fout,ardat,bldat,indat,sinr,cosr,etype)
  10      FILE    *fout;
          arc     ardat;
          block   bldat;
          insert  indat;
  15      double  sinr;
          double  cosr;
          int     etype;
          {
          double  tx0,ty0;
  20      double  rx0,ry0;

if (debug&64) { strcpy(stemp,"insert_arc()"); trace_on(stemp); }
          if (debug&16) fprintf(fout,"inserting arc (%s)\n",indat.bname);
          if (!strcmp(bldat.layer,"0")) strcpy(bldat.layer,indat.layer);
  25      if (!strcmp(ardat.layer,"0")) strcpy(ardat.layer,indat.layer);

if (fabs(indat.xscale)==fabs(indat.yscale)) {
            ardat.radius*=fabs(indat.xscale);      /* fabs for mirror def */
            }
  30      else {
            if (valid_layer(ardat.layer)) {
              printf("ERROR: (X,Y) Scale Not Equal, Width Not Scaled
          (ARC:%s@(%ld,%ld))\n",
                          ardat.layer,(long)ardat.x0,(long)ardat.y0);
  35          fprintf(fout,"ERROR: (X,Y) Scale Not Equal, Width Not Scaled
          (ARC:%s@(%ld,%ld))\n",
                          ardat.layer,(long)ardat.x0,(long)ardat.y0);
              error_count++;
              }
  40        } tx0=indat.insx0-bldat.basex0;   /* normalize insert offset */
          ty0=indat.insy0-bldat.basey0;   /* no rotation (x0=x0+indat.insx0) */
          rx0=indat.xscale*(ardat.x0-bldat.basex0);
  45      ry0=indat.yscale*(ardat.y0-bldat.basey0);
          ardat.x0=(rx0*cosr-ry0*sinr+bldat.basex0+tx0);
          ardat.y0=(rx0*sinr+ry0*cosr+bldat.basey0+ty0);
          write_arc(ardat,fout,NOBLOCKDEF,bldat);
          return(0);
  50      }

/*------------------------------------------------------------
          ---
                  process_solid() - parse solid definition
  55      ------------------------------------------------------------
          -*/ solid process_solid(dxf,fout,etype,bldat,proc)
          FILE    *dxf;
  60      FILE    *fout;
```

RD-23,619

- 70 -

```
            int     etype;
            block   bldat;
            int     proc;
            {
 5          int     quit=FALSE;
            int     t;
            solid   *solid_ptr;
            static  solid   solid_dat;

10          if (debug&64) { strcpy(stemp,"process_solid()"); trace_on(stemp); }
            strcpy(stemp,"0\0");                    /* default layer 0 */
            solid_ptr=&solid_dat;                   /* allocate memory */
            strcpy(solid_ptr->layer,stemp);         /* initialize */
            solid_ptr->x0=0.0;
15          solid_ptr->y0=0.0;
            solid_ptr->x1=0.0;
            solid_ptr->y1=0.0;
            solid_ptr->x2=0.0;
            solid_ptr->y2=0.0;
20          solid_ptr->x3=0.0;
            solid_ptr->y3=0.0;

if (debug&16) fprintf(fout,"SOLID\n");
            while (!quit) {
25            t=get_tag_token(get_tag(dxf));
              switch(t) {
                case EOFILE   : quit=TRUE;
                                printf("process_solid() eof\n");
                                break;
30              case ZERO     : quit=TRUE;
                                break;
                case EIGHT    : strcpy(solid_ptr->layer,get_string(dxf));
                                break;
                case TEN      : solid_ptr->x0=get_double(dxf);
35                              break;
                case TWENTY   : solid_ptr->y0=get_double(dxf);
                                break;
                case ELEVEN   : solid_ptr->x1=get_double(dxf);
                                break;
40              case TWENTY1  : solid_ptr->y1=get_double(dxf);
                                break;
                case TWELVE   : solid_ptr->x2=get_double(dxf);
                                break;
                case TWENTY2  : solid_ptr->y2=get_double(dxf);
45                              break;
                case THIRTEEN : solid_ptr->x3=get_double(dxf);
                                break;
                case TWENTY3  : solid_ptr->y3=get_double(dxf);
                                break;
50              default       : strcpy(stemp,get_string(dxf));
                                if (debug&128) fprintf(fout,"default: %s\n",stemp);
                                break;
              }
            }
55          if (proc==MAIN) write_solid(solid_dat,fout,etype,bldat);
            return(solid_dat);
            }

/*------------------------------------------------------------------
60          ---
```

HD-23,619

- 71 -

```
             write_solid() - output solid definition to outfile
         ------------------------------------------------------------------
         -*/
 5       int write_solid(sl,fout,etype,bldat)
         solid   sl;
         FILE    *fout;
         int     etype;
         block   bldat;
10       {
         char    tfile[80];
         FILE    *slout;

if (debug&64) { strcpy(stemp,"write_solid()"); trace_on(stemp); }
15       if (etype==BLOCKDEF)      /* will append to existing files */
           sprintf(tfile,"%s.blk",bldat.bname);
         if (etype==NOBLOCKDEF)
           sprintf(tfile,"%s.%s",filename,sl.layer);
         if ((slout=fopen(tfile,"a"))==NULL) {
20         if ((slout=fopen(tfile,"w"))==NULL) {
             printf("error opening %s for output\n",tfile);
             fprintf(fout,"error opening %s for output\n",tfile);
             exit(2);
             }
25         }
         if (debug&16) {
           fprintf(fout,"layer %s\n",sl.layer);
           fprintf(fout,"%f\n",sl.x0);          /*    0-------2      */
           fprintf(fout,"%f\n",sl.y0);          /*    |       |      */
30         fprintf(fout,"%f\n",sl.x1);          /*    1-------3      */
           fprintf(fout,"%f\n",sl.y1);
           fprintf(fout,"%f\n",sl.x2);
           fprintf(fout,"%f\n",sl.y2);
           fprintf(fout,"%f\n",sl.x3);
35         fprintf(fout,"%f\n",sl.y3);
           }
         if (etype==BLOCKDEF) {
           dwrite_solid(slout,sl.x0,sl.y0,sl.x1,sl.y1,
                        sl.x2,sl.y2,sl.x3,sl.y3,sl.layer);
40         }
         if (etype==NOBLOCKDEF) {
           if (valid_layer(sl.layer)) {
             scale_solid(&sl);
             if (debug&256) printf("WARNING: Non-Supported Entity
45       (SOLID:%s@(%ld,%ld))\n",
                            sl.layer,(long)sl.x0,(long)sl.y0);
             fprintf(fout,"WARNING: Non-Supported Entity (SOLID:%s@(%ld,%ld))\n",
                            sl.layer,(long)sl.x0,(long)sl.y0);
             /*
50           record_layer(sl.layer);
             */
             }
           }
         fclose(slout);
55       return(0);
         }

/*------------------------------------------------------------------
         ---
60               scale_solid() - apply scale, offset
```

HD-23,619

- 72 -

```
int scale_solid(sl)
solid   *sl;
{
sl->x0*=scale;       sl->x0+=xoffset;
sl->y0*=scale;       sl->y0+=yoffset;
sl->x1*=scale;       sl->x1+=xoffset;
sl->y1*=scale;       sl->y1+=yoffset;
sl->x2*=scale;       sl->x2+=xoffset;
sl->y2*=scale;       sl->y2+=yoffset;
sl->x3*=scale;       sl->x3+=xoffset;
sl->y3*=scale;       sl->y3+=yoffset;
return(0);
}

/*-------------------------------------------------------------------
---
       dwrite_solid() - output dxf solid definition
-------------------------------------------------------------------
-*/ void dwrite_solid(dxf,x0,y0,x1,y1,x2,y2,x3,y3,layer)

/* Autocad solid definition:

x0,y0  --------------- x2,y2
                     |              |
              x1,y1  --------------- x3,y3

If only 3 points are entered (x3,y3) == (x2,y2), form a triangle solid */

FILE    *dxf;
double  x0,y0,
        x1,y1,
        x2,y2,
        x3,y3;
char    *layer;
{
if (debug&64) { strcpy(stemp,"dwrite_solid()"); trace_on(stemp); }
write_dxf(dxf,0,"SOLID");
write_dxf(dxf,8,layer);
write_dxf(dxf,10,&x0);
write_dxf(dxf,20,&y0);
write_dxf(dxf,11,&x1);
write_dxf(dxf,21,&y1);
write_dxf(dxf,12,&x2);
write_dxf(dxf,22,&y2);
write_dxf(dxf,13,&x3);
write_dxf(dxf,23,&y3);
}

/*-------------------------------------------------------------------
---
       insert_solid() - perform insert correction on solid
-------------------------------------------------------------------
-*/
```

HD-23,619

- 73 -

```
        int insert_solid(fout,sldat,bldat,indat,sinr,cosr,etype)
        FILE    *fout;
        solid   sldat;
  5     block   bldat;
        insert  indat;
        double  sinr;
        double  cosr;
        int     etype;
 10     {
        double  tx0,ty0;
        double  rx0,ry0;
        double  rx1,ry1;
        double  rx2,ry2;
 15     double  rx3,ry3;

if (debug&64) { strcpy(stemp,"insert_solid()"); trace_on(stemp); }
        if (debug&16) fprintf(fout,"inserting solid (%s)\n",indat.bname);
        if (!strcmp(bldat.layer,"0")) strcpy(bldat.layer,indat.layer);
 20     if (!strcmp(sldat.layer,"0")) strcpy(sldat.layer,indat.layer);

tx0=indat.insx0-bldat.basex0;   /* normalize insert offset */
        ty0=indat.insy0-bldat.basey0;   /* no rotation (x0=x0+indat.insx0) */
        rx0=indat.xscale*(sldat.x0-bldat.basex0);
 25     ry0=indat.yscale*(sldat.y0-bldat.basey0);
        rx1=indat.xscale*(sldat.x1-bldat.basex0);
        ry1=indat.yscale*(sldat.y1-bldat.basey0);
        rx2=indat.xscale*(sldat.x2-bldat.basex0);
        ry2=indat.yscale*(sldat.y2-bldat.basey0);
 30     rx3=indat.xscale*(sldat.x3-bldat.basex0);
        ry3=indat.yscale*(sldat.y3-bldat.basey0);
        sldat.x0=(rx0*cosr-ry0*sinr+bldat.basex0+tx0);
        sldat.y0=(rx0*sinr+ry0*cosr+bldat.basey0+ty0);
        sldat.x1=(rx1*cosr-ry1*sinr+bldat.basex0+tx0);
 35     sldat.y1=(rx1*sinr+ry1*cosr+bldat.basey0+ty0);
        sldat.x2=(rx2*cosr-ry2*sinr+bldat.basex0+tx0);
        sldat.y2=(rx2*sinr+ry2*cosr+bldat.basey0+ty0);
        sldat.x3=(rx3*cosr-ry3*sinr+bldat.basex0+tx0);
        sldat.y3=(rx3*sinr+ry3*cosr+bldat.basey0+ty0);
 40     write_solid(sldat,fout,etype,bldat);
        return(0);
        }

/*------------------------------------------------------------------
 45     ---
            valid_layer() - check if designated hdi layer
        ------------------------------------------------------------------
        -*/

50     int valid_layer(layer)
        char    *layer;

{
        int i;
 55     char *valid_layers[] = {
          /* laser2 layers */
          "mt0","mt1","mt2","mt3","mt4","mt5","mt6","mt7","mt8","mt9",   /* 10 */
          "dr1","dr2","dr3","dr4","dr5","dr6","dr7","dr8","dr9",         /* 09 */
          "leg","alm",                                                   /* 02 */
 60       /* laser4 layers */
```

HD-23,619

- 74 -

```
         "m0 ","m1 ","m2 ","m3 ","m4 ","m5 ","m6 ","m7 ","m8 ","m9 ",   /* 10 */
         "d1 ","d2 ","d3 ","d4 ","d5 ","d6 ","d7 ","d8 ","d9 ",          /* 09 */
         "adp","ref","fid","mil","vis"                                   /* 05 */
         };
5        int valid_layers_num=45;

if (debug&256) return(1);
         for (i=0;i<valid_layers_num;i++) if (!strcmp(layer,valid_layers[i]))
         return(1);
10       return(0);
         }

/*-------------------------------------------------------------------
         ---
15              valid_point() - check if designated point layer
         -------------------------------------------------------------------
         -*/ int valid_point(layer)
20       char    *layer;

{
         int i;
         char *valid_layers[] = {
25          /* point layers */
            "dr1","dr2","dr3","dr4","dr5","dr6","dr7","dr8","dr9",       /* 09 */
            "alm","fid","mil"                                            /* 03 */
            };
         int valid_layers_num=12;
30
         for (i=0;i<valid_layers_num;i++) if (!strcmp(layer,valid_layers[i]))
         return(1);
         return(0);
```

HD-23,619

- 75 -

APPENDIX B

```
/******************************************************************************
 ***
 *
 *      Program:         tpp2hdi.c
 *
 *      Version:         1.05[D,U]
 *
 *
 *      SCCS Program:    %M%
 *
 *      SCCS Version:    %I% %G% %U%
 *
 *
 *      Author:          Leonard R. Douglas
 *
 *      Date:            3/30/93
 *
 *      Language:        Microsoft C 6.0   (IBM-PC)
 *
 *      Compile/Link:    cl tpp2hdi.c   (IBM-PC)
 *
 *                       gcc -ansi tpp2hdi.c -lm   (SUN1+)
 *
 *
 *      Class:           III General Electric Proprietary Data
 *
 *                       (c) Copyright 1993-94 General Electric Company
 *
 *
 *      Purpose:         TPP (Turn Point Polygon) to HDI format converter
 *
 *
 *      debug values:
 *
 *      --------------
 *
 *
 *      -d64    diagnostic information
 *
 *      -d32    print side list in fill_area_solid()
 *
 *      -d16    trace get_intersection() processing
 *
 *      -d8     force all ortho processing of plines w/ width
 *
 *      -d4     display vertices entering get_intersection()
 *              and return values
 *
 *      -d2     print side list after pline_2_tpp()
 *
```

HD-23,619

- 76 -

```
*    -d1      display entered function
*
*
*
*    Revisions:
*
*    ----------
*
*
*    Version 1.01
*
*
*
*    10/27/94  lrd   Updated comments, documentation
*
*
*
*    10/28/94  lrd   Fixed zero width filter counter
*
*
*    Version 1.02
*
*
*    11/22/94  lrd   Updated Warning messages with location of error
*
*                   Added verbose header output
*
*
*    Version 1.03
*
*
*    12/08/94  lrd   Updated comments, documentation, code organization
*
*
*    Version 1.04
*
*
*
*    12/12/94  lrd   Started code for alternate pline mitre types
*
*
*    12/14/94  lrd   Added check for ATAN2 error condition, improved
*
*                   hourglass mitre output with UP,DOWN,LEFT,RIGHT
*
*                   direction indicators, finished alternate circle,
*
*                   hourglass and wedge mitre types
*
*
*    Version 1.05
*
```

HD-23,619

- 77 -

```
         *
         *
         *    12/14/94  lrd   Changed default mitre to be type WEDGE
         *
  5      *
         *
         *
         *
         *
         ****************************************************************
 10      **/ static char sccsid[]="%W%  %G%";         /* SCCS header */ include <stdio.h>
 15      #include <stdlib.h>
         #include <string.h>
         #include <malloc.h> include "localcpu.h"
 20
         #define TRUE     1
         #define FALSE    0
         #define INFILE   "tpp2hdi.tmp"
         #define TESTFILE "tpptest.tmp"
 25      #define MAX_TP   1024
         #define M_PI     3.14159265358979323846
         #define NON_ORTHO   0
         #define HORIZONTAL  1
         #define VERTICAL    2
 30      #define UP          3
         #define DOWN        4
         #define LEFT        5
         #define RIGHT       6

35      #define TEMP        0         /* array types */
         #define BUFFER      0 define NO_MITRE    0
         #define CIRCLE      1
 40      #define HOURGLASS   2
         #define WEDGE       3 ifdef IBMPC
           #include <math.h>
 45        #include <graph.h>
           #include <float.h>
           #include <conio.h>
           #include <limits.h>
           char basedir[]="\\hdi2\\";       /* base directory prefix */
 50        char os_type='D';
         #endif ifdef SUN
           #define LONG_MAX  2147483647       /* SUN header file MAX!=MIN */
 55        #define LONG_MIN -2147483647
           char basedir[]="/tmp_mnt/home/zeppo/douglas/hdi2/";/* base directory
         prefix */
           char os_type='U';
           extern double fabs(double);
 60        extern double atan2(double,double);
```

HD-23,619

- 78 -

```
         extern double sin(double);
         extern double cos(double);
         extern double ceil(double);
         extern double floor(double);
 5       #endif typedef
         struct tp {              /* turn point polygon structure */
           long  tpx;
10         long  tpy;
         } tpoint;

typedef
         struct pline {           /* pline sides list structure */
15         long  px1;             /* vertex x1,y1 */
           long  py1;
           long  px2;
           long  py2;
           long  delta_xs;        /* delta x start */
20         long  delta_ys;
           long  delta_xe;        /* delta x end */
           long  delta_ye;
           long  s_width;         /* start width */
           long  e_width;         /* end width */
25         double angle;          /* pline angle */
         } plist;

tpoint  tparray[MAX_TP+1];
         tpoint  tparray_buf[MAX_TP+1];  /* shared buffer for tparray */
30       plist   pline[MAX_TP+1];
         long    x_points[MAX_TP+1];     /* vertices sorted in clockwise order */
         long    y_points[MAX_TP+1];
         long    temp_x_points[MAX_TP+1];
         long    temp_y_points[MAX_TP+1];
35
         FILE *test_ptr_in;       /* pointer for file */
         FILE *file_ptr_in;       /* pointer for file */
         FILE *file_ptr_out;      /* pointer for file */
         char tppfile[20];        /* name of circuit files */
40       char stemp_in[80];       /* temporary string */
         char stemp_out[80];      /* temporary string */
         int debug=0;             /* debug on/off */
         int video_mode=0;
         int fracture=1;          /* default: fracture structures */
45       int normalize=1;
         int test_mode=0;
         int bitmap_mode=0;
         int reversed=0;
         int zero_width=0;
50       int point_mode=0;
         int metal_convert_mode=0;
         int round_err=1;

int mitre_type=WEDGE;    /* mitre types, default is WEDGE */
55
         long rect_count=0;
         long tpp_count=0;
         long xoffset=0;
         long yoffset=0;
60       double scale=1.00;
```

HD-23,619

- 79 -

```c
        double  rad01=0.0174532;
        double  rad90=1.5707963;
        double  rad180=3.1415927;
        double  rad270=4.7123890;
        double  rad360=6.2831853;

double  x_minextent=-200;       /* default video settings */
        double  y_minextent=-200;
        double  x_maxextent=51000;
        double  y_maxextent=51000;
        double  x_min=0;
        double  y_min=0;
        double  x_max=50800;
        double  y_max=50800;
        long    last_x1;
        long    last_y1;
        long    last_x2;
        long    top_y2;
        long    grid=3;         /* default 3 micron */ typedef
        struct each_entry {
          long        y_top;
          double      x_int;
          long        delta_y;
          double      x_change_per_scan;
          } list;

list    sides[MAX_TP+1];       /* array of struct, max + 1 */ void main(int, char *[]);
        void get_params(int,char *[]);
        long next_y(long,long);
        long round(double);
        void setup_video();
        long pline_2_tpp(long,long,long);
        long normalize_tp(long);
        int  write_hdi(long,long,long,long);

/*--------------------------------------------------------------------
        ----
                main() - main driver and parser
        --------------------------------------------------------------------
        -*/ void main (argc, argv)

int argc;
        char *argv[];
        {
        long    index;
        long    r_index;                /* reverse index */
        long    tp_num;
        long    plstart,plend;
        long    ptempx0,ptempy0;
        long    prevx,prevy;                    /* previous x,y */
        long    tempx0,tempy0;
        long    tempx1,tempy1;
        int     found_term=0;                   /* will append to existing files */
```

HD-23,619

- 80 -

```
        int     orthog;                     /* orthogonal flag */
        int     ortho_flag=1;               /* orthogonal flag */
        int     prev_ortho_flag=1;          /* orthogonal flag */
        long    next_turn;                  /* location of next tpp */
5       long    t_index;                    /* next turn index */
        long    x_temp;                     /* debug single tpp structure */
        long    y_temp;
        long    count;
        long    actual_tp;
10      int     prev_cont=0;
        int     cont=0;
        long    prev_fillet=0;
        long    fillet=0;
        double  term_angle=0.000;
15      double  prev_last_angle=0.000;
        double  last_angle=0.000;
        long    x_delta=0;
        long    y_delta=0;
        int     direction=0;
20      int     last_direction=0;
        int     prev_last_direction=0;
        int     orientation=0;
        int     last_orientation=0;
        int     prev_last_orientation=0;
25      long    start=0;
        long    prev_start=0;
        long    end=0;
        long    prev_end=0;
        int     same_angle;
30
        get_params(argc, argv);

if (test_mode) {
          if ((test_ptr_in=fopen(TESTFILE,"r"))==NULL) {
35          printf("error opening %s for input\n",TESTFILE);
            exit(2);
          }
          if ((file_ptr_out=fopen(tppfile,"w"))==NULL) {
            printf("error opening %s for output\n",tppfile);
40          exit(2);
          }
          index=0;
          do {
            index++;
45          fscanf(test_ptr_in,"%ld %ld",&x_temp,&y_temp);  /* non standard file */
            if (!feof(test_ptr_in)) {
              x_points[index]=x_temp;
              y_points[index]=y_temp;
            }
50        } while (!feof(test_ptr_in));
          fclose(test_ptr_in);
          count=index-1;
          if (video_mode) {
            calculate_extents(count);
55          setup_video();
          }
          fill_area_solid(count);
          if (video_mode) {
            #ifdef IBMPC
60            getch();
```

HD-23,619

- 81 -

```
            _setvideomode(_DEFAULTMODE);
          #endif
          }
          fclose(file_ptr_out);
 5        exit(0);
          } setup();
        printf ("\n");
10      printf ("TPP to HDI Format Converter  Version 1.05%c\n",os_type);
        printf ("(c) Copyright 1993-94 General Electric Company\n\n");

printf("TPP Filename:    %s\n",tppfile);
        printf("Fracture Size:   %ld\n",grid);
15      printf("Scale Factor:    %1.3f\n",scale);
        printf("X Offset:        %1.3f\n",xoffset);
        printf("Y Offset:        %1.3f\n\n",yoffset);

if ((file_ptr_in=fopen(INFILE,"r"))==NULL) {
20         printf("error opening %s for input\n",INFILE);
           exit(2);
        }
        if ((file_ptr_out=fopen(tppfile,"w"))==NULL) {
           printf("error opening %s for output\n",tppfile);
25         exit(2);
        }

/* main parsing driver */
        do {
30         fscanf(file_ptr_in,"%ld %ld",&plstart,&plend);
           if (!feof(file_ptr_in)) {
              for (index=0;index<MAX_TP+1;index++) {
                 fscanf(file_ptr_in,"%ld %ld",&ptempx0,&ptempy0);
                 if (!feof(file_ptr_in)) {
35                  if (((ptempx0==LONG_MIN)&&(ptempy0==LONG_MIN))||
                        ((ptempx0==LONG_MAX)&&(ptempy0==LONG_MAX))) {
                       cont=prev_cont;
                       if ((ptempx0==LONG_MAX)&&(ptempy0==LONG_MAX)) prev_cont=1;
                       else prev_cont=0;
40                     tpp_count++;
                       break;
                    }
                    else {
                       if (index) {
45                        tparray[index].tpx=(long)(((double)(ptempx0+xoffset))*scale);
                          tparray[index].tpy=(long)(((double)(ptempy0+yoffset))*scale);
                          if (round_err) {    /* snap to round_err */
                             if (fabs((double)(tparray[index].tpx-
        prevx))<=(double)round_err)
50                              tparray[index].tpx=prevx;
                             if (fabs((double)(tparray[index].tpy-
        prevy))<=(double)round_err)
                                tparray[index].tpy=prevy;
                          }
55                        if ((prevx==tparray[index].tpx)&&(prevy==tparray[index].tpy))
                             index--;    /* same vertex */
                          prevx=tparray[index].tpx;
                          prevy=tparray[index].tpy;
                       }
60                     else {
```

HD-23,619

- 82 -

```
                    tparray[index].tpx=(long)(((double)(ptempx0+xoffset))*scale);
                    tparray[index].tpy=(long)(((double)(ptempy0+yoffset))*scale);
                    prevx=tparray[index].tpx;
                    prevy=tparray[index].tpy;
5                 }
                }
              }
            }

10      tp_num=index;
        if (tp_num>MAX_TP) printf("WARNING: MAX Turn Point count exceeded
    (%ld@(%ld,%ld))\n",
                            tp_num,tparray[0].tpx,tparray[0].tpy);

15      plstart=(long)(((double)plstart)*scale);
        plend=(long)(((double)plend)*scale);
        if ((plstart!=plend)&&(!fracture)) {
          printf("WARNING: Starting and ending TPP widths are not equal
    @(%ld,%ld)\n",
20                           tparray[0].tpx,tparray[0].tpy);
          if (plstart>plend) plend=plstart;
          else plstart=plend;
        }

25      /* initialize non-zero width TPP information from previous values */
        if ((plstart!=0)&&(plend!=0)) {
          fillet=prev_fillet;
          prev_fillet=plend/2;
          start=prev_start;
30        end=prev_end;
          prev_start=plstart;
          prev_end=plend;
          last_direction=prev_last_direction;
          last_orientation=prev_last_orientation;
35        ortho_flag=prev_ortho_flag;
          last_angle=prev_last_angle;
          if (tp_num>=2) {
            if (((tparray[tp_num-1].tpy-tparray[tp_num-2].tpy)==0)&&
                ((tparray[tp_num-1].tpx-tparray[tp_num-2].tpx)==0))
40            prev_last_angle=0.0;
            else
              prev_last_angle=atan2((double)(tparray[tp_num-1].tpy-
    tparray[tp_num-2].tpy),
                            (double)(tparray[tp_num-1].tpx-tparray[tp_num-
45  2].tpx));
            if ((tparray[tp_num-1].tpx==tparray[tp_num-2].tpx)||
                (tparray[tp_num-1].tpy==tparray[tp_num-2].tpy)) {
              prev_ortho_flag=1;
              if ((tparray[tp_num-1].tpx==tparray[tp_num-2].tpx)) {
50              prev_last_orientation=VERTICAL;
                if ((tparray[tp_num-1].tpy>tparray[tp_num-2].tpy))
                  prev_last_direction=UP;
                else
                  prev_last_direction=DOWN;
55            }
              else {
                prev_last_orientation=HORIZONTAL;
                if ((tparray[tp_num-1].tpx>tparray[tp_num-2].tpx))
                  prev_last_direction=RIGHT;
60              else
```

HD-23,619

- 83 -

```
                    prev_last_direction=LEFT;
                  }
                }
 5              else {
                  if ((tparray[tp_num-1].tpx!=tparray[tp_num-2].tpx)&&
                      (tparray[tp_num-1].tpy!=tparray[tp_num-2].tpy)) {
                    prev_ortho_flag=0;
                    prev_last_direction=NON_ORTHO;
                  }
10              }
              }
            }
          }

15        if (!feof(file_ptr_in)) {
            /* trap for single turn point entities */
            if (tp_num==1) {
              if (point_mode) {
                if (metal_convert_mode) /* convert points to metal structures */
20                write_hdi(tparray[0].tpx-12,tparray[0].tpy-12,
                            tparray[0].tpx+12,tparray[0].tpy+12);
                else                    /* output points */
                  fprintf(file_ptr_out,"%8ld %8ld\n",tparray[0].tpx,tparray[0].tpy);
              }
25            else {     /* trap pedit single vertex width change */
                if (prev_cont) prev_cont=0;
                /* single vertex TPP also filtered */
                if ((plstart==-1)&&(plend==-1))
                  printf("WARNING: Filtering point definition @(%ld,%ld)\n",
30                        tparray[0].tpx,tparray[0].tpy);
                /*
                else
                  printf("WARNING: Filtering single vertex TPP @(%ld,%ld)\n",
                         tparray[0].tpx,tparray[0].tpy);
35              */
              }
            }

/* process zero-width plines */
40          if ((plstart==0)&&(plend==0)) {
              if (!fracture) {
                if (((tparray[0].tpx!=tparray[1].tpx)&&
                     (tparray[0].tpy!=tparray[1].tpy))||
                    ((tparray[1].tpx!=tparray[2].tpx)&&
45                   (tparray[1].tpy!=tparray[2].tpy))||
                    ((tparray[2].tpx!=tparray[3].tpx)&&
                     (tparray[2].tpy!=tparray[3].tpy))&&
                    (tp_num==4)) {
                  printf("WARNING: 4 vertex TPP not orthogonal @(%ld,%ld)\n",
50                       tparray[0].tpx,tparray[0].tpy);
                }
                else {
                  /*
                  fprintf(file_ptr_out,"%8ld %8ld %8ld %8ld\n",
55                                      tparray[0].tpx,tparray[0].tpy,
                                        tparray[2].tpx,tparray[2].tpy);
                  */
                  write_hdi(tparray[0].tpx,tparray[0].tpy,
                            tparray[2].tpx,tparray[2].tpy);
60              }
```

HD-23,619

- 84 -

```
         }
         if (tp_num==2) {
           printf("WARNING: Filtering 2 vertex 0-width TPP @(%ld,%ld)\n",
                          tparray[0].tpx,tparray[0].tpy);
         }
         if ((fracture)&&(tp_num>2)) {
           copy_array(tp_num,TEMP);
           if ((video_mode)||(bitmap_mode)) {
         #ifdef IBMPC
             calculate_extents(tp_num);
             if (video_mode) setup_video();
             fill_area_solid(tp_num);
             printf("hit any key to continue: ");
             getch();
             if (video_mode) _setvideomode(_DEFAULTMODE);
             else printf("\n");
         #endif
           }
           else fill_area_solid(tp_num);
         }
       } /* end 0-width plines */
       else {     /* process plines w/ width */
         if (cont) {
           if ((tparray[0].tpx==tparray[1].tpx)) {
             orientation=VERTICAL;
             if (tparray[0].tpy<tparray[1].tpy)
               direction=UP;
             else
               direction=DOWN;
           }
           if ((tparray[0].tpy==tparray[1].tpy)) {
             orientation=HORIZONTAL;
             if (tparray[0].tpx<tparray[1].tpx)
               direction=RIGHT;
             else
               direction=LEFT;
           }
           if ((tparray[0].tpx!=tparray[1].tpx)&&
               (tparray[0].tpy!=tparray[1].tpy)) {
             orientation=NON_ORTHO;
             direction=NON_ORTHO;
           }

/* (#1) ortho to ortho transition */
           if ((tparray[0].tpy==tparray[1].tpy)&&
               (tparray[0].tpx!=tparray[1].tpx)&&
               (ortho_flag)&&(last_orientation==VERTICAL)) {    /* horizontal
     */
             if (tparray[0].tpx>tparray[1].tpx)
               tparray[0].tpx+=fillet;             /* going left */
             else
               tparray[0].tpx-=fillet;             /* going right */
           }
           if ((tparray[0].tpy!=tparray[1].tpy)&&
               (tparray[0].tpx==tparray[1].tpx)&&
               (ortho_flag)&&(last_orientation==HORIZONTAL)) {    /* vertical
     */
             if (tparray[0].tpy>tparray[1].tpy)
               tparray[0].tpy+=fillet;             /* going down */
             else
```

HD-23,619

- 85 -

```
                tparray[0].tpy-=fillet;              /* going up */
            }

/* circle mitre inserted between "continued" TPP path */ same_angle=0;
            if (((tparray[1].tpy-tparray[0].tpy)==0)&&
                ((tparray[1].tpx-tparray[0].tpx)==0))
                term_angle=0.0;
            else
                term_angle=atan2((double)(tparray[1].tpy-tparray[0].tpy),
                                (double)(tparray[1].tpx-tparray[0].tpx));
            if (fabs(term_angle-last_angle)<=rad01) same_angle=1;

/* (#2) non-ortho to ortho transition */
            if (((tparray[0].tpy==tparray[1].tpy)||
                (tparray[0].tpx==tparray[1].tpx))&&(!ortho_flag)&&(tp_num>1)) {
                switch(mitre_type) {
                    case NO_MITRE :    break;
                    case CIRCLE   :
        output_circle(fillet,tparray[0].tpx,tparray[0].tpy);
                                       break;
                    case HOURGLASS:
        output_hourglass(fillet,(plstart/2),tparray[0].tpx,tparray[0].tpy,last_angl
        e, term_angle,last_direction,direction);
                                       break;
                    case WEDGE    :
        output_wedge(fillet,(plstart/2),tparray[0].tpx,tparray[0].tpy,last_angle, term_angle,last_direction,direction);
                                       break;
                }
            }

/* (#3) ortho to non-ortho transition */
            if (((tparray[0].tpx!=tparray[1].tpx)&&
                (tparray[0].tpy!=tparray[1].tpy))&&(ortho_flag)&&(tp_num>1)) {
                switch(mitre_type) {
                    case NO_MITRE :    break;
                    case CIRCLE   :
        output_circle(fillet,tparray[0].tpx,tparray[0].tpy);
                                       break;
                    case HOURGLASS:
        output_hourglass(fillet,(plstart/2),tparray[0].tpx,tparray[0].tpy,last_angl
        e, term_angle,last_direction,direction);
                                       break;
                    case WEDGE    :
        output_wedge(fillet,(plstart/2),tparray[0].tpx,tparray[0].tpy,last_angle, term_angle,last_direction,direction);
                                       break;
                }
            }

/* (#4) non-ortho to non-ortho transition */
            if (((tparray[0].tpy!=tparray[1].tpy)&&
```

HD-23,619

- 86 -

```
                (tparray[0].tpx!=tparray[1].tpx))&&(!ortho_flag)) {
            if (((start!=end)||(plstart!=plend))&&(tp_num>1)&&(!same_angle)) {
                switch(mitre_type) {
                    case NO_MITRE :    break;
                    case CIRCLE    :
     output_circle(fillet,tparray[0].tpx,tparray[0].tpy);
                                       break;
                    case HOURGLASS:
     output_hourglass(fillet,(plstart/2),tparray[0].tpx,tparray[0].tpy,last_angle, term_angle,last_direction,direction);
                                       break;
                    case WEDGE     :
     output_wedge(fillet,(plstart/2),tparray[0].tpx,tparray[0].tpy,last_angle, term_angle,last_direction,direction);
                                       break;
                }
            }
            else {
                if (!same_angle) {    /* then mitre joint */
                    if (term_angle<0.0) term_angle+=rad360;
                    x_delta=(long)(fabs(cos(term_angle))*(double)fillet);
                    y_delta=(long)(fabs(sin(term_angle))*(double)fillet);

if ((term_angle>0.0)&&(term_angle<rad90)) {
                        tparray[0].tpx-=x_delta;
                        tparray[0].tpy-=y_delta;
                    }
                    if ((term_angle>rad90)&&(term_angle<rad180)) {
                        tparray[0].tpx+=x_delta;
                        tparray[0].tpy-=y_delta;
                    }
                    if ((term_angle>rad180)&&(term_angle<rad270)) {
                        tparray[0].tpx+=x_delta;
                        tparray[0].tpy+=y_delta;
                    }
                    if ((term_angle>rad270)&&(term_angle<rad360)) {
                        tparray[0].tpx-=x_delta;
                        tparray[0].tpy+=y_delta;
                    }
                }
            }
        } /* end if (cont) */ if (!fracture&&(tp_num>1)) {
            for (index=0;index<tp_num-1;index++) {
                tempx0=tparray[index].tpx;
                tempy0=tparray[index].tpy;
                tempx1=tparray[index+1].tpx;
                tempy1=tparray[index+1].tpy;
                if ((tempx0!=tempx1)&&(tempy0!=tempy1))
                    printf("WARNING: N vertex TPP not orthogonal @(%ld,%ld)\n",
                                tparray[index].tpx,tparray[index].tpy);
                else {
                    if (tempx0==tempx1) {    /* polyline vertical */
                        tempx0=(tempx0-(plstart/2));
```

HD-23,619

- 87 -

```
                        tempx1=(tempx1+(plend/2));
                        }
                     if (tempy0==tempy1) {       /* polyline horizontal */
                        tempy0=(tempy0-(plstart/2));
 5                      tempy1=(tempy1+(plend/2));
                        }
                     /*
                     fprintf(file_ptr_out,"%8ld %8ld %8ld %8ld\n",
                                      tempx0,tempy0,tempx1,tempy1);
10                   */
                     write_hdi(tempx0,tempy0,tempx1,tempy1);
                     }
                  }  /* end for loop */
                } /* end if !fracture */
15              if (fracture&&(tp_num>1)) {
                  orthog=1;       /* assume all orthogonal */
                  for (index=0;index<tp_num-1;index++) {
                    tempx0=tparray[index].tpx;
                    tempy0=tparray[index].tpy;
20                  tempx1=tparray[index+1].tpx;
                    tempy1=tparray[index+1].tpy;
                    if ((tempx0!=tempx1)&&(tempy0!=tempy1)) orthog=0;  /* at angle */
                    /* trapped in data input */
                    if ((tempx0==tempx1)&&(tempy0==tempy1)) orthog=0;  /* same point
25         */
                    }
                  if (debug&8) orthog=0;  /* test */
                  if (plstart!=plend) orthog=0;
                  if (orthog) {   /* all orthogonal */
30                  for (index=0;index<tp_num-1;index++) {
                      tempx0=tparray[index].tpx;
                      tempy0=tparray[index].tpy;
                      tempx1=tparray[index+1].tpx;
                      tempy1=tparray[index+1].tpy;
35                    if (tempx0==tempx1) {        /* polyline vertical */
                        tempx0=(tempx0-(plstart/2));     /* width */
                        tempx1=(tempx1+(plend/2));
                        if (index+1!=tp_num-1) {  /* not last vertex */
                          next_turn=-1;   /* init */
40                        for (t_index=index+2;t_index<=tp_num-1;t_index++) {
                            if (tparray[t_index].tpx!=tempx1-(plstart/2)) {
                              next_turn=t_index;  /* first off axis turn */
                              break;             /* find next tpp turn */
                              }
45                          }
                          if ((tempy1>tempy0)&&(next_turn==index+2))
                            tempy1=(tempy1+(plend/2));       /* grow endcap up */
                          if ((tempy1<tempy0)&&(next_turn==index+2))
                            tempy1=(tempy1-(plend/2));       /* grow endcap down */
50                        }
                        }
                      if (tempy0==tempy1) {       /* polyline horizontal */
                        tempy0=(tempy0-(plstart/2));     /* width */
                        tempy1=(tempy1+(plend/2));
55                      if (index+1!=tp_num-1) {  /* not last vertex */
                          next_turn=-1;   /* init */
                          for (t_index=index+2;t_index<=tp_num-1;t_index++) {
                            if (tparray[t_index].tpy!=tempy1-(plstart/2)) {
                              next_turn=t_index;  /* first off axis turn */
60                            break;             /* find next tpp turn */
```

RD-23,619

- 88 -

```
                       }
                     }
                    if ((tempx1>tempx0)&&(next_turn==index+2))
                      tempx1=(tempx1+(plend/2));          /* grow endcap right */
                    if ((tempx1<tempx0)&&(next_turn==index+2))
                      tempx1=(tempx1-(plend/2));          /* grow endcap left */
                  }
                }
                /*
                fprintf(file_ptr_out,"%8ld %8ld %8ld %8ld\n",
                                    tempx0,tempy0,tempx1,tempy1);
                */
                write_hdi(tempx0,tempy0,tempx1,tempy1);
              }
            } /* end orthog */
            if (!orthog) {  /* not all orthogonal */
              for (index=0;index<tp_num-1;index++) {
                tempx0=tparray[index].tpx;    /* present index position */
                tempy0=tparray[index].tpy;
                tempx1=tparray[index+1].tpx;  /* next index position */
                tempy1=tparray[index+1].tpy;
                x_points[index+1]=tempx0;
                y_points[index+1]=tempy0;
                x_points[index+2]=tempx1;
                y_points[index+2]=tempy1;
              }
              r_index=tp_num+1;       /* reverse index */
              for (index=tp_num-1;index>0;index--) {
                tempx0=tparray[index].tpx;    /* present index position */
                tempy0=tparray[index].tpy;
                tempx1=tparray[index-1].tpx;  /* next index position */
                tempy1=tparray[index-1].tpy;
                x_points[r_index]=tempx0;
                y_points[r_index]=tempy0;
                r_index++;
                x_points[r_index]=tempx1;
                y_points[r_index]=tempy1;
                r_index++;
              }
              copy_array(tp_num,BUFFER);
              actual_tp=pline_2_tpp(plstart,plend,tp_num);
              if ((video_mode)||(bitmap_mode)) {
                #ifdef IBMPC
                  calculate_extents(actual_tp);
                  if (video_mode) setup_video();
                  fill_area_solid(actual_tp);
                  printf("hit any key to continue: ");
                  getch();
                  if (video_mode) _setvideomode(_DEFAULTMODE);
                  else printf("\n");
                #endif
              }
              else fill_area_solid(actual_tp);
            } /* end !orthog */
          }
        }
      }
    } while(!feof(file_ptr_in));
    printf("%ld turn point polygons input\n",tpp_count);
```

HD-23,619

- 89 -

```
        if (debug&64) printf("zero width rectangles purged: %d\n",zero_width);
        printf("%ld rectangles output\n",rect_count);
        if (debug&64) printf("reversed coordinate rectangles fixed:
        %d\n",reversed);
 5      fclose(file_ptr_in);
        fclose(file_ptr_out);
        cleanup();
        }

10      /*------------------------------------------------------------------
        ---
                fill_area_solid() - main driver for raster fill of solid polygon
        ------------------------------------------------------------------
        -*/
15
        int fill_area_solid(count)
        long    count;
        {

20      /* static list    *sides[MAX_TP+1];    */   /* array of pointers, max + 1
        */
        static  long    side_count;             /* number of sides */
        static  long    first_s;                /* first side */
        static  long    last_s;                 /* last side */
25      static  long    scan;
        static  long    bottomscan;             /* bottom y scan value */
        static  long    x_int_count;            /* number x intersections */
                long    i;

30      if (debug&1) printf("fill_area_solid()\n");
        if (debug&64) printf("fracturing polygon [%ld] ...\n",tpp_count);

last_x1=LONG_MIN;
        last_y1=LONG_MIN;
35      last_x2=LONG_MIN;
        top_y2=LONG_MIN;

sort_on_bigger_y(count/*,sides*/,&side_count,&bottomscan);
        if (debug&32) print_sides_list(side_count/*,sides*/);
40      if (debug&32) print_side_coords(count);

/* polygon filled from top to bottom */
        first_s=1; last_s=1;     /* initialize pointers into sorted list */
        for (scan=sides[1].y_top;scan>=bottomscan;scan--) {   /* downto */
45        update_first_last(/*sides,*/side_count,scan,&first_s,&last_s);
          process_x_intersections(/*sides,*/scan,first_s,last_s,&x_int_count);
          if (((scan%grid)==0)||(scan==sides[1].y_top)) { /* top or next rectangle
        */
             if (bitmap_mode)
50               draw_raster(/*sides,*/scan,x_int_count,first_s);
             else
                 draw_rectangle(/*sides,*/scan,x_int_count,first_s);
          }
          update_sides_list(/*sides,*/first_s,last_s);
55      }
        /* flush last rectangle */
        if (((last_x1-last_x2)!=0)&&((bottomscan-top_y2)!=0)) {   /* filter 0 width
        */
          /*
```

HD-23,619

- 90 -

```
  fprintf(file_ptr_out,"%8ld %8ld %8ld
%8ld\n",last_x1,bottomscan,last_x2,top_y2);
  */
  write_hdi(last_x1,bottomscan,last_x2,top_y2);
  }
/* for (i=1;i<=side_count;i++) free(sides[i]);  */
return(0);
}

/*-------------------------------------------------------------------
---
        sort_on_bigger_y() - creates edge table, returns bottomscan
--------------------------------------------------------------------
-*/ int sort_on_bigger_y(n,/*sides,*/side_count,bottomscan)
long    n;
/* list   *sides[];    */
long    *side_count,*bottomscan;
{
long    k,_x1,_y1;

if (debug&1) printf("sort_on_bigger_y()\n");

*side_count=0;              /* initialize */
_y1=y_points[n]; _x1=x_points[n];
*bottomscan=y_points[n];

for (k=1;k<=n;k++) {
  if (_y1!=y_points[k]) {       /* put non-horizontal edges in table */
    *side_count+=1;
    /* pass old point, current point and y of next non horizontal point */ put_in_sides_list(/*sides,*/*side_count,_x1,_y1,x_points[k],y_points[k],nex
t_y(k,n));
    }
  /* else horizontal edge */
    /* draw _x1,_y1 to x_points[k],_y1 with fill */
  if (y_points[k]<*bottomscan) *bottomscan=y_points[k];
  _y1=y_points[k]; _x1=x_points[k];   /* save for next side */
  }
return(0);
}

/*-------------------------------------------------------------------
---
        put_in_sides_list() - add to sides list
--------------------------------------------------------------------
-*/ int put_in_sides_list(/*sides,*/entry,_x1,_y1,_x2,_y2,_next_y)
/*list    *sides[];     */
long    entry,_x1,_y1,_x2,_y2,_next_y;
{
long    maxy;
double  x2_temp,x_change_temp;

if (debug&1) printf("put_in_sides_list()\n");

/* make adjustments for problem vertices */
```

HD-23,619

- 91 -

```
      x_change_temp=((double)(_x2-_x1))/((double)(_y2-_y1));
      x2_temp=(double)_x2;
      if ((_y2>_y1)&&(_y2<_next_y)) {
        _y2-=1;
 5      x2_temp-=x_change_temp;
        }
      else {
        if ((_y2<_y1)&&(_y2>_next_y)) {
          _y2+=1;
10        x2_temp+=x_change_temp;
          }
        }
      if (_y1>_y2) maxy=_y1; else maxy=_y2;
      while((entry>1)&&(maxy>sides[entry-1].y_top)) {
15      sides[entry]=sides[entry-1];
        entry-=1;
        }
      /*
      sides[entry]=(list *) malloc(sizeof(list));
20    if (sides[entry]==NULL) {
        printf("out of memory...\n");
        exit(2);
        }
      */
25    sides[entry].y_top=maxy;
      sides[entry].delta_y=(long)fabs((double)(_y2-_y1))+1;
      if (_y1>_y2) sides[entry].x_int=(double)_x1; else
      sides[entry].x_int=x2_temp;
      sides[entry].x_change_per_scan=x_change_temp;
30    return(0);
      }

/*-----------------------------------------------------------------
35           update_first_last() - update pointers first_s last_s
      -----------------------------------------------------------------
      -*/ int update_first_last(/*sides,*/count,scan,first_s,last_s)
40    /*list  *sides[];      */
      long    count,scan;
      long    *first_s,*last_s;
      {

45    if (debug&1) printf("update_first_last()\n");

while ((sides[*last_s+1].y_top>=scan)&&(*last_s<count))
        *last_s+=1;
      while (sides[*first_s].delta_y==0)
50      *first_s+=1;
      return(0);
      }

/*-----------------------------------------------------------------
55           process_x_intersections() - number of intersection points for scan
      -----------------------------------------------------------------
      -*/

60    int process_x_intersections(/*sides,*/scan,first_s,last_s,x_int_count)
```

HD-23,619

- 92 -

```
    /*list    *sides[];    */
    long    scan,first_s,last_s;
    long    *x_int_count;
    {
5   long    k;

if (debug&1) printf("process_x_intersections()\n");

*x_int_count=0;
10  for (k=first_s;k<=last_s;k++) {
      if (sides[k].delta_y>0) {
        *x_int_count+=1;
        sort_on_x(/*sides,*/k,first_s);
      }
15    else         /* force sort on all 6/30/94 lrd */
        sort_on_x(/*sides,*/k,first_s);
    }
    return(0);
    }
20
    /*-------------------------------------------------------------
    ---
        draw_raster() - pairs intersections and sets pixels, update sides
    -------------------------------------------------------------
25  -*/ int draw_raster(/*sides,*/scan,x_int_count,index)
    /*list    *sides[];    */
    long    scan,x_int_count,index;
30  {
    long    k,x,_x1,_x2;
    long    last_xbit,xstart;
    double  xline_scale;

35  if (debug&1) printf("draw_raster()\n");

xline_scale=80.0/(x_maxextent-x_minextent);
    xstart=x_minextent;
    #ifdef IBMPC
40    last_xbit=(long)DBL_MIN;
    #endif
    #ifdef SUN
      last_xbit=LONG_MIN;
    #endif
45  for (k=1;k<=round(((double)x_int_count)/2.0);k++) {
      while (sides[index].delta_y==0) index+=1;
      _x1=round(sides[index].x_int);
      index+=1;
      while (sides[index].delta_y==0) index+=1;
50    _x2=round(sides[index].x_int);
      if (video_mode)
        for (x=_x1;x<=_x2;x++) {
          #ifdef IBMPC
            _setpixel_w((double)x,(double)scan);
55        #endif
        }
      else {
    /* for (x=new_x1;x<=new_x2;x++) printf("_setpixel_w(%ld,%ld)\n",x,scan);
    */
60      for (x=xstart;x<_x1;x++) {
```

HD-23,619

- 93 -

```
                if (round(((double)x-x_minextent)*xline_scale)!=last_xbit)
        printf("0");
                last_xbit=round(((double)x-x_minextent)*xline_scale);
                }
 5          for (x=_x1;x<=_x2;x++) {
                if (round(((double)x-x_minextent)*xline_scale)!=last_xbit)
        printf("1");
                last_xbit=round(((double)x-x_minextent)*xline_scale);
                }
10          xstart=_x2;
            }
          index+=1;
          }
        if (!video_mode) {       /* flush end of line */
15        for (x=xstart;x<x_maxextent;x++) {
            if (round(((double)x-x_minextent)*xline_scale)!=last_xbit) printf("0");
            last_xbit=round(((double)x-x_minextent)*xline_scale);
            }
          }
20      return(0);
        }

/*---------------------------------------------------------------
           ---
25             draw_rectangle() - convert to HDI rectangle format
        ---------------------------------------------------------------
        -*/ int draw_rectangle(/*sides,*/scan,x_int_count,index)
30      /*list    *sides[];      */
        long    scan,x_int_count,index;
        {
        long    k,x,new_x1,new_x2;

35      if (debug&1) printf("draw_rectangle()\n");

for (k=1;k<=round(((double)x_int_count)/2.0);k++) { while (sides[index].delta_y==0) index+=1;
40          new_x1=round(sides[index].x_int);
            index+=1;
            while (sides[index].delta_y==0) index+=1;
            new_x2=round(sides[index].x_int);
            if (video_mode)
45            for (x=new_x1;x<=new_x2;x++) {
                #ifdef IBMPC
                  _setpixel_w((double)x,(double)scan);
                #endif
                }
50       /* for (x=new_x1;x<=new_x2;x++) printf("_setpixel_w(%ld,%ld)\n",x,scan);
         */
            else {
              if ((new_x1==last_x1)&&(new_x2==last_x2)) {
                last_x1=new_x1;
55              last_x2=new_x2;
                last_y1=scan;
                }
              else {
                if ((last_x1!=LONG_MIN)&&(last_x2!=LONG_MIN)&&    /* filter 0 width
60       */
```

HD-23,619

- 94 -

```
            ((last_x1-last_x2)!=0)&&(((last_y1-grid)-top_y2)!=0)) {
         /*
            fprintf(file_ptr_out,"%8ld %8ld %8ld %8ld\n",last_x1,last_y1-grid,last_x2,top_y2);
         */
            write_hdi(last_x1,last_y1-grid,last_x2,top_y2);
            }
            last_x1=new_x1; last_x2=new_x2;
            last_y1=scan;   top_y2=scan;
            }
      }
    index+=1;
    }
 return(0);
 }

/*-------------------------------------------------------------------------
        update_sides_list() - processing to ready for next scan line
-------------------------------------------------------------------------*/ int update_sides_list(/*sides,*/first_s,last_s)
/*list   *sides[];      */
long    first_s,last_s;
{
long    k;

if (debug&1) printf("update_sides_list()\n");

for (k=first_s;k<=last_s;k++)
  if (sides[k].delta_y>0) {
    /* determine next x_int, decrease delta_y */
    sides[k].delta_y-=1;
    sides[k].x_int-=sides[k].x_change_per_scan;
    }
return(0);
}

/*-------------------------------------------------------------------------
        sort_on_x() - sort on x scan value
-------------------------------------------------------------------------*/ int sort_on_x(/*sides,*/entry,first_s)
/*list   *sides[];      */
long    entry,first_s;
{ if (debug&1) printf("sort_on_x()\n");

while ((entry>first_s)&&(sides[entry].x_int<sides[entry-1].x_int)) {
  swap(/*sides,*/entry,entry-1);
  entry-=1;
  }
return(0);
}
```

```
/*-------------------------------------------------------------
        swap() - swap entry in sides list
---------------------------------------------------------------
-*/ int swap(/*sides,*/index1,index2)
/*list    *sides[];      */
long     index1,index2;
/* swap 2 sides structures */
{
/*list    *temp_ptr;     */
list     temp_side;

if (debug&1) printf("swap()\n");

temp_side=sides[index1];
sides[index1]=sides[index2];
sides[index2]=temp_side;
}

/*-------------------------------------------------------------
        next_y() - return next different vertex
---------------------------------------------------------------
-*/ long next_y(k,num)
long     k;       /* array index */
long     num;     /* number of vertices */
{
long     ltemp=y_points[k];
long     i=k;
long     j;

if (debug&1) printf("next_y()\n");

/* returns y value of the next vertex whose y coordinate is != y_points[k]
*/
for (;;) {
  i++;
  if (i>num) j=i-((i/num)*num);           /* wrap around */
  else j=i;
  if (y_points[j]!=ltemp) return(y_points[j]);
  if (i>MAX_TP+1) return(0);
  }
}

/*-------------------------------------------------------------
        round() - round off function
---------------------------------------------------------------
-*/ long round(r)
double   r;
{
double   i,j;
long sign;
```

HD-23,619

- 96 -

```
            if (r>=0.0) sign=1; else sign=-1;      /* preserve sign */
            r=fabs(r);
            i=floor(r);
            j=(r-i);
 5          if (j>=0.5) return(sign*(long)ceil(r));
            else return(sign*(long)floor(r));     /* (j<0.5) */
            }

/*-------------------------------------------------------------------
10          ---
                    print_sides_list() - entire structure
            ------------------------------------------------------------------
            -*/

15          print_sides_list(count/*,sides*/)
            long    count;
            /*list   *sides[];     */
            {
            long    i;
20
            if (debug&1) printf("print_sides_list()\n");

for(i=1;i<=count;i++)
              printf("side%ld: y_top,x_int,delta_y,x_change_per_scan\n:
25          %ld,%.2f,%ld,%.2f\n",
                            i,sides[i].y_top,sides[i].x_int,
                            sides[i].delta_y,sides[i].x_change_per_scan);
            }

30          /*-------------------------------------------------------------------
            ---
                    print_side_coords() - print vertex point info
            ------------------------------------------------------------------
            -*/
35
            print_side_coords(num)
            long    num;
            {
            long    i;
40
            if (debug&1) printf("print_side_coords()\n");

for (i=1;i<=num;i++)
              printf("coord x_points[%ld],y_points[%ld]:
45          %ld,%ld\n",i,i,x_points[i],y_points[i]);
            }

/*-------------------------------------------------------------------
            ---
50                  setup_video() - color and video modes
            ------------------------------------------------------------------
            -*/ void setup_video()
55          { if (debug&1) printf("setup_video()\n");

ifdef IBMPC
60            if (_setvideomode(_VRES16COLOR) == 0)
```

HD-23,619

- 97 -

```
      exit(0);
      _clearscreen(_GCLEARSCREEN);
      _setwindow(TRUE,x_minextent,y_minextent,x_maxextent,y_maxextent);
      _remappalette(1,_RED);
 5    _remappalette(2,_BLUE);
      _remappalette(3,_GREEN);
      _remappalette(4,_BLACK);
      _remappalette(5,_WHITE);
      _setcolor(3);
10    /*
      _moveto_w(x_min,y_min);
      _lineto_w(x_max,y_min);
      _lineto_w(x_max,y_max);
      _lineto_w(x_min,y_max);
15    _lineto_w(x_min,y_min);
      */
    #endif
    }

20  /*------------------------------------------------------------
    ---
            calculate_extents() - calculate extents for clipping
    ---------------------------------------------------------------
    -*/
25
    int calculate_extents(count)
    long   count;
    {
    long   i;
30  long local_x_min=LONG_MAX;      /* initialize */
    long local_y_min=LONG_MAX;
    long local_x_max=LONG_MIN;
    long local_y_max=LONG_MIN;

35  for (i=1;i<=count;i++) {
      if (x_points[i]<local_x_min) local_x_min=x_points[i];
      if (x_points[i]>local_x_max) local_x_max=x_points[i];
      if (y_points[i]<local_y_min) local_y_min=y_points[i];
      if (y_points[i]>local_y_max) local_y_max=y_points[i];
40    } x_minextent=(double) (local_x_min-20);
    y_minextent=(double) (local_y_min-20);
    x_maxextent=(double) (local_x_max+20);
45  y_maxextent=(double) (local_y_max+20);
    x_min=(double) local_x_min;
    y_min=(double) local_y_min;
    x_max=(double) local_x_max;
    y_max=(double) local_y_max;
50  return(0);
    }

/*------------------------------------------------------------
    ---
55          copy_array() - copy from temp array
    ---------------------------------------------------------------
    -*/ int copy_array(size,array_type)
60  long   size;           /* array size */
```

HD-23,619

- 98 -

```
        int     array_type;
        {
        long    i,j;

5       if (debug&1) printf("copy_array()\n");

if (array_type==TEMP) {
          for (i=0;i<size;i++) {
            x_points[i+1]=tparray[i].tpx;
10          y_points[i+1]=tparray[i].tpy;
            }
          }
        if (array_type==BUFFER) {
          for (i=0;i<size;i++) {
15          tparray_buf[i].tpx=tparray[i].tpx;
            tparray_buf[i].tpy=tparray[i].tpy;
            }
          }
        }
20
        /*-------------------------------------------------------------------
        ---
                pline_2_tpp() - convert plines to tpp structure
        --------------------------------------------------------------------
25      -*/ long pline_2_tpp(s_width,e_width,vertex_num)
        long    s_width,e_width,vertex_num;
        {
30      long    i,j;
        long    count=0;

if (debug&1) printf("pline_2_tpp()\n");

35      /* transfer list */
        for (i=0;i<vertex_num-1;i++) {
            /* adjust after single vertex to vertex taper */
            if ((i==1)&&(s_width!=e_width)) s_width=e_width;
            pline[i].px1=tparray_buf[i].tpx;
40          pline[i].py1=tparray_buf[i].tpy;
            pline[i].px2=tparray_buf[i+1].tpx;
            pline[i].py2=tparray_buf[i+1].tpy;
            pline[i].s_width=s_width;
            pline[i].e_width=e_width;
45          }
        for (i=0;i<vertex_num-1;i++) {
                                  /* 2 orthogonal segments */
            if ((pline[i].px2==pline[i].px1)||(pline[i].py2==pline[i].py1)) {
              pline[i].angle=0.000;       /* radians */
50            if (pline[i].px2==pline[i].px1) {
                pline[i].delta_xs=pline[i].s_width/2.0;
                pline[i].delta_xe=pline[i].e_width/2.0;
                pline[i].delta_ys=0;
                pline[i].delta_ye=0;
55              }
              else {
                pline[i].delta_xs=0;
                pline[i].delta_xe=0;
                pline[i].delta_ys=pline[i].s_width/2.0;
60              pline[i].delta_ye=pline[i].e_width/2.0;
```

HD-23,619

- 99 -

```
      }
    }                       /* 2 non-orthogonal segments */
    if ((pline[i].px2!=pline[i].px1)&&(pline[i].py2!=pline[i].py1)) {
      pline[i].angle=(atan2((double)(pline[i].py2-pline[i].py1),
                     (double)(pline[i].px2-pline[i].px1)));
      if (pline[i].angle<0.0) pline[i].angle+=rad360;
      pline[i].delta_xs=(long)(fabs(cos(rad90-
pline[i].angle))*((double)pline[i].s_width/2.0));
      pline[i].delta_xe=(long)(fabs(cos(rad90-
pline[i].angle))*((double)pline[i].e_width/2.0));
      pline[i].delta_ys=(long)(fabs(sin(rad90-
pline[i].angle))*((double)pline[i].s_width/2.0));
      pline[i].delta_ye=(long)(fabs(sin(rad90-
pline[i].angle))*((double)pline[i].e_width/2.0));
    }
  }
  j=1;
  for (i=0;i<vertex_num-1;i++) {
    if (pline[i].angle==0.0) {                  /* right angle */
                        /* (right to left) or (bottom to top) */
      if ((pline[i].px1>pline[i].px2)||(pline[i].py1<pline[i].py2)) {
        x_points[j]=pline[i].px1-pline[i].delta_xs;
        y_points[j]=pline[i].py1-pline[i].delta_ys;
        count++;
        x_points[j+1]=pline[i].px2-pline[i].delta_xe;
        y_points[j+1]=pline[i].py2-pline[i].delta_ye;
        count++;
      }
      else {            /* (left to right) or (top to bottom) */
        x_points[j]=pline[i].px1+pline[i].delta_xs;
        y_points[j]=pline[i].py1+pline[i].delta_ys;
        count++;
        x_points[j+1]=pline[i].px2+pline[i].delta_xe;
        y_points[j+1]=pline[i].py2+pline[i].delta_ye;
        count++;
      }
    }
    else {
      if ((pline[i].angle>0.0)&&(pline[i].angle<rad90)) { /* quad I */
        x_points[j]=pline[i].px1-pline[i].delta_xs;
        y_points[j]=pline[i].py1+pline[i].delta_ys;
        count++;
        x_points[j+1]=pline[i].px2-pline[i].delta_xe;
        y_points[j+1]=pline[i].py2+pline[i].delta_ye;
        count++;
      }
      if ((pline[i].angle>rad90)&&(pline[i].angle<rad180)) { /* quad II */
        x_points[j]=pline[i].px1-pline[i].delta_xs;
        y_points[j]=pline[i].py1-pline[i].delta_ys;
        count++;
        x_points[j+1]=pline[i].px2-pline[i].delta_xe;
        y_points[j+1]=pline[i].py2-pline[i].delta_ye;
        count++;
      }
      if ((pline[i].angle>rad180)&&(pline[i].angle<rad270)) { /* quad III */
        x_points[j]=pline[i].px1+pline[i].delta_xs;
        y_points[j]=pline[i].py1-pline[i].delta_ys;
        count++;
        x_points[j+1]=pline[i].px2+pline[i].delta_xe;
        y_points[j+1]=pline[i].py2-pline[i].delta_ye;
```

- 100 -

```
            count++;
            }
        if ((pline[i].angle>rad270)&&(pline[i].angle<rad360)) { /* quad IV */
            x_points[j]=pline[i].px1+pline[i].delta_xs;
            y_points[j]=pline[i].py1+pline[i].delta_ys;
            count++;
            x_points[j+1]=pline[i].px2+pline[i].delta_xe;
            y_points[j+1]=pline[i].py2+pline[i].delta_ye;
            count++;
            }
        }
    j+=2;
    }
for (i=vertex_num-2;i>=0;i--) {
    if (pline[i].angle==0.0) {              /* right angle */
                        /* (right to left) or (bottom to top) */
        if ((pline[i].px1>pline[i].px2)||(pline[i].py1<pline[i].py2)) {
            x_points[j]=pline[i].px2+pline[i].delta_xe;
            y_points[j]=pline[i].py2+pline[i].delta_ye;
            count++;
            x_points[j+1]=pline[i].px1+pline[i].delta_xs;
            y_points[j+1]=pline[i].py1+pline[i].delta_ys;
            count++;
            }
        else {                  /* (left to right) or (top to bottom) */
            x_points[j]=pline[i].px2-pline[i].delta_xe;
            y_points[j]=pline[i].py2-pline[i].delta_ye;
            count++;
            x_points[j+1]=pline[i].px1-pline[i].delta_xs;
            y_points[j+1]=pline[i].py1-pline[i].delta_ys;
            count++;
            }
        }
    else {
        if ((pline[i].angle>0.0)&&(pline[i].angle<rad90)) { /* quad I */
            x_points[j]=pline[i].px2+pline[i].delta_xe;
            y_points[j]=pline[i].py2-pline[i].delta_ye;
            count++;
            x_points[j+1]=pline[i].px1+pline[i].delta_xs;
            y_points[j+1]=pline[i].py1-pline[i].delta_ys;
            count++;
            }
        if ((pline[i].angle>rad90)&&(pline[i].angle<rad180)) { /* quad II */
            x_points[j]=pline[i].px2+pline[i].delta_xe;
            y_points[j]=pline[i].py2+pline[i].delta_ye;
            count++;
            x_points[j+1]=pline[i].px1+pline[i].delta_xs;
            y_points[j+1]=pline[i].py1+pline[i].delta_ys;
            count++;
            }
        if ((pline[i].angle>rad180)&&(pline[i].angle<rad270)) { /* quad III */
            x_points[j]=pline[i].px2-pline[i].delta_xe;
            y_points[j]=pline[i].py2+pline[i].delta_ye;
            count++;
            x_points[j+1]=pline[i].px1-pline[i].delta_xs;
            y_points[j+1]=pline[i].py1+pline[i].delta_ys;
            count++;
            }
        if ((pline[i].angle>rad270)&&(pline[i].angle<rad360)) { /* quad IV */
            x_points[j]=pline[i].px2-pline[i].delta_xe;
```

HD-23,619

- 101 -

```
                y_points[j]=pline[i].py2-pline[i].delta_ye;
                count++;
                x_points[j+1]=pline[i].px1-pline[i].delta_xs;
                y_points[j+1]=pline[i].py1-pline[i].delta_ys;
                count++;
            }
         }
       j+=2;
       }
    if (debug&2) print_pline(vertex_num-1);     /* side list */
    if ((count>4)&&(normalize))
       count=normalize_tp(count);
    return(count);   /* actual number of turn points */
    }

/*-------------------------------------------------------------------
    ---
            print_pline() - print pline structure
    ------------------------------------------------------------------
    -*/ print_pline(side_num)
    long     side_num;
    {
    long     i;

if (debug&1) printf("print_pline()\n");

for (i=0;i<side_num;i++)
       printf("pline[%ld]: %ld %ld %ld %ld %ld %ld %ld %ld %ld %ld %.2f\n",i,
               pline[i].px1,pline[i].py1,pline[i].px2,pline[i].py2, pline[i].delta_xs,pline[i].delta_ys,pline[i].delta_xe,pline[i].delta_ye,
               pline[i].s_width,pline[i].e_width,pline[i].angle);
    }

/*-------------------------------------------------------------------
    ---
            get_intersection() - calculate intersection of 2 lines
    ------------------------------------------------------------------
    -*/ int get_intersection(int_xpoint,int_ypoint,index1a,index2a,index1b,index2b)
    long     *int_xpoint,*int_ypoint;
    long     index1a,index2a;
    long     index1b,index2b;
    {
    double   ma,mb;             /* slope */
    double   inta,intb;         /* y-intercept */
    double   ys,xs;             /* solution */
    long     ya,xa;             /* line a */
    long     yb,xb;             /* line b */ if (debug&1) printf("get_intersection()\n");
    if (debug&4) {
       printf("get_intersection()\n");
       printf("%ld %ld %ld %ld\n",x_points[index1a],y_points[index1a],
                                   x_points[index2a],y_points[index2a]);
       printf("%ld %ld %ld %ld\n",x_points[index1b],y_points[index1b],
                                   x_points[index2b],y_points[index2b]);
```

HD-23,619

- 102 -

```
              }
                              /* 2 almost orthogonal segments */
              if ((fabs((double)(x_points[index2a]-x_points[index1b]))<4)&& /* within 4
   5          microns */
                  (fabs((double)(y_points[index2a]-y_points[index1b]))<4)) {
                  if (debug&16) printf("2 segments x[2a]~=x[1b] or y[2a]~=y[1b],\n");
                              /* average intersection */
                  xs=((double)x_points[index1b]+(double)x_points[index2a])/2.0;
  10              ys=((double)y_points[index1b]+(double)y_points[index2a])/2.0;
                  *int_xpoint=(long)xs;
                  *int_ypoint=(long)ys;
                  if (debug&4) printf("return(1): (%ld,%ld)\n",(long)xs,(long)ys);
                  return(1);
  15          }
                              /* 2 non-orthogonal segments */
              if (((x_points[index2a]-x_points[index1a])!=0)&&
                  ((x_points[index2b]-x_points[index1b])!=0)&&
                  ((y_points[index2a]-y_points[index1a])!=0)&&
  20              ((y_points[index2b]-y_points[index1b])!=0)) {
                  if (debug&16) printf("2 segments xy[1a]!=x[2a], xy[1b]!=y[2b],\n");
                              /* slope */
                  ma=((double)(y_points[index2a]-y_points[index1a])/
                      (double)(x_points[index2a]-x_points[index1a]));
  25              mb=((double)(y_points[index2b]-y_points[index1b])/
                      (double)(x_points[index2b]-x_points[index1b]));

xa=x_points[index1a];          /* set to 1 point */
                  ya=y_points[index1a];
  30
                  xb=x_points[index1b];          /* set to 1 point */
                  yb=y_points[index1b];

inta=(double)ya-(ma*(double)xa);         /* calculate y-intercept */
  35              intb=(double)yb-(mb*(double)xb);
                  xa=1; ya=1; xb=1; yb=1;                  /* init */

/* ya=ma*xa+inta   yb=mb*xb+intb         line equations */

40              if (debug&4) printf("ma,inta,mb,intb: %f %f %f %f\n",ma,inta,mb,intb);

ys=((-mb*inta)+(ma*intb))/
                      ((-mb*(double)ya)+(ma*(double)yb));   /* solve for x,y */
                  xs=((ys-inta)/ma);
  45
                  *int_xpoint=(long)xs;
                  *int_ypoint=(long)ys;
                  if (debug&4) printf("return(2): (%ld,%ld)\n",(long)xs,(long)ys);
                  return(1);
  50          }
                              /* 2 segments x=n */
              if (((x_points[index2a]-x_points[index1a])==0)&&
                  ((x_points[index2b]-x_points[index1b])==0)&&
                  ((y_points[index2a]-y_points[index1a])!=0)&&
  55              ((y_points[index2b]-y_points[index1b])!=0)) {
                  if (debug&16) printf("2 segments x[1a]=x[2a]\n");
                  mb=((double)(y_points[index2b]-y_points[index1b])/
                      (double)(x_points[index2b]-x_points[index1b]));
                  xb=x_points[index2b];          /* set to 1 point */
  60              yb=y_points[index2b];
```

RD-23,619

- 103 -

```
             intb=(double)yb-(mb*(double)xb);
             if (debug&4) printf("mb,intb: %f %f\n",mb,intb);
             xs=(double)x_points[index2a];
             ys=(mb*xs+intb);
 5           *int_xpoint=(long)xs;
             *int_ypoint=(long)ys;
             if (debug&4) printf("return(3): (%ld,%ld)\n",(long)xs,(long)ys);
             return(1);
             }
10                              /* 2 segments x=n */
             if (((x_points[index2b]-x_points[index1b])==0)&&
                ((x_points[index2a]-x_points[index1a])!=0)&&
                ((y_points[index2a]-y_points[index1a])!=0)&&
                ((y_points[index2b]-y_points[index1b])!=0)) {
15              if (debug&16) printf("2 segments x[1b]=x[2b]\n");
             ma=((double)(y_points[index2a]-y_points[index1a])/
                 (double)(x_points[index2a]-x_points[index1a]));
             xa=x_points[index2a];        /* set to 1 point */
             ya=y_points[index2a];
20           inta=(double)ya-(ma*(double)xa);
             if (debug&4) printf("ma,inta: %f %f\n",ma,inta);
             xs=(double)x_points[index2b];
             ys=(ma*xs+inta);
             *int_xpoint=(long)xs;
25           *int_ypoint=(long)ys;
             if (debug&4) printf("return(4): (%ld,%ld)\n",(long)xs,(long)ys);
             return(1);
             }
                                /* 2 segments y=n */
30           if (((y_points[index2a]-y_points[index1a])==0)&&
                ((y_points[index2b]-y_points[index1b])!=0)&&
                ((x_points[index2b]-x_points[index1b])!=0)&&
                ((x_points[index2a]-x_points[index1a])!=0)) {
             if (debug&16) printf("2 segments y[1a]=y[2a]\n");
35           mb=((double)(y_points[index2b]-y_points[index1b])/
                 (double)(x_points[index2b]-x_points[index1b]));
             xb=x_points[index2b];        /* set to 1 point */
             yb=y_points[index2b];
             intb=(double)yb-(mb*(double)xb);
40           if (debug&4) printf("mb,intb: %f %f\n",mb,intb);
             ys=(double)y_points[index2a];
             xs=((ys-intb)/mb);
             *int_xpoint=(long)xs;
             *int_ypoint=(long)ys;
45           if (debug&4) printf("return(5): (%ld,%ld)\n",(long)xs,(long)ys);
             return(1);
             }
                                /* 2 segments y=n */
             if (((y_points[index2b]-y_points[index1b])==0)&&
50              ((y_points[index2a]-y_points[index1a])!=0)&&
                ((x_points[index2b]-x_points[index1b])!=0)&&
                ((x_points[index2a]-x_points[index1a])!=0)) {
             if (debug&16) printf("2 segments y[1b]=y[2b]\n");
             ma=((double)(y_points[index2a]-y_points[index1a])/
55               (double)(x_points[index2a]-x_points[index1a]));
             xa=x_points[index2a];        /* set to 1 point */
             ya=y_points[index2a];
             inta=(double)ya-(ma*(double)xa);
             if (debug&4) printf("ma,inta: %f %f\n",ma,inta);
60           ys=(double)y_points[index2b];
```

HD-23,619

- 104 -

```
xs=((ys-inta)/ma);
*int_xpoint=(long)xs;
*int_ypoint=(long)ys;
if (debug&4) printf("return(6): (%ld,%ld)\n",(long)xs,(long)ys);
return(1);
}
                    /* 2 segments @ right angle */
if (((x_points[index2a]-x_points[index1a])==0)&&
    ((x_points[index2b]-x_points[index1b])!=0)&&
    ((y_points[index2a]-y_points[index1a])!=0)&&
    ((y_points[index2b]-y_points[index1b])==0)) {
   if (debug&16) printf("2 segments x[1a]=x[2a], y[1b]=y[2b],\n");
   xs=(double)x_points[index2a];
   ys=(double)y_points[index2b];
   *int_xpoint=(long)xs;
   *int_ypoint=(long)ys;
   if (debug&4) printf("return(7): (%ld,%ld)\n",(long)xs,(long)ys);
   return(1);
}
                    /* 2 segments @ right angle */
if (((x_points[index2a]-x_points[index1a])!=0)&&
    ((x_points[index2b]-x_points[index1b])==0)&&
    ((y_points[index2a]-y_points[index1a])==0)&&
    ((y_points[index2b]-y_points[index1b])!=0)) {
   if (debug&16) printf("2 segments x[1b]=x[2b], y[1a]=y[2a],\n");
   xs=(double)x_points[index2b];
   ys=(double)y_points[index2a];
   *int_xpoint=(long)xs;
   *int_ypoint=(long)ys;
   if (debug&4) printf("return(8): (%ld,%ld)\n",(long)xs,(long)ys);
   return(1);
}
return(0);
}

/*---------------------------------------------------------------
         normalize_tp() - smooth pline turns and reduce vertices
-----------------------------------------------------------------
-*/ long normalize_tp(count)
long    count;
{
long    i,j;
long    new_count=0;
long    tempx,tempy;

if (debug&1) printf("normalize_tp()\n");

j=1;                              /* init start of normalized array */
for (i=1;i<(count/2)-1;i+=2) {    /* first side */
   if (get_intersection(&tempx,&tempy,i,i+1,i+2,i+3)) {
      if (i==1) {
         temp_x_points[j]=x_points[i];
         temp_y_points[j]=y_points[i];
         new_count++;
         temp_x_points[j+1]=tempx;
         temp_y_points[j+1]=tempy;
         new_count++;
```

HU-23,619

- 105 -

```
            j+=2;              /* reduce by 1 */
            }
          else {
            temp_x_points[j]=tempx;
            temp_y_points[j]=tempy;
            new_count++;
            j+=1;              /* reduce by 1 */
            }
          }
        else {
          temp_x_points[j]=x_points[i];
          temp_y_points[j]=y_points[i];
          new_count++;
          temp_x_points[j+1]=x_points[i+1];
          temp_y_points[j+1]=y_points[i+1];
          new_count++;
          j+=2;
          }
        }
      temp_x_points[j]=x_points[i+1];   /* end */
      temp_y_points[j]=y_points[i+1];
      new_count++;
      j+=1;
      for (i=count/2+1;i<(count-1);i+=2) {      /* other side */
        if (get_intersection(&tempx,&tempy,i,i+1,i+2,i+3)) {
          if (i==count/2+1) {
            temp_x_points[j]=x_points[i];
            temp_y_points[j]=y_points[i];
            new_count++;
            temp_x_points[j+1]=tempx;
            temp_y_points[j+1]=tempy;
            new_count++;
            j+=2;              /* reduce by 1 */
            }
          else {
            temp_x_points[j]=tempx;
            temp_y_points[j]=tempy;
            new_count++;
            j+=1;              /* reduce by 1 */
            }
          }
        else {
          temp_x_points[j]=x_points[i];
          temp_y_points[j]=y_points[i];
          new_count++;
          temp_x_points[j+1]=x_points[i+1];
          temp_y_points[j+1]=y_points[i+1];
          new_count++;
          j+=2;
          }
        }
      temp_x_points[j]=x_points[i+1];   /* end */
      temp_y_points[j]=y_points[i+1];
      new_count++;
      j+=1;
      for (i=1;i<=new_count;i++) {             /* transfer back to main list */
        x_points[i]=temp_x_points[i];
        y_points[i]=temp_y_points[i];
        if (debug&4) printf("temp_x_points[%ld],temp_y_points[%ld]: %ld %ld\n",
                    i,i,x_points[i],y_points[i]);
```

HD-23,619

- 106 -

```
            }
            return(new_count);
            }

/*-------------------------------------------------------------------
            ---
                    setup() - setup tmp files for input
            -------------------------------------------------------------
            -*/ setup()
            {
            char    stemp[80];
            FILE    *temp_ptr;

if ((temp_ptr=fopen(INFILE,"r"))!=NULL) {
              fclose(temp_ptr);
              printf("\ndeleting tpp2hdi.tmp file ...\n");
              if (os_type=='D')
                sprintf(stemp,"del tpp2hdi.tmp");
              if (os_type=='U')
                sprintf(stemp,"rm tpp2hdi.tmp");
              system(stemp);
            }
            if (os_type=='D')
              sprintf(stemp,"rename %s tpp2hdi.tmp",tppfile);
            if (os_type=='U')
              sprintf(stemp,"mv %s tpp2hdi.tmp",tppfile);
            system(stemp);
            }

/*-------------------------------------------------------------------
            ---
                    cleanup() - purge tmp files
            -------------------------------------------------------------
            -*/ cleanup()
            {
            char    stemp[80];

if (os_type=='D')
              sprintf(stemp,"del tpp2hdi.tmp");
            if (os_type=='U')
              sprintf(stemp,"rm tpp2hdi.tmp");
            system(stemp);
            }

/*-------------------------------------------------------------------
            ---
                    get_params() - parse command line arguments
            -------------------------------------------------------------
            -*/ void get_params(argc,argv)
              int   argc;
              char  *argv[];
            {
            int    i;
            int    level;
```

HD-23,619

- 107 -

```
      if (argc<2) {
        printf ("\n");
        printf ("TPP to HDI Format Converter  Version 1.05%c\n",os_type);
5       printf (" (c) Copyright 1993-94 General Electric Company\n\n");
        printf("Correct usage: tpp2hdi [filename] [options]\n\n");
        printf("Options:\n");
        printf(" -g[n]   n=step size for fractured structures (n=3,6,9,12
   etc)\n");
10      printf(" -s[n]   n=scale factor\n");
        printf(" -x[n]   n=x offset\n");
        printf(" -y[n]   n=y offset\n\n");
        printf("Default: step size=3, scale factor=1, x offset=0, y offset=0\n");
        exit(1);
15    }
   sprintf(tppfile,"%s",argv[1]);
   for (i=2;i<argc;i++) {
     if (argv[i][0]=='-') {
       switch (argv[i][1]) {
20       case 'a': case 'A':
           break;
         case 'b': case 'B':
           bitmap_mode=1;
           if (debug&1) printf("bitmap mode enabled\n");
25         break;
         case 'c': case 'C':
           mitre_type=CIRCLE;
           if (debug&1) printf("output circle mitre\n");
           break;
30       case 'd': case 'D':
           debug=atoi(&argv[i][2]);     /* at address [i][2] */
           if (debug&1) printf("debug = %d\n",debug);
           break;
         case 'f': case 'F':
35         fracture=0;
           if (debug&1) printf("fracture mode disabled\n");
           break;
         case 'g': case 'G':
           grid=atol(&argv[i][2]);      /* at address [i][2] */
40         if (debug&1) printf("grid size = %ld\n",grid);
           break;
         case 'h': case 'H':
           mitre_type=HOURGLASS;
           if (debug&1) printf("output hourglass mitre\n");
45         break;
         case 'm': case 'M':
           metal_convert_mode=1;
           if (debug&1) printf("metal convert mode enabled\n");
           break;
50       case 'n': case 'N':
           normalize=0;
           if (debug&1) printf("normalize mode disabled\n");
           break;
         case 'p': case 'P':
55         point_mode=1;
           if (debug&1) printf("point mode enabled\n");
           break;
         case 'r': case 'R':
           round_err=atoi(&argv[i][2]); /* at address [i][2] */
60         if (debug&1) printf("round off error = %d\n",round_err);
```

RD-23,619

- 108 -

```
        break;
    case 's': case 'S':
        scale=atof(&argv[i][2]);      /* at address [i][2] */
        if (debug&1) printf("scale = %1.2f\n",scale);
        break;
    case 't': case 'T':
        test_mode=1;
        if (debug&1) printf("test mode enabled\n");
        break;
    case 'v': case 'V':
        video_mode=1;
        if (debug&1) printf("video mode enabled\n");
        break;
    case 'w': case 'W':
        mitre_type=NO_MITRE;
        if (debug&1) printf("disable default wedge mitre, output none\n");
        break;
    case 'x': case 'X':
        xoffset=atol(&argv[i][2]);    /* at address [i][2] */
        if (debug&1) printf("x offset = %ld\n",xoffset);
        break;
    case 'y': case 'Y':
        yoffset=atol(&argv[i][2]);    /* at address [i][2] */
        if (debug&1) printf("y offset = %ld\n",yoffset);
        break;
    default:
        break;
    }
  }
}

/*-------------------------------------------------------------------
---
        output_circle() - output circle mitre in HDI format
-------------------------------------------------------------------
-*/ output_circle(radius,cx1,cy1)
long    radius,cx1,cy1;
{
int     i;
long    x_temp,y_temp;
int     delta_angle;

delta_angle=grid;
for(i=grid;i<90;i+=delta_angle){
  y_temp = (radius*cos(i*M_PI/180));
  x_temp = (radius*sin(i*M_PI/180));
  /*
  fprintf(file_ptr_out,"%8ld %8ld %8ld %8ld\n",(cx1-x_temp),(cy1-y_temp),
                                     (cx1+x_temp),(cy1+y_temp));
  */
  write_hdi((cx1-x_temp),(cy1-y_temp),(cx1+x_temp),(cy1+y_temp));
  }
}

/*-------------------------------------------------------------------
---
        write_hdi() - output correct HDI format
```

HD-23,619

- 109 -

```
-*/ int write_hdi(_x1,_y1,_x2,_y2)
long _x1,_y1,_x2,_y2;
{
long temp;
int found=0;

if ((fabs((double)(_x2-_x1))==0)||(fabs((double)(_y2-_y1))==0)) {
  zero_width++;
  }
else {
  if (_x2 < _x1) {
    temp = _x1;
    _x1 = _x2;
    _x2 = temp;
    found=1;
    }
  if (_y2 < _y1) {
    temp = _y1;
    _y1 = _y2;
    _y2 = temp;
    found=1;
    }
  if (found) reversed++;
  fprintf(file_ptr_out,"%8ld %8ld %8ld %8ld\n",_x1,_y1,_x2,_y2);
  rect_count++;
  }
}

/*---------------------------------------------------------------
        output_wedge() - output wedge mitre in HDI format
------------------------------------------------------------------
-*/ int output_wedge(radius1,radius2,cx1,cy1,angle1,angle2,dir1,dir2)
long    radius1,radius2,cx1,cy1;
double  angle1,angle2;
int     dir1,dir2;
{
long x_delta,y_delta;
int i;
long local_tp_num;
long back_bias;

back_bias=12;           /* half of 1 mil standard minimum linewidth */ if ((dir1==UP)||(dir1==DOWN)||(dir1==LEFT)||(dir1==RIGHT)) angle1=0.0;
if (angle1<0.0) angle1+=rad360;
if (angle1==0.0) {
  if (radius1==radius2) {
    x_delta=back_bias;
    y_delta=back_bias;
    }
  else {
    x_delta=radius1;
    y_delta=radius1;
    }
```

RD-23,619

- 110 -

```
        if ((dir1==UP)||(dir1==DOWN)) x_delta=0;      /* perpendicular */
        if ((dir1==LEFT)||(dir1==RIGHT)) y_delta=0;
        switch(dir1) {
          case RIGHT: x_points[1]=cx1-x_delta;
                      y_points[1]=cy1-y_delta;
                      break;
          case UP   : x_points[1]=cx1+x_delta;
                      y_points[1]=cy1-y_delta;
                      break;
          case LEFT : x_points[1]=cx1+x_delta;
                      y_points[1]=cy1+y_delta;
                      break;
          case DOWN : x_points[1]=cx1-x_delta;
                      y_points[1]=cy1+y_delta;
                      break;
        }
      }
      else {
        if (radius1==radius2) {
          x_delta=(long)(fabs(cos(angle1))*(double)back_bias);
          y_delta=(long)(fabs(sin(angle1))*(double)back_bias);
        }
        else {
          x_delta=(long)(fabs(cos(angle1))*(double)radius1);
          y_delta=(long)(fabs(sin(angle1))*(double)radius1);
        } if ((angle1>0.0)&&(angle1<rad90)) {
          x_points[1]=cx1-x_delta;
          y_points[1]=cy1-y_delta;
        }
        if ((angle1>rad90)&&(angle1<rad180)) {
          x_points[1]=cx1+x_delta;
          y_points[1]=cy1-y_delta;
        }
        if ((angle1>rad180)&&(angle1<rad270)) {
          x_points[1]=cx1+x_delta;
          y_points[1]=cy1+y_delta;
        }
        if ((angle1>rad270)&&(angle1<rad360)) {
          x_points[1]=cx1-x_delta;
          y_points[1]=cy1+y_delta;
        }
      } if ((dir2==UP)||(dir2==DOWN)||(dir2==LEFT)||(dir2==RIGHT)) angle2=0.0;
      if (angle2<0.0) angle2+=rad360;
      if (angle2==0.0) {
        if (radius1==radius2) {
          x_delta=back_bias;
          y_delta=back_bias;
        }
        else {
          x_delta=radius2;
          y_delta=radius2;
        } if ((dir2==UP)||(dir2==DOWN)) x_delta=0;      /* perpendicular */
        if ((dir2==LEFT)||(dir2==RIGHT)) y_delta=0;
        switch(dir2) {
```

HD-23,619

- 111 -

```
                case RIGHT: x_points[3]=cx1+x_delta;
                            y_points[3]=cy1+y_delta;
                            break;
                case UP   : x_points[3]=cx1-x_delta;
                            y_points[3]=cy1+y_delta;
                            break;
                case LEFT : x_points[3]=cx1-x_delta;
                            y_points[3]=cy1-y_delta;
                            break;
                case DOWN : x_points[3]=cx1+x_delta;
                            y_points[3]=cy1-y_delta;
                            break;
              }
            }
            else {
              if (radius1==radius2) {
                x_delta=(long)(fabs(cos(angle2))*(double)back_bias);
                y_delta=(long)(fabs(sin(angle2))*(double)back_bias);
              }
              else {
                x_delta=(long)(fabs(cos(angle2))*(double)radius2);
                y_delta=(long)(fabs(sin(angle2))*(double)radius2);
              } if ((angle2>0.0)&&(angle2<rad90)) {
                x_points[3]=cx1+x_delta;
                y_points[3]=cy1+y_delta;
              }
              if ((angle2>rad90)&&(angle2<rad180)) {
                x_points[3]=cx1-x_delta;
                y_points[3]=cy1+y_delta;
              }
              if ((angle2>rad180)&&(angle2<rad270)) {
                x_points[3]=cx1-x_delta;
                y_points[3]=cy1-y_delta;
              }
              if ((angle2>rad270)&&(angle2<rad360)) {
                x_points[3]=cx1+x_delta;
                y_points[3]=cy1-y_delta;
              }
            } x_points[2]=cx1;
          y_points[2]=cy1;

x_points[4]=x_points[3];
          y_points[4]=y_points[3];
          x_points[5]=x_points[2];
          y_points[5]=y_points[2];
          x_points[6]=x_points[1];
          y_points[6]=y_points[1];

tparray_buf[0].tpx=x_points[1];
          tparray_buf[0].tpy=y_points[1];
          tparray_buf[1].tpx=x_points[2];
          tparray_buf[1].tpy=y_points[2];
          tparray_buf[2].tpx=x_points[3];
          tparray_buf[2].tpy=y_points[3];

local_tp_num=pline_2_tpp((radius1*2),(radius2*2),3L);
```

HD-23,619

- 112 -

```
        fill_area_solid(local_tp_num);
        /*
        x_points[2]=cx1;
        y_points[2]=cy1;
  5     for (i=1;i<=3;i++)
          printf("(%ld,%ld) \n",x_points[i],y_points[i]);
        fill_area_solid(3L);
        */
        }
 10
        /*---------------------------------------------------------------
        ---
               output_hourglass() - output hourglass mitre in HDI format
        ----------------------------------------------------------------
 15     -*/ output_hourglass(radius1,radius2,cx1,cy1,angle1,angle2,dir1,dir2)
        long    radius1,radius2,cx1,cy1;
        double  angle1,angle2;
 20     int     dir1,dir2;
        {
        long x_delta,y_delta;
        int i;

25     if ((dir1==UP)||(dir1==DOWN)||(dir1==LEFT)||(dir1==RIGHT)) angle1=0.0;
        if (angle1<0.0) angle1+=rad360;
        if (angle1==0.0) {
          x_delta=radius1;
          y_delta=radius1;
 30       if ((dir1==UP)||(dir1==DOWN)) y_delta=0;
          if ((dir1==LEFT)||(dir1==RIGHT)) x_delta=0;
          switch(dir1) {
            case RIGHT: x_points[1]=cx1-x_delta;
                        y_points[1]=cy1+y_delta;
 35                     x_points[2]=cx1+x_delta;
                        y_points[2]=cy1-y_delta;
                        break;
            case UP   : x_points[1]=cx1-x_delta;
                        y_points[1]=cy1-y_delta;
 40                     x_points[2]=cx1+x_delta;
                        y_points[2]=cy1+y_delta;
                        break;
            case LEFT : x_points[1]=cx1+x_delta;
                        y_points[1]=cy1-y_delta;
 45                     x_points[2]=cx1-x_delta;
                        y_points[2]=cy1+y_delta;
                        break;
            case DOWN : x_points[1]=cx1+x_delta;
                        y_points[1]=cy1+y_delta;
 50                     x_points[2]=cx1-x_delta;
                        y_points[2]=cy1-y_delta;
                        break;
          }
        }
 55     else {
          x_delta=(long)(fabs(cos(rad90-angle1))*(double)radius1);
          y_delta=(long)(fabs(sin(rad90-angle1))*(double)radius1);

if ((angle1>0.0)&&(angle1<rad90)) {
 60         x_points[1]=cx1-x_delta;
```

HD-23,619

- 113 -

```
              y_points[1]=cyl+y_delta;
              x_points[2]=cx1+x_delta;
              y_points[2]=cyl-y_delta;
            }
 5          if ((angle1>rad90)&&(angle1<rad180)) {
              x_points[1]=cx1-x_delta;
              y_points[1]=cyl-y_delta;
              x_points[2]=cx1+x_delta;
              y_points[2]=cyl+y_delta;
10          }
            if ((angle1>rad180)&&(angle1<rad270)) {
              x_points[1]=cx1+x_delta;
              y_points[1]=cyl-y_delta;
              x_points[2]=cx1-x_delta;
15            y_points[2]=cyl+y_delta;
            }
            if ((angle1>rad270)&&(angle1<rad360)) {
              x_points[1]=cx1+x_delta;
              y_points[1]=cyl+y_delta;
20            x_points[2]=cx1-x_delta;
              y_points[2]=cyl-y_delta;
            }
          }

25        if ((dir2==UP)||(dir2==DOWN)||(dir2==LEFT)||(dir2==RIGHT)) angle2=0.0;
          if (angle2<0.0) angle2+=rad360;
          if (angle2==0.0) {
            x_delta=radius2;
            y_delta=radius2;
30          if ((dir2==UP)||(dir2==DOWN)) y_delta=0;
            if ((dir2==LEFT)||(dir2==RIGHT)) x_delta=0;
            switch(dir2) {
              case RIGHT: x_points[3]=cx1+x_delta;
                          y_points[3]=cyl-y_delta;
35                        x_points[4]=cx1-x_delta;
                          y_points[4]=cyl+y_delta;
                          break;
              case UP   : x_points[3]=cx1+x_delta;
                          y_points[3]=cyl+y_delta;
40                        x_points[4]=cx1-x_delta;
                          y_points[4]=cyl-y_delta;
                          break;
              case LEFT : x_points[3]=cx1-x_delta;
                          y_points[3]=cyl+y_delta;
45                        x_points[4]=cx1+x_delta;
                          y_points[4]=cyl-y_delta;
                          break;
              case DOWN : x_points[3]=cx1-x_delta;
                          y_points[3]=cyl-y_delta;
50                        x_points[4]=cx1+x_delta;
                          y_points[4]=cyl+y_delta;
                          break;
            }
          }
55        else {
            x_delta=(long)(fabs(cos(rad90-angle2))*(double)radius2);
            y_delta=(long)(fabs(sin(rad90-angle2))*(double)radius2);

if ((angle2>0.0)&&(angle2<rad90)) {
60            x_points[3]=cx1+x_delta;
```

HD-23,619

- 114 -

```
              y_points[3]=cy1-y_delta;
              x_points[4]=cx1-x_delta;
              y_points[4]=cy1+y_delta;
              }
 5        if ((angle2>rad90)&&(angle2<rad180)) {
              x_points[3]=cx1+x_delta;
              y_points[3]=cy1+y_delta;
              x_points[4]=cx1-x_delta;
              y_points[4]=cy1-y_delta;
10            }
          if ((angle2>rad180)&&(angle2<rad270)) {
              x_points[3]=cx1-x_delta;
              y_points[3]=cy1+y_delta;
              x_points[4]=cx1+x_delta;
15            y_points[4]=cy1-y_delta;
              }
          if ((angle2>rad270)&&(angle2<rad360)) {
              x_points[3]=cx1-x_delta;
              y_points[3]=cy1-y_delta;
20            x_points[4]=cx1+x_delta;
              y_points[4]=cy1+y_delta;
              }
          }

25     x_points[5]=x_points[1];
       y_points[5]=y_points[1];
       fill_area_solid(5L);
```

HD-23,619

- 115 -

APPENDIX C

```
/*************************************************************
 ***
 *       Title   LGV_NEW.C
 *       Author  K2 Welles
 *       Date    5/12/89       Last Updated: 4/27/94 LR Douglas
 *       c.date  Thu Oct 12 15:50:32 1989
 *       Lang    Microsoft C    (IBM PC)
 *       Lang    C              (SUN)
 *       (c)     Copyright 1989-94 General Electric
 *       Batch   cbig           (IBM PC edit, compile, link)
 *       Batch   gc 1           (IBM PC edit, compile, link)
 *************************************************************
 **/

/*************************************************************
 ***
 *       Changes
 *
 * 2/1/91   lrd   Re-compiled using Microsoft C 6.0
 * 3/11/91  lrd   Increased MAXIC to 200
 * 4/25/91  lrd   New variable top_y_scan_add = 25400L to add 1" additional
 *                0's buffer on top of rasterized image to prevent garbage
 *                write on physical substrate.  This will eliminate need for
 *                limit procedure.
 * 1/26/93  lrd   -e option for windage, ex. -e9 will add 9 microns windage,
 *                will not work for coincident legend areas
 * 5/14/93  lrd   -p option to partition swath in Y, -w option also controls
 *                swath overlap, top_y_scan_add set to 0 to help compute
 *                and optimize scan window
 * 4/11/95  lrd   Increased MAXIC to 400
 *
 *************************************************************
 **/

/*************************************************************
 ***
 *          OPTIONS
 * -d2       debug option 2
 * -a80      aperture the image to 80% of 8192 pixels (start at 819)
 * -c2       break each column (swath) in half vertically
 * -f        create and use a file called diagnost.kgv
 * -i        invert the image for use with positive resist
 * -l3       set trap_level to 3
 * -m2       compile only metal layer 2 (faster that way)
 * -o        use the old (laser1, fft.001) format for input
 * -p        partition swath in y dimension
 * -q        quit after the first segment compilation
 * -r        reverse the north and south sequence of scanning
 * -s12      work on substrate 12
 * -u        DISABLE unidirectional scanning
 * -w80      reduce move width (increase overlap) by 80 microns
 * -x1200    change sizx to 1200 (or next smaller mod 16) for scan width
 * -y200     add 200 microns y to both ends of the scan
 * -z        Zero out any linearization, do NOT modify any data
 *
 *************************************************************
 **/
```

HD-23,619

- 116 -

```
/****************************************************************
 ***
 *       DEBUG VALUES
 ****************************************************************
 ***
 * BIT   FUNCTION
 *    1  Type all file names as they are opened
 *    2  Do not trapezoid the inside traces
 *    4  Do not trapezoid the bridge traces
 *    8  Trapezoid only according to trap_level
 *   16  debug the run length limit measures
 *   32  show statistics as you run
 *   64  debug the bit file making
 *  128  Show major routines as entered
 *  256  Debug the trapezoid output routine
 *  512  Display zero height trapezoids
 * 1024  Use single swath data collection
 * 2048  Show correction as it is found
 * 4096  Type out hot dog error information, instead of just fixing them
 * 8192  Optimize scan by different x start areas
 ****************************************************************
 **/

/****************************************************************
 ***
 *       btest VALUES
 ****************************************************************
 ***
 * BIT   FUNCTION
 *    1  Test the linear/unlinear functions
 *    2  Compute only one chunk for each swath
 *    4  Type out the header of each swath
 *    8  Show RLL data as it is produced
 *   16  Supress outside trapezoids
 *   32  Supress bridge trapezoids
 *   64  Supress inside trapezoids
 *  256  Reverse allocation of data space ordering
 ****************************************************************
 **/ include "stdio.h"
include "stdlib.h"
#include "localcpu.h"
#include "time.h"
#include "malloc.h"

/****************************************************************
 ***
 *       Local CPU dependent global definitions
 ****************************************************************
 **/
#ifdef SUN3
#define SIZY     256
     char    dirsep [] = "/";
     char    dirroot [] = "/usr/woodstock/u2/welles/hdi/";
endif ifdef IBMPC
define SIZY     63
     char    dirsep [] = "\\";
```

HD-23,619

- 117 -

```
        char    dirroot [] = "\\hdi2\\";
#endif

/************************************************************************
***
*       GLOBAL VALUES AND VARIABLES
************************************************************************
**/
#define    SMQ     .07910241801        /* microns per semiquave
**/
#define    SIZX    8192
#define    SIZX_16 512
#define    MAXIC   400
#define    MAXINDAT 4000
#define    MAXBRDAT 4000
#define    MAXOTDAT 4000
/*                                  changed to allow command line input (lrd 10/15)
#define    MAXMOVE  10000            maximum pels any feature may move
*/
        int     partition=1;         /* default 1 partition per swath */
        long    maxmove = 500L;
        long    extra_width = 0;      /* add windage at compile */
        int     icnumber, maxic;
        int     quit_early = 0;
        int     dchunk, nchunk, progress;
        long    xoffset [MAXIC], yoffset [MAXIC];
        int     alarm = 0;
        int     invert = 0;          /** if non-zero, invert the image **/
        long    x1_debug = 0L, x2_debug, y1_debug, y2_debug;
        long    reduce_width = 0L;
        long    trapmisd, traphit, trap0height;
        int     trap_level, trap_type [256], max_chgs_per_line;
        int     xor_map [SIZX_16], any_bits_set;
        int     *bit_map [512];
        int     uni_directional = 1;
        int     metal_only = -1, column_break = 1;
        int     ap_holdoff = 0, ap_earlyoff = 0, aperture = 0;
        int     sizx = SIZX, sizx_16 = SIZX_16, sizy = SIZY;
        long    subnum, xdiv = 3L, ydiv = 3L;
        long    top_y_scan_add = 25400L;    /* 1 inch additional buffer on top
*/
        long    y_scan_add = 500L;
        long    debug, lox, loy, upx, upy, rll_count, btest;
        long    origloy, origupy;
        long    reflox, refloy, refupx, refupy;
        long    ixlchunk, iylchunk, ixuchunk, iyuchunk;
        long    xref [MAXIC], yref [MAXIC], xadbnd [MAXIC] [4], yadbnd [MAXIC]
[4];
        long    mmxy [8], xmin, ymin, xmax, ymax;
        long    chnkx, chnky, movchnkx;
        long    lxlchunk, lylchunk, lxuchunk, lyuchunk;
        long    mnx, mxx;
        char    basename [40], dirname [80], stemp [80], basedir [80];
        int     indat_ic [MAXINDAT], max_in_dat;
        long    indat_xl [MAXINDAT], indat_xu [MAXINDAT];
        long    indat_yl [MAXINDAT], indat_yu [MAXINDAT];
        int     brdat_ic [MAXBRDAT], max_br_dat;
        long    brdat_xl [MAXBRDAT], brdat_xu [MAXBRDAT];
        long    brdat_yl [MAXBRDAT], brdat_yu [MAXBRDAT];
        int                          max_ot_dat;
```

HD-23,619

- 118 -

```
       long    otdat_xl [MAXOTDAT], otdat_xu [MAXOTDAT];
       long    otdat_yl [MAXOTDAT], otdat_yu [MAXOTDAT];
       float   rotate [MAXIC], fxydif;
       int     fadp_format = 0;
       FILE    *fadp, *finside, *fbridge, *fotside, *fdiag, *falarm;
       static int  bit_start [16] =
{0xffff,0x7fff,0x3fff,0x1fff,0x0fff,0x07ff, 0x03ff,0x01ff,0x00ff,0x007f,0x003f,0x001f,0x000f,0x0007,0x0003,0x0001};
       static int  bit_end    [16] =
{0x8000,0xc000,0xe000,0xf000,0xf800,0xfc00, 0xfe00,0xff00,0xff80,0xffc0,0xffe0,0xfff0,0xfff8,0xfffc,0xfffe,0xffff};

/*****   This is the linearity data        ******/
       int     maxlin, skip_linear = 0;
/*     int     x_off_dither;                 pels to first ditherable point **/
       long    xlin [256], xerr [256], yerr [256];
       float   err_dx;
       long    linearx (), unlinearx ();

/*******   This characterizes the output file  ********/
       int     reverse = 0;            /** For diagnostics, reverses swaths
**/
       short   rll_buffer [2048];  /* was [1024] 1/17/94 */
       short   rll_values [2048];
       long    file_length;    /** running tab on file length in 16 bit words
**/
       long    line_count = 0;
       FILE    *fbin;                  /** This is the binary file descriptor
**/

/****************************************************************************
***
*       Main routine
****************************************************************************
**/
main (argc, argv)
       int     argc;
       char    *argv [];
{
       long    stime, ftime;

printf ("HDI system program lgv version 1.22 (c) GE 1994\n");
       time (&stime);
       get_params (argc, argv);
       initsys ();
       read_adp_file ();
       if (btest & 1) lin_test ();
       make_trap_files ();
       time (&ftime);
       printf ("Executed in %ld seconds\n", ftime - stime);
}

/****************************************************************************
***
*       Test the linear/unlinear functionality
****************************************************************************
**/
```

RD-23,619

- 119 -

```
       lin_test ()
       {
           long    xxx;

5          lxlchunk = 0;
           for (;;) {
               printf ("X=? ");
               scanf ("%ld", &xxx);
               if (xxx < -999) break;
10             printf ("linear (%ld) = %ld, unlinear (%ld) = %ld\n",
                   xxx, linearx (xxx), xxx, unlinearx (xxx));
           }
       }

15     /***********************************************************************
       ***
       *       Read in the .otN .brN and .inN files  rotate br and in to reflect
       *       the .00X rotation file.  convert these structures to trapezoids
       *       and convert the trapezoids to bitmaps.  Encode and store the
20     *       bitmaps on the disk.  Repeat for all layers
       ***********************************************************************
       **/
       make_trap_files ()
       {
25         int     layer, swath_num, segment;
           int     start_layer = 0, end_layer = 8, col_break = 0;
           long    lowerx, upperx, lowery, uppery, swath_sty, swath_ndy;
           long    col_sty, col_ndy, chunks;
           int     part_index;
30         long    part_value;

if (debug & 128) printf ("Entering routine make_trap_files\n");
           segment = -1;
           if (0 == (debug & 8192)) get_limits ();
35         if (metal_only >= 0) start_layer = end_layer = metal_only;
           for (layer = start_layer; layer <= end_layer; layer++) {
               if (open_files (layer)) {
                   if (0 == (debug & 8192)) set_limits ();
                   chunks = (upy - loy) / chnky + 1L;
40                 swath_num = 0;
                   progress = 0;          /* assure the user that we are running
       */
                   if (aperture) lox -= ap_holdoff + 100;
                   origupy=upy;           /* save original values lrd 5/14/93 */
45                 origloy=loy;
                   part_value=(upy-loy)/partition;
                   /* begin loop lrd 5/14/93*/
                   for (lowerx = lox; lowerx <= upx; lowerx += movchnkx) {
                     for (part_index=1; part_index<=partition; part_index++) {
50                          /* partition swath in Y lrd 5/14/93 */
                       if (partition>1) {
                          loy=origloy+((part_index-1)*part_value)-(reduce_width/2);
                          upy=origupy-((partition-
       part_index)*part_value)+(reduce_width/2);
55                                  /* +/- reduce_width scan overlap */
                       }
                       upperx = lowerx + chnkx - xdiv;
                       if (debug & 64) printf ("--> x = %ld, %ld\n", lowerx,
       upperx);
60                     if (column_break <= 1) {
```

HD-23,619

- 120 -

```
                swath_sty = loy;
                swath_ndy = upy;
                get_swath_data (lowerx, upperx, swath_sty, swath_ndy);
                segment++;
                if ((quit_early) && (segment > 0)) break;
            }
            if (((swath_num & 1) == reverse) || (uni_directional)) {
                make_swath_file (swath_num, layer, lowerx, loy, 1);
                if (column_break > 1) {
                    swath_sty = loy;
                    swath_ndy = loy + (chunks / column_break) * chnky;
                }
                for (lowery = loy; lowery <= upy; lowery += chnky) {
                    if (column_break > 1) {
                        if (lowery >= swath_sty) {
                            get_swath_data (lowerx, upperx, swath_sty, swath_ndy);
                            segment++;
                            if ((quit_early) && (segment > 0)) break;
                            swath_sty += (chunks / column_break) * chnky;
                            swath_ndy += (chunks / column_break) * chnky;
                        }
                    }
                    uppery = lowery + chnky - ydiv;
                    if (debug & 64) printf("y %ld, %ld\n",lowery,uppery);
                    sort_traps (lowerx, lowery, upperx, uppery, 0);
                    if (btest & 2) break;
                }
                rll_values [1] = upy / ydiv;
                write_rll_buffer (1);
            }
            else {
                make_swath_file (swath_num, layer, lowerx, upy, -1);
                if (column_break > 1) {
                    swath_sty = upy - (chunks / column_break) * chnky;
                    swath_ndy = upy;
                }
                for (uppery = upy; uppery >= loy; uppery -= chnky) {
                    if (column_break > 1) {
                        if (uppery <= swath_ndy) {
                            get_swath_data (lowerx, upperx, swath_sty, swath_ndy);
                            segment++;
                            if ((quit_early) && (segment > 0)) break;
                            swath_sty -= (chunks / column_break) * chnky;
                            swath_ndy -= (chunks / column_break) * chnky;
                        }
                    }
                    lowery = uppery - chnky + ydiv;
                    if (debug & 64) printf("y %ld, %ld\n",lowery,uppery);
                    sort_traps (lowerx, lowery, upperx, uppery, 1);
                    if (btest & 2) break;
                }
                rll_values [1] = loy / ydiv;
                write_rll_buffer (-1);
            }
            finish_swath_file ();
            swath_num++;
        }   /* end partition loop */
    }   /* end swath loop */
```

HD-23,619

- 121 -

```
                /* end main loop */
            printf ("%8ld trapezoids hit, %ld missed, %ld zero height\n",
                traphit, trapmisd, trap0height);
            printf ("%8ld Run length values recorded\n", rll_count);
            printf ("Maximum changes per line was %d\n", max_chgs_per_line);
            printf ("Line count = %ld\n", line_count);
            line_count = 0;
            rll_count = 0;
        }
        if (NULL != fotside) fclose (fotside);
        if (NULL != fbridge) fclose (fbridge);
        if (NULL != finside) fclose (finside);
        if (NULL != fdiag  ) fclose (fdiag  );
    }
}

/*************************************************************************
***
*       Get the limits of all metal layers that exist
*************************************************************************
**/
get_limits ()
{
    int     layer;

reflox = refloy = refupx = refupy = 0;
    for (layer = 0; layer <= 9; layer++) {
        if (open_files (layer)) {
            if ((reflox == 0) && (refupx == 0)) {
                reflox = lox;
                refloy = loy;
                refupx = upx;
                refupy = upy;
            }
            else {
                if (reflox > lox) reflox = lox;
                if (refloy > loy) refloy = loy;
                if (refupx < upx) refupx = upx;
                if (refupy < upy) refupy = upy;
            }
            printf ("Limits to layer %d are x %ld, %ld, y %ld %ld\n", layer,
                reflox, refupx, refloy, refupy);
        }
        if (NULL != fotside) fclose (fotside);
        if (NULL != fbridge) fclose (fbridge);
        if (NULL != finside) fclose (finside);
        if (NULL != fdiag  ) fclose (fdiag  );
    }
    refloy -= y_scan_add;
/*  refupy += y_scan_add;           */     /* old y limit determination */
    if (partition>1)                       /* 5/14/93 default scan length */
        refupy += y_scan_add;
    else
        refupy = refupy + y_scan_add + top_y_scan_add;     /* add 1" more */
}

/*************************************************************************
***
*       Set the limits to the max
```

HD-23,619

- 122 -

```
/**************************************************************************
**/
set_limits ()
{
    lox = reflox;
    loy = refloy;
    upx = refupx;
    upy = refupy;
}

/**************************************************************************
***
*       Sort this scan chunk for all outside, bridge and inside files
**************************************************************************
**/
sort_traps (lowerx, lowery, upperx, uppery, direct)
    int                                         direct;
    long    lowerx, lowery, upperx, uppery;
{
    int     i, j, ic, ic_hit [MAXIC];
    long    xxl, yyl, xxu, yyu;

if (debug & 128) printf ("Entering routine  sort_traps\n");
    show_progress ();
    clear_bitmap ();
    lxlchunk = lowerx;
    lylchunk = lowery;
    lxuchunk = upperx;
    lyuchunk = uppery;
    ixlchunk = lowerx / xdiv;
    if (lowery > 0L) iylchunk = (lowery        ) / ydiv;
    else             iylchunk = (lowery - ydiv + 1) / ydiv;
    ixuchunk = upperx / xdiv;
    if (uppery > 0L) iyuchunk = (uppery        ) / ydiv;
    else             iyuchunk = (uppery - ydiv + 1) / ydiv;
    dchunk = direct;
    j = 0;
    for (ic = 0; ic < maxic; ic++) {
        j |= (ic_hit [ic] = hit_this_ic (ic));
    }
    for (i = 0; i < max_ot_dat; i++) {
        mmxy [0] = mmxy [2] = xxl = otdat_xl [i];
        mmxy [4] = mmxy [6] = xxu = otdat_xu [i];
        mmxy [1] = mmxy [7] = yyl = otdat_yl [i];
        mmxy [3] = mmxy [5] = yyu = otdat_yu [i];
        if ((yyu >= lowery-maxmove) && (yyl <= uppery+maxmove)) {
            if ((btest & 16) == 0) set_traps (mmxy);
        }
    }
    if (j) {
        for (i = 0; i < max_in_dat; i++) {
            ic = indat_ic [i];
            if ((ic_hit [ic]) && ((debug & 2) == 0)) {
                xxl = indat_xl [i];
                xxu = indat_xu [i];
                yyl = indat_yl [i];
                yyu = indat_yu [i];
                if ((yyu >= lowery-maxmove) && (yyl <= uppery+maxmove)) {
                    convert (&mmxy [0], ic, xxl, yyl);
                    convert (&mmxy [2], ic, xxl, yyu);
```

HD-23,619

- 123 -

```
                            convert (&mmxy [4], ic, xxu, yyu);
                            convert (&mmxy [6], ic, xxu, yyl);
                            if ((btest & 64) == 0) set_traps (mmxy);
                        }
                    }
                }
                for (i = 0; i < max_br_dat; i++) {
                    ic = brdat_ic [i];
                    if ((ic_hit [ic]) && ((debug & 4) == 0)) {
                        xxl = brdat_xl [i];
                        xxu = brdat_xu [i];
                        yyl = brdat_yl [i];
                        yyu = brdat_yu [i];
                        if ((yyu >= lowery-maxmove && (yyl <= uppery+maxmove)) {
                            if (xxl < xadbnd [ic] [1]) {
                                mmxy [0] = xadbnd [ic] [0]; mmxy [1] = yyl;
                                mmxy [2] = xadbnd [ic] [0]; mmxy [3] = yyu;
                                convert (&mmxy [4], ic, xadbnd [ic] [1], yyu);
                                convert (&mmxy [6], ic, xadbnd [ic] [1], yyl);
                            }
                            else if (yyl < yadbnd [ic] [1]) {
                                mmxy [0] = xxl; mmxy [1] = yadbnd [ic] [0];
                                convert (&mmxy [2], ic, xxl, yadbnd [ic] [1]);
                                convert (&mmxy [4], ic, xxu, yadbnd [ic] [1]);
                                mmxy [6] = xxu; mmxy [7] = yadbnd [ic] [0];
                            }
                            else if (xxu > xadbnd [ic] [2]) {
                                convert (&mmxy [0], ic, xadbnd [ic] [2], yyl);
                                convert (&mmxy [2], ic, xadbnd [ic] [2], yyu);
                                mmxy [4] = xadbnd [ic] [3]; mmxy [5] = yyu;
                                mmxy [6] = xadbnd [ic] [3]; mmxy [7] = yyl;
                            }
                            else if (yyu > yadbnd [ic] [2]) {
                                convert (&mmxy [0], ic, xxl, yadbnd [ic] [2]);
                                mmxy [2] = xxl; mmxy [3] = yadbnd [ic] [3];
                                mmxy [4] = xxu; mmxy [5] = yadbnd [ic] [3];
                                convert (&mmxy [6], ic, xxu, yadbnd [ic] [2]);
                            }
                            if ((btest & 32) == 0) set_traps (mmxy);
                        }
                    }
                }
            }
            if (direct) store_bitmap (iyuchunk, 1);
            else        store_bitmap (iylchunk, 0);
        }

/******************************************************************
        ***
        *       Assure the user that progress is being made
        ******************************************************************
        **/
        show_progress ()
        {
        #ifdef   IBMPC
            printf ("\033[s");                      /* save the cursor position
        */
            printf ("\033[1;72H%4d", ++progress);
            printf ("\033[u");                      /* unsave the cursor position
        */
```

HD-23,619

- 124 -

```
        #endif
        }
        /*************************************************************************
 5      ***
        *       Store the current state of the bitmap
        *************************************************************************
        **/
        store_bitmap (y_scan, dir)
10              int                     dir;
                long            y_scan;
        {
                int     iy, rll_max, i, j;
                long    y_val;
15
                if (debug & 128) printf ("Entering routine  store_bitmap\n");
                if (invert) invert_bits ();
                if (aperture) aperture_bits ();
                for (iy = 0; iy < sizy; iy++) {
20                      rll_max = rll_encode (bit_map [iy], rll_values);
                        if (rll_max > 2) {
                                line_count++;
                                rll_count += rll_max - 1;
                                if (dir) y_val = y_scan - iy;
25                              else     y_val = y_scan + iy;
                                rll_values [0] = rll_max - 2;
                                rll_values [1] = y_val;
                                if (dir) write_rll_buffer (-1);
                                else    write_rll_buffer ( 1);
30                              if ((rll_max > max_chgs_per_line) && (y_val != 0)) {
                                        max_chgs_per_line = rll_max;
                                        if (max_chgs_per_line > sizx_16) printf (
                                                "Line %ld would be shorter without compression\n",
        y_val);
35                                      if (debug & 32) printf ("Line %ld has %d changes\n",
                                                y_val, rll_max);
                                }
                        }
                        if (debug & 16) {
40                              if (dir) y_val = y_scan - iy;
                                else    y_val = y_scan + iy;
                                i = rll_max;
                                if (i > 8) i = 8;
                                printf ("RLL index for line %101d is %2d  ", y_val, rll_max);
45                              for (j = 0; j < i; j++) printf ("%4d ", rll_values [j]);
                                printf ("\n");
                        }
                        if (any_bits_set == 0) break;   /* must occur after one pass of loop
        */
50              }
        }

/*************************************************************************
        ***
55      *       Calculate the number of repeats of the old line
        *       Write out the old line with repeats and changes
        *       Move the new line into the old line
        *************************************************************************
        **/
60      write_rll_buffer (dir)
```

HD-23,619

- 125 -

```
        int     dir;
    {
        int     rll_max, i;

if (rll_buffer [1] != rll_values [1]) {         /** skip if 0 repeats
    **/
            if (rll_buffer [0] == -1) {                 /** first line of swath
    **/
                if (invert) {
                    rll_buffer [0] = 2;                 /** assume all 1s
    **/
                    rll_buffer [2] = aperture * 16;
                    rll_buffer [3] = 8192 - aperture * 32;
                    rll_buffer [4] = aperture * 16;
                }
                else {
                    rll_buffer [0] = 2;                 /** assume all 0s
    **/
                    rll_buffer [2] = 1000;
                    rll_buffer [3] = 0;
                    rll_buffer [4] = 7192;
                }
            }
            rll_max = rll_buffer [0] + 2; /** 16 bit words to define this line
    **/
            file_length += rll_max;      /* total 16 bit words following header
    */
            rll_buffer [1] = dir * (rll_values [1] - rll_buffer [1]);  /* repts
    */
            if (rll_buffer [1] > 0) {
                if (rll_max != fwrite (rll_buffer, 2, rll_max, fbin)) {
                    printf ("Error: c.line 472 write failure\n");
                    errorlog(2);
                    exit (2);
                }
            }
            if (btest & 8) {
                for (i = 0; i < rll_max; i++)
                    printf ("%5d ", rll_buffer [i]);
                printf ("\n");
            }
        }
        rll_max = rll_values [0] + 2;                  /* new line becomes old line
    */
        for (i = 0; i < rll_max; i++) rll_buffer [i] = rll_values [i];
    }

/*************************************************************************
    ***
    *       Invert the bit map area
    *************************************************************************
    **/
    invert_bits ()
    {
        int     iy, ix, *b_map;

if (debug & 128) printf ("Entering routine  invert_bits\n");
        for (iy = 0; iy < sizy; iy++) {
            b_map = bit_map [iy];
            for (ix = 0; ix < sizx_16; ix++) {
```

HD-23,619

- 126 -

```
              b_map [ix] ^= 0xffff;
          }
      }
  }
  /***********************************************************************
  ***
  *       Aperture the bit map area
  ***********************************************************************
  **/
  aperture_bits ()
  {
      int    iy, ix, *b_map;

if (debug & 128) printf ("Entering routine  aperture_bits\n");
      for (iy = 0; iy < sizy; iy++) {
          b_map = bit_map [iy];
          for (ix = 0; ix < aperture; ix++) {
              b_map [ix] = 0;
              b_map [sizx_16 - ix - 1] = 0;
          }
      }
  }

/***********************************************************************
  ***
  *       Convert this line of bit_map into rll values
  ***********************************************************************
  **/
  rll_encode (b_map,    rll_vals)
      int      b_map [];
      short            rll_vals [];
  {
      int    old_bit, ibit, ix, rll_index, last_change, this_change;
      int    this_word;
      static   int   bit_tst [16] =
  {0x8000,0x4000,0x2000,0x1000,0x0800,0x0400, 0x0200,0x0100,0x0080,0x0040,0x0020,0x0010,0x0008,0x0004,0x0002,0x0001};

if (debug & 128) printf ("Entering routine  rll_encode\n");
      old_bit = 0;
      last_change = 0;
      rll_index = 2;
      for (ix = 0; ix < sizx_16; ix++) {
          this_word = xor_map [ix] ^ b_map [ix];
          xor_map [ix] = b_map [ix];
          if (this_word == old_bit) continue;
          for (ibit = 0; ibit < 16; ibit++) {
              if (bit_tst [ibit] & (old_bit ^ this_word)) {
                  this_change = (ix << 4) + ibit;
                  rll_vals [rll_index++] = this_change - last_change;
                  last_change = this_change;
                  old_bit ^= 0xffff;
              }
          }
      }
      return (rll_index);
  }
```

RD-23,619

- 127 -

```
/******************************************************************
***
*       Write the trapezoid into the bitmap area
*   ibit is the trap type from trap_fill
*   starty, endy are in pixels from lower value chunk edge (iylchunk)
*   slx, srx   are in pixels from lower value chunk edge (ixlchunk)
*   flxly, frxry are in pixels per scan line
******************************************************************
**/
bitmap_write (ibit, starty, endy, slx, srx, flxly, frxry)
    int         ibit;
    long                starty, endy, slx, srx;
    float                                   flxly, frxry;
{
    int     startx, endx, iy;

if (debug & 128) printf ("Entering routine  bitmap_write\n");
    if ((starty > 255) || (endy < starty)) {
        printf ("Bitmap_write failure at c.line 546, type %d\n", ibit);
        printf ("%ld %ld %ld %ld %f %f\n", starty,endy,slx,srx,flxly,frxry);
        return (1);
    }
    for (iy = starty; iy <= endy; iy++) {
        startx = slx + (iy - starty) * flxly;
        endx   = srx + (iy - starty) * frxry;
        if ((debug & 4096) && ((startx < mnx) || (endx > mxx))) {
            printf ("Hotdog error in c.line 554, ibit type %d\n", ibit);
            printf ("starty = %ld, endy = %ld, slx = %ld, srx = %ld\n",
                starty, endy, slx, srx);
            printf ("startx = %d, endx = %d\n", startx, endx);
            printf ("mnx = %ld, mxx = %ld, flxly = %f, frxry = %f\n",
                mnx, mxx, flxly, frxry);
        }
        if (startx < mnx) startx = mnx;
        if (endx   > mxx) endx   = mxx;
/*      bit_fill (startx, endx, bit_map [iy]);  12/13/89 */
        bit_fill (startx, endx, iy);
    }
    any_bits_set = 1;
    traphit++;
    if (alarm) {
        fprintf (falarm, "bitmap_write (%d, %ld, %ld, %ld, %ld, %f,%f)\n",
            ibit, starty, endy, slx, srx, flxly, frxry);
        printf ("bitmap_write (%d, %ld, %ld, %ld, %ld, %f,%f)\n",
            ibit, starty, endy, slx, srx, flxly, frxry);
    }
    return (0);
}

/******************************************************************
***
*       Fill the bits from startx to endx at line iy
* startx, endx are in linearized pixels from left of chunk (ixlchunk)
* b_map is a pointer to the iy'th section of bit_map
******************************************************************
**/
bit_fill (startx, endx, iy)
    int     startx, endx, iy;
/*  bit_fill (startx, endx, b_map)
    int     startx, endx, b_map [];         */
```

HD-23,619

- 128 -

```
     {
         int    ix, x1, x2, *b_map;

if (debug & 128) printf ("Entering routine  bit_fill\n");
5        if (startx <     0) startx = 0;
         if (startx >= sizx) startx = sizx - 1;
         if (endx   <     0) endx   = 0;
         if (endx   >= sizx) endx   = sizx - 1;
         if (endx < startx) return;
10       b_map = bit_map [iy];
         x1 = startx>>4;
         x2 = endx>>4;
         if (x1_debug) {
             if ((startx < ((int) (x2_debug - ixlchunk))) &&
15              (endx    > ((int) (x1_debug - ixlchunk))) &&
                (iy      < ((int) (y2_debug - iylchunk))) &&
                (iy      > ((int) (y1_debug - iylchunk)))) {
                 if (alarm == 0) {
                     fprintf (falarm, "ixl, iylchunk = %ld %ld\n", ixlchunk,
20   iylchunk);
                     printf ("ixl, iylchunk = %ld %ld\n", ixlchunk, iylchunk);
                     printf ("bit_fill (%d, %d, %d)\n", startx, endx, iy);
                 }
                 fprintf (falarm, "bit_fill (%d, %d, %d)\n", startx, endx, iy);
25               alarm = 1;
             }
         }
         if (x1 == x2) {
             b_map [x1] |= (bit_start [startx & 15] & bit_end [endx & 15]);
30       }
         else {
             b_map [x1] |= bit_start [startx & 15];
             b_map [x2] |= bit_end   [endx   & 15];
             for (ix = x1 + 1; ix < x2; ix++) b_map [ix] = 0xffff;
35       }
     }

/***********************************************************************
     ***
40   *       Open all input files for this layer (.inX, .brX, .otX)
     *       Read these files thru once for the scan dimensions
     *       Return these dimensions in lox, upx, loy, upy (long global microns)
     ************************************************************************
     **/
45   open_files (layer)
         int     layer;
     {
         int    ic;
         long   xxl, yyl, xxu, yyu;
50
         if (debug & 128) printf ("Entering routine  open_files\n");
         sprintf (stemp, "%s.in%ld", dirname, layer);
         finside = fopen (stemp, "r");
         if (debug & 1) printf ("Trying to open %s for input\n", stemp);
55       sprintf (stemp, "%s.br%ld", dirname, layer);
         fbridge = fopen (stemp, "r");
         if (debug & 1) printf ("Trying to open %s for input\n", stemp);
         sprintf (stemp, "%s.ot%ld", dirname, layer);
         fotside = fopen (stemp, "r");
60       if (debug & 1) printf ("Trying to open %s for input\n", stemp);
```

RD-23,619

- 129 -

```
        traphit = trapmisd = trap0height = 0;
        if ((NULL != finside) || (NULL != fbridge) || (NULL != fotside)) {
            lox = upx = xadbnd [0] [0];
            loy = upy = yadbnd [0] [0];
            for (ic = 0; ic < maxic; ic++) {
                if (lox > xadbnd [ic] [0]) lox = xadbnd [ic] [0];
                if (loy > yadbnd [ic] [0]) loy = yadbnd [ic] [0];
                if (upx < xadbnd [ic] [3]) upx = xadbnd [ic] [3];
                if (upy < yadbnd [ic] [3]) upy = yadbnd [ic] [3];
            }
            if (NULL != fotside) {
                while (EOF != fscanf (fotside, "%ld %ld %ld %ld",
                    &xxl, &yyl, &xxu, &yyu)) {
                    if (extra_width!=0) {
                        xxl-=extra_width; yyl-=extra_width;
                        xxu+=extra_width; yyu+=extra_width;
                    }
                    if (lox > xxl) lox = xxl;
                    if (loy > yyl) loy = yyl;
                    if (upx < xxu) upx = xxu;
                    if (upy < yyu) upy = yyu;
                }
                rewind (fotside);
            }
            nchunk = 0;
            max_chgs_per_line = 0;
            if (fdiag) fprintf (fdiag, "Starting chunk %d\n", nchunk);
            return (1);
        }
        else return (0);
}

/*************************************************************************
 ***
 *      Get the bridge and inside data for this swath
 *************************************************************************
 **/
get_swath_data (lowerx, upperx, lowery, uppery)
    long    lowerx, upperx, lowery, uppery;
{
    int   ic;
    long  xxl, yyl, xxu, yyu;

if (debug & 128) printf ("Entering routine  get_swath_data\n");
    if (lowery > uppery) {
        yyl    = lowery;
        lowery = uppery;
        uppery = yyl;
    }
    if (NULL != finside) {
        rewind (finside);
        max_in_dat = 0;
        while (EOF != fscanf (finside, "%d %ld %ld %ld %ld", &ic,
            &xxl, &yyl, &xxu, &yyu)) {
            if (extra_width!=0) {
                xxl-=extra_width; yyl-=extra_width;
                xxu+=extra_width; yyu+=extra_width;
            }
            if ((xxu >= lowerx - maxmove) && (xxl <= upperx + maxmove) &&
                (yyu >= lowery - maxmove) && (yyl <= uppery + maxmove)) {
```

HD-23,619

- 130 -

```
                    if (max_in_dat==MAXINDAT) {
                      printf ("Error: max_in_dat overflow in c.line 817\n");
                      errorlog(3);
                      exit(3);
                      }
                    else {
                      indat_ic [max_in_dat] = ic;
                      indat_xl [max_in_dat] = xxl;
                      indat_xu [max_in_dat] = xxu;
                      indat_yl [max_in_dat] = yyl;
                      indat_yu [max_in_dat] = yyu;
                      max_in_dat++;
                      }
                  }
              }
           }
           if (NULL != fbridge) {
              rewind (fbridge);
              max_br_dat = 0;
              while (EOF != fscanf (fbridge, "%d %ld %ld %ld %ld", &ic,
                  &xxl, &yyl, &xxu, &yyu)) {
                 if (extra_width!=0) {
                    xxl-=extra_width; yyl-=extra_width;
                    xxu+=extra_width; yyu+=extra_width;
                    }
                 if ((xxu >= lowerx - maxmove) && (xxl <= upperx + maxmove) &&
                     (yyu >= lowery - maxmove) && (yyl <= uppery + maxmove)) {
                    if (max_br_dat==MAXBRDAT) {
                      printf ("Error: max_br_dat overflow in c.line 842\n");
                      errorlog(3);
                      exit(3);
                      }
                    else {
                      brdat_ic [max_br_dat] = ic;
                      brdat_xl [max_br_dat] = xxl;
                      brdat_xu [max_br_dat] = xxu;
                      brdat_yl [max_br_dat] = yyl;
                      brdat_yu [max_br_dat] = yyu;
                      max_br_dat++;
                      }
                  }
              }
           }
           if (NULL != fotside) {
              rewind (fotside);
              max_ot_dat = 0;
              while (EOF != fscanf (fotside, "%ld %ld %ld %ld",
                  &xxl, &yyl, &xxu, &yyu)) {
                 if (extra_width!=0) {
                    xxl-=extra_width; yyl-=extra_width;
                    xxu+=extra_width; yyu+=extra_width;
                    }
                 if ((xxu >= lowerx - maxmove) && (xxl <= upperx + maxmove) &&
                     (yyu >= lowery - maxmove) && (yyl <= uppery + maxmove)) {
                    if (max_ot_dat==MAXOTDAT) {
                      printf ("Error: max_ot_dat overflow in c.line 867\n");
                      errorlog(3);
                      exit(3);
                      }
                    else {
```

HD-23,619

- 131 -

```
                otdat_xl [max_ot_dat] = xxl;
                otdat_xu [max_ot_dat] = xxu;
                otdat_yl [max_ot_dat] = yyl;
                otdat_yu [max_ot_dat] = yyu;
                max_ot_dat++;
            }
         }
      }
   }
}

/************************************************************************
***
*       Make a new binary file, and clear all buffers
************************************************************************
**/
make_swath_file (swath_number, layer, lowerx, starting_y, direction)
    long                           lowerx, starting_y;
    int        swath_number, layer,                    direction;
{
    int   ix;
    long  header [10];

if (debug & 128) printf ("Entering routine  make_swath_file\n");
    for (ix = 0; ix < (sizx_16); ix++) xor_map [ix] = 0;
    rll_buffer [0] = -1;
    if (direction == 1) rll_buffer [1] = loy / ydiv;
    else                rll_buffer [1] = upy / ydiv;
    sprintf (stemp, "%s.r%c%ld", basedir, swath_number + 'a', layer);
    if (debug & 1) printf ("Opening binary file %s out\n", stemp);
    if (NULL == (fbin = fopen (stemp, "w+b"))) {
        printf ("Error: Unable to open %s for output c.line 723\n", stemp);
        errorlog(1);
        exit (1);
    }
    header [0] = direction;     /* +1 for laser move (??north), else -1 */
    header [1] = lowerx;        /* left end of laser, substrate microns */
    header [2] = starting_y;    /* starting y value, substrate microns */
    header [3] = starting_y / ydiv;
    header [4] = sizx;          /* number of pixels per x scan */
    header [5] = upy - loy;     /* y microns from swath start to swath end
*/
    header [6] = 0;             /* filled later with total words of file */
    if (10 != fwrite (header, 4, 10, fbin)) {
        printf ("Error: c.line 734 write failure\n");
        errorlog(2);
        exit (2);
    }
    if (btest & 4) {
        printf ("Header for %s is:\n", stemp);
        printf (" %ld %ld %ld %ld %ld %ld %ld\n", header [0], header [1],
              header [2], header [3], header [4], header [5], header [6]);
    }
    file_length = 0;
}

/************************************************************************
***
*       close the swath file after re-writing the length
```

HD-23,619

- 132 -

```
         /******************************************************************
         **/
         finish_swath_file ()
         {
 5           long    header [10];

if (debug & 128) printf ("Entering routine  finish_swath_file\n");
             rewind (fbin);
             if (10 != fread  (header, 4, 10, fbin)) {
10              printf ("Error: c.line 755 read   failure\n");
                errorlog(2);
                exit (2);
             }
             rewind (fbin);
15           header [6] = file_length;   /* total 16 bit words following header */
             if (10 != fwrite (header, 4, 10, fbin)) {
                printf ("Error: c.line 761 read   failure\n");
                errorlog(2);
                exit (2);
20           }
             fclose (fbin);
             if (btest & 4) printf ("Rewrote file length (header [6]) as %ld\n",
                 header [6]);
         }
25
         /******************************************************************
         ***
         *      Clear the bitmap to all 0s
         ******************************************************************
30       **/
         clear_bitmap ()
         {
             int   ix, iy;

35           if (debug & 128) printf ("Entering routine  clear_bitmap\n");
             for (iy = 0; iy < sizy; iy++)
                for (ix = 0; ix < (sizx_16); ix++)
                    bit_map [iy] [ix] = 0;
             any_bits_set = 0;
40       }

/******************************************************************
         ***
         *      Find out if this ic (ic) is hit by this chunk
45       ******************************************************************
         **/
         hit_this_ic (ic)
            int ic;
         {
50           if (xadbnd [ic] [3] < lxlchunk) return (0);
             if (yadbnd [ic] [3] < lylchunk) return (0);
             if (xadbnd [ic] [0] > lxuchunk) return (0);
             if (yadbnd [ic] [0] > lyuchunk) return (0);
             return (1);
55       }

/******************************************************************
         ***
         *      Linearize the x co-ordinates for laser2
60       *  xxx has the x co-ordinate in absolute microns.  correct assuming that
```

HD-23,619

- 133 -

```
              * first point of laser scan is x = lxlchunk microns
              * (x - lxlchunk) * err_dx = intervals into linearizer
              ***********************************************************************
              **/
 5            long linearx (xxx)
                  long    xxx;
              {
                  int    j;
                  long   x, y, delta;
10                float  part;

if ((maxlin == 0) || (skip_linear)) return (xxx);
                  x = xxx - lxlchunk;
                  j = (int) (part = x * err_dx);
15                part -= (float) j;
                  if (debug & 2048) printf ("correct segment %3d %f\n", j, part);
                  if ((j < 0) || (j > maxlin - 1)) return (xxx);
                  if (j == maxlin - 1) delta = SMQ * (float) (xerr [maxlin - 1]);
                  else           delta = SMQ *
20                    (part * (float)(xerr[j+1]) + (1.0 - part) * (float)(xerr[j]));
                  if (debug & 2048) printf ("correction = %10ld\n", delta);
                  return (xxx - delta);
              }

25            /***********************************************************************
              ***
              *      Unlinearize the x co-ordinates for laser2
              * xxx has the x co-ordinate in linearized microns (pixels * 3). Correct
              * assuming first point of laser scan is x = lxlchunk microns
30            * (x - lxlchunk) * err_dx = intervals into linearizer
              ***********************************************************************
              **/
              long unlinearx (xxx)
                  long    xxx;
35            {
                  int    j;
                  long   guess, error;

if ((maxlin == 0) || (skip_linear)) return (xxx);
40                guess = xxx;
                  for (j = 0; j < 20; j++) {
                      error = xxx - linearx (guess);
                      if ((error < 3) && (error > -3)) break;
                      guess += error;
45                }
                  return (guess);
              }

/***********************************************************************
50            ***
              *      Make the trapezoids in mmxy into other trapezoids in this chunk
              * incoming data is mxy[01] = x1,y1 long int, microns from lower left
              *                  mxy[23] = x2,y2 long int, microns from lower left
              *                  mxy[45] = x3,y3 long int, microns from lower left
55            *                  mxy[67] = x4,y4 long int, microns from lower left
              * these numbers are non-linearized absolute values
              *
              *         x1y1----------x4y4
              *          |             |
60            *          |             |
```

HD-23,619

- 134 -

```
    *           x2y2----------x3y3
    *
    *****************************************************************
    **/
5   set_traps (mxy)
        long mxy [];
    {
        long x1, y1, x2, y2, x3, y3, x4, y4, lx, rx, minx, maxx;
        float f12, f23, f34, f41;
10
        if ((mxy [0] > lxuchunk) && (mxy [2] > lxuchunk)) return;
        if ((mxy [4] < lxlchunk) && (mxy [6] < lxlchunk)) return;
        if ((mxy [1] > lyuchunk) && (mxy [7] > lyuchunk)) return;
        if ((mxy [3] < lylchunk) && (mxy [5] < lylchunk)) return;
15      mxy [0] = linearx (mxy [0]);
        mxy [2] = linearx (mxy [2]);
        mxy [4] = linearx (mxy [4]);
        mxy [6] = linearx (mxy [6]);
        if (mxy [1] <= mxy [7]) {
20          x1 = mxy [0] / xdiv;
            y1 = mxy [1] / ydiv;
            x2 = mxy [2] / xdiv;
            y2 = mxy [3] / ydiv;
            x3 = mxy [4] / xdiv;
25          y3 = mxy [5] / ydiv;
            x4 = mxy [6] / xdiv;
            y4 = mxy [7] / ydiv;
        }
        else {
30          x1 = mxy [6] / xdiv;
            y1 = mxy [7] / ydiv;
            x2 = mxy [0] / xdiv;
            y2 = mxy [1] / ydiv;
            x3 = mxy [2] / xdiv;
35          y3 = mxy [3] / ydiv;
            x4 = mxy [4] / xdiv;
            y4 = mxy [5] / ydiv;
        }
        minx = maxx = x1;
40      if (minx > x2) minx = x2; if (maxx < x2) maxx = x2;
        if (minx > x3) minx = x3; if (maxx < x3) maxx = x3;
        if (minx > x4) minx = x4; if (maxx < x4) maxx = x4;
        if (y1 != y2) f12 = ((float) (x1 - x2)) / ((float) (y1 - y2));
        else          f12 = 0.;
45      if (y2 != y3) f23 = ((float) (x2 - x3)) / ((float) (y2 - y3));
        else          f23 = 0.;
        if (y3 != y4) f34 = ((float) (x3 - x4)) / ((float) (y3 - y4));
        else          f34 = 0.;
        if (y4 != y1) f41 = ((float) (x4 - x1)) / ((float) (y4 - y1));
50      else          f41 = 0.;
        if (y4 != y1) {
            if (y2 < y4) {
                trap_fill (y1, y2, x1, x1, f12, f41, minx, maxx);
                rx = x1 + (y2 - y1) * f41;
55              if (y3 >= y4) {
                    trap_fill (y2, y4, x2, rx, f23, f41, minx, maxx);
                    if (y3 > y4) {
                        lx = x2 + (y4 - y2) * f23;
                        trap_fill (y4, y3, lx, x4, f23, f34, minx, maxx);
60                  }
```

HD-23,619

- 135 -

```
                }
                else printf ("Trapezoid error on c.line 904\n");
            }
            if (y2 > y4) {
                trap_fill (y1, y4, x1, x1, f12, f41, minx, maxx);
                lx = x1 + (y4 - y1) * f12;
                if (y3 >= y2) {
                    trap_fill (y4, y2, lx, x4, f12, f34, minx, maxx);
                    if (y3 > y2) {
                        rx = x4 + (y2 - y4) * f34;
                        trap_fill (y2, y3, x2, rx, f23, f34, minx, maxx);
                    }
                }
                else printf ("Trapezoid error on c.line 916\n");
            }
            if (y2 == y4) {
                trap_fill (y1, y2, x1, x1, f12, f41, minx, maxx);
                trap_fill (y2, y3, x2, x4, f23, f34, minx, maxx);
            }
        }
        if (y1 == y4) {
            if (y2 < y3) {
                trap_fill (y1, y2, x1, x4, f12, f34, minx, maxx);
                rx = x4 + (y2 - y4) * f34;
                trap_fill (y2, y3, x2, rx, f23, f34, minx, maxx);
            }
            if (y2 > y3) {
                trap_fill (y1, y3, x1, x4, f12, f34, minx, maxx);
                lx = x1 + (y3 - y1) * f12;
                trap_fill (y3, y2, lx, x3, f12, f23, minx, maxx);
            }
            if (y2 == y3) trap_fill (y1, y2, x1, x4, f12, f34, minx, maxx);
        }
        if (alarm) {
            fprintf (falarm, "set_traps (%ld %ld, %ld %ld, %ld %ld, %ld %ld)\n",
                mxy[0], mxy[1], mxy[2], mxy[3], mxy[4], mxy[5], mxy[6], mxy[7]);
            printf ("set_traps (%ld %ld, %ld %ld, %ld %ld, %ld %ld)\n",
                mxy[0], mxy[1], mxy[2], mxy[3], mxy[4], mxy[5], mxy[6], mxy[7]);
            alarm = 0;
        }
    }

/**********************************************************************
***
*       Make a trapezoid that the TMS320 can fill
*  starty, endy are long int values in pixels (~3 micron units)
*  leftx, rightx are long int values in linearized pixels (~3 micron units)
*       these values are measured from lower left of substrate
*  flxly, frxry are float values of x pixels change per y pixel (scan line)
*       for the left and right edges.
*  minx, maxx are long int values that limit trapezoid extent
***********************************************************************
**/
trap_fill (starty, endy, leftx, rightx, flxly, frxry, minx, maxx)
    long    starty, endy, leftx, rightx,               minx, maxx;
    float                                  flxly, frxry;
{
    int  ibit, ert;
    long slx, elx, srx, erx, temp;
    long ilay, ilby, iray, irby;
```

HD-23,619

- 136 -

```
            if (debug & 256) printf ("%ld %ld %ld %ld %f %f %d %d\n", starty, endy,
                leftx, rightx, flxly, frxry, iylchunk, iyuchunk);
    /****    exit immediate if trapezoid is totally above or below chunk ****/
            if (starty > iyuchunk) return;
            if (endy   < iylchunk) return;
    /****    convert into local chunk relative co-ordinates ****/
            mnx = minx   - ixlchunk - 1;
            mxx = maxx   - ixlchunk + 1;
            slx = leftx  - ixlchunk;
            srx = rightx - ixlchunk;
            elx = slx + (endy - starty) * flxly + .5;
            erx = srx + (endy - starty) * frxry + .5;
            if ((slx < mnx) || (slx > mxx) || (elx < mnx) || (elx > mxx) ||
                (srx < mnx) || (srx > mxx) || (erx < mnx) || (erx > mxx)) {
                printf ("Hotdog error in trap_fill at c.line 963\n");
                printf ("starty = %ld, endy = %ld, leftx = %ld, rightx = %ld\n",
                    starty, endy, leftx, rightx);
                printf ("flxly = %f, frxry = %f, minx = %ld, maxx = %ld\n",
                    flxly, frxry, minx, maxx);
                printf ("slx=%ld, srx=%ld, elx=%ld, erx=%ld, mnx=%ld, mxx=%ld\n",
                    slx, srx, elx, erx, mnx, mxx);
            }
            if (endy   > iyuchunk) {
                elx = slx + (iyuchunk - starty) * flxly + .5;
                erx = srx + (iyuchunk - starty) * frxry + .5;
                endy = iyuchunk;
            }
            if (starty < iylchunk) {
                slx = slx + (iylchunk - starty) * flxly + .5;
                srx = srx + (iylchunk - starty) * frxry + .5;
                starty = iylchunk;
            }
            starty -= iylchunk;
            endy   -= iylchunk;
            if (dchunk) {
                temp = slx; slx = elx; elx = temp;
                temp = srx; srx = erx; erx = temp;
                temp = starty; starty = endy; endy = temp;
                starty = sizy - 1 - starty;
                endy   = sizy - 1 - endy  ;
                flxly = -flxly;
                frxry = -frxry;
            }
    /****    exit if trapezoid is totally left or right of chunk ****/
            if ((slx >= sizx) && (elx >= sizx)) return;
            if ((srx <  0   ) && (erx <  0   )) return;
    /****    modify left or right edge if totally left or right of chunk ****/
            if ((slx <  0   ) && (elx <  0   )) { slx = elx = 0;           flxly = 0;
            }
            if ((srx >= sizx) && (erx >= sizx)) { srx = erx = sizx - 1; frxry = 0;
            }
    /****    calculate where all 4 corners are relative to the chunk ****/
            ibit = 0;
            if (slx <      0) ibit |= 0x01;
            if (slx >= sizx)  ibit |= 0x02;
            if (elx <      0) ibit |= 0x04;
            if (elx >= sizx)  ibit |= 0x08;
            if (srx <      0) ibit |= 0x10;
            if (srx >= sizx)  ibit |= 0x20;
```

HD-23,619

- 137 -

```
        if (erx <     0) ibit |= 0x40;
        if (erx >= sizx) ibit |= 0x80;
/****   calculate the left and right edge slopes (dx/dy) ****/
        if (endy - starty) {
            flxly = ((float) (elx - slx)) / ((float) (endy - starty));
            frxry = ((float) (erx - srx)) / ((float) (endy - starty));
        }
        else {
            flxly = frxry = 1.;
            trap0height++;
            if (debug & 512) {
                return;                 /**** TEMPORARY ****/
/*              printf ("endy = starty = %ld error on c.line 1018\n", endy);
*/
/*              printf ("startxl, r = %ld %ld, endxl, r = %ld %ld\n",
*/
/*                  slx, srx, elx, erx);
*/
/*              printf ("ibit = %d, chunk = %d\n", ibit, nchunk);
*/
            }
        }
        if (fdiag) fprintf (fdiag, "ibit %d ", ibit);
/****   calculate left and right edge intersect to left, right of chunk
****/
        if (flxly != 0.0) {
            ilay = starty- slx              / flxly + .5; /* lft trap, lft chunk
*/
            ilby = starty-(slx - sizx + 1) / flxly + .5; /* lft trap, rit chunk
*/
        }
        else ilay = ilby = 0;
        if (frxry != 0.0) {
            iray = starty- srx              / frxry + .5; /* rit trap, lft chunk
*/
            irby = starty-(srx - sizx + 1) / frxry + .5; /* rit trap, rit chunk
*/
        }
        else iray = irby = 0;
/****   re-arrange start or end y co-ord if both top or bottom end    ****/
/****   points are left or right of the chunk ****/
        if ((ibit & 0x11) == 0x11) {
            slx = slx + flxly * (iray - starty);
            srx = 0;
            starty = iray;
            ibit ^= 0x10;
            if (slx >= 0) ibit ^= 0x01;
        }
        if ((ibit & 0x22) == 0x22) {
            slx = sizx - 1;
            srx = srx + frxry * (ilby - starty);
            starty = ilby;
            ibit ^= 0x02;
            if (srx < sizx) ibit ^= 0x20;
        }
        if ((ibit & 0x44) == 0x44) {
            elx = slx + flxly * (iray - starty);
            erx = 0;
            endy = iray;
            ibit ^= 0x40;
```

HU-23,619

- 138 -

```
            if (elx >= 0) ibit ^= 0x04;
        }
        if ((ibit & 0x88) == 0x88) {
            elx = sizx - 1;
5           erx = srx + frxry * (ilby - starty);
            endy = ilby;
            ibit ^= 0x08;
            if (erx < sizx) ibit ^= 0x80;
        }
10      if ((slx < mnx) || (slx > mxx) || (elx < mnx) || (elx > mxx) ||
            (srx < mnx) || (srx > mxx) || (erx < mnx) || (erx > mxx)) {
            printf ("Hotdog error in trap_fill at c.line 1068\n");
            printf ("starty = %ld, endy = %ld, leftx = %ld, rightx = %ld\n",
                starty, endy, leftx, rightx);
15          printf ("flxly = %f, frxry = %f, minx = %ld, maxx = %ld\n",
                flxly, frxry, minx, maxx);
            printf ("slx=%ld, srx=%ld, elx=%ld, erx=%ld, mnx=%ld, mxx=%ld\n",
                slx, srx, elx, erx, mnx, mxx);
        }
20  /****   keep a record of how many of each trapezoid type was found ****/
        trap_type [ibit]++;
        ert = 0;
    /****   convert each trapezoid-chunk intersection to 1, 2 or 3 traps ****/
        if (((debug & 8) == 0) || (trap_level == ibit)) switch (ibit) {
25          case 0x00:  /* a tl bl tr br b */
                if (bitmap_write (ibit, starty, endy, slx, srx, flxly,frxry)) ert =
    1;
                break;
            case 0x01:  /* tl a bl tr br b */
30              slx = 0;
                if (bitmap_write (ibit, starty, ilay, slx, srx, 0.0, frxry)) ert =
    1;
                srx = srx + frxry * (ilay - starty);
                if (bitmap_write (ibit, ilay, endy, slx, srx, flxly, frxry)) ert =
35  2;
                break;
            case 0x02:  /* a bl tr br b tl */
                slx = sizx - 1;
                if (bitmap_write (ibit, ilby, endy, slx, srx, flxly, frxry)) ert =
40  1;
                break;
            case 0x04:  /* bl a tl tr br b */
                if (bitmap_write (ibit, starty, ilay, slx, srx, flxly, frxry)) ert =
    1;
45              slx = 0;
                srx = srx + frxry * (ilay - starty);
                if (bitmap_write (ibit, ilay, endy, slx, srx, 0.0, frxry)) ert = 2;
                break;
            case 0x06:  /* bl a tr br b tl */
50              slx = sizx - 1;
                if (bitmap_write (ibit, ilby, ilay, slx, srx, flxly, frxry)) ert =
    1;
                slx = 0;
                srx = srx + frxry * (ilay - starty);
55              if (bitmap_write (ibit, ilay, endy, slx, srx, 0.0, frxry)) ert = 2;
                break;
            case 0x08:  /* a tl tr br b bl */
                if (bitmap_write (ibit, starty, ilby, slx, srx, flxly, frxry)) ert =
    1;
60              break;
```

HD-23,619

- 139 -

```
case 0x09:   /* tl a tr br b bl */
    slx = 0;
    if (bitmap_write (ibit, starty, ilay, slx, srx, 0.0, frxry)) ert = 1;
    srx = srx + frxry * (ilay - starty);
    if (bitmap_write (ibit, ilay, endy, slx, srx, flxly, frxry)) ert = 2;
    break;
case 0x10:   /*  tr a tl bl br b */
    srx = 0;
    if (bitmap_write (ibit, iray, endy, slx, srx, flxly, frxry)) ert = 1;
    break;
case 0x20:   /*  a tl bl br b tr */
    srx = sizx - 1;
    if (bitmap_write (ibit, starty, irby, slx, srx, flxly, 0.0)) ert = 1;
    slx = slx + flxly * (irby - starty);
    if (bitmap_write (ibit, irby, endy, slx, srx, flxly, frxry)) ert = 2;
    break;
case 0x24:   /*  bl a tl br b tr */
    if (ilay > irby) {
        srx = sizx - 1;
        if (bitmap_write (ibit, starty, irby, slx, srx, flxly, 0.0)) ert=1;
        slx = slx + flxly * (irby - starty);
        if (bitmap_write (ibit, irby, ilay, slx, srx, flxly, frxry)) ert=2;
        slx = 0;
        srx = srx + frxry * (ilay - irby);
        if (bitmap_write (ibit, ilay, endy, slx, srx, 0.0, frxry)) ert = 3;
    }
    else {
        srx = sizx - 1;
        if (bitmap_write (ibit, starty, ilay, slx, srx, flxly, 0.0)) ert=4;
        slx = slx + flxly * (ilay - starty);
        if (bitmap_write (ibit, ilay, irby, slx, srx, 0.0, 0.0)) ert = 5;
        slx = 0;
        srx = srx + frxry * (irby - ilay);
        if (bitmap_write (ibit, irby, endy, slx, srx, 0.0, frxry)) ert = 6;
    }
    break;
case 0x40:   /* br a tl bl tr b */
    if (bitmap_write (ibit, starty, iray, slx, srx, flxly, frxry)) ert = 1;
    break;
case 0x41:   /* tl br a bl tr b */ /******* technically illegal ********/
    slx = 0;
    if (starty != endy) frxry = ((float) (erx - srx)) /
        ((float) (endy - starty));
    if (bitmap_write (ibit, starty, endy, slx, srx, 0.0, frxry)) ert = 1;
    break;
case 0x60:   /*  br a tl bl b tr */
```

HU-23,619

- 140 -

```
            srx = sizx - 1;
            if (bitmap_write (ibit, starty, irby, slx, srx, flxly, 0.0)) ert = 1;
            slx = slx + flxly * (irby - starty);
            if (bitmap_write (ibit, irby, iray, slx, srx, flxly, frxry)) ert = 2;
            break;
        case 0x80:   /*  a tl bl tr b br */
            if (bitmap_write (ibit, starty, irby, slx, srx, flxly, frxry)) ert = 1;
            srx = sizx - 1;
            slx = slx + flxly * (irby - starty);
            if (bitmap_write (ibit, irby, endy, slx, srx, flxly, 0.0)) ert = 2;
            break;
        case 0x81:   /*  tl a bl tr b br */
            if (ilay > irby) {
                slx = 0;
                if (bitmap_write (ibit, starty, irby, slx, srx, 0.0, frxry)) ert=1;
                srx = sizx - 1;
                if (bitmap_write (ibit, irby, ilay, slx, srx, 0.0, 0.0)) ert=2;
                if (bitmap_write (ibit, ilay, endy, slx, srx, flxly, 0.0)) ert = 3;
            }
            else {
                slx = 0;
                if (bitmap_write (ibit, starty, ilay, slx, srx, 0.0, frxry)) ert=4;
                srx = srx + frxry * (ilay - starty);
                if (bitmap_write (ibit, ilay, irby, slx, srx, flxly, frxry)) ert=5;
                srx = sizx - 1;
                slx = slx + flxly * (irby - ilay);
                if (bitmap_write (ibit, irby, endy, slx, srx, flxly, 0.0)) ert = 6;
            }
            break;
        case 0x90:   /*  tr a tl bl b br */
            srx = 0;
            if (bitmap_write (ibit, iray, irby, slx, srx, flxly, frxry)) ert = 1;
            srx = sizx - 1;
            if (bitmap_write (ibit, irby, endy, slx, srx, flxly, 0.0)) ert = 2;
            break;
        default:    /*  not classified */
            trapmisd++;
            printf ("Missed trapezoid %ld of type %d\n", trapmisd, ibit);
            printf ("   Y from %ld to %ld, left X %ld %ld, right X %ld %ld\n",
                starty, endy, slx, elx, srx, erx);
            printf ("Lfx=%ld Rtx=%ld Lxy=%f Rxy=%f\n",
                leftx, rightx, flxly, frxry);
            break;
        }
        if (ert) printf("ert=%d Sty=%ld Ndy=%ld Lfx=%ld Rtx=%ld Lxy=%f Rxy=%f\n",
            ert, starty, endy, leftx, rightx, flxly, frxry);
        if (alarm) {
            fprintf (falarm, "trap_fill (%ld, %ld, %ld, %ld, %f, %f, %ld, %ld)\n",
                starty, endy, leftx, rightx, flxly, frxry, minx, maxx);
```

HD-23,619

- 141 -

```
                printf ("trap_fill (%ld, %ld, %ld, %ld, %f, %f, %ld, %ld)\n",
                    starty, endy, leftx, rightx, flxly, frxry, minx, maxx);
            }
            return;
        }

/*************************************************************************
        ***
        *       Convert points to the rotated set of co-ordinates
        *************************************************************************
        **/
        convert (lxy, ic, lx, ly)
            int ic;
            long lxy [], lx, ly;
        { lxy [0] = lx + (ly - yref [ic]) * rotate [ic] + ((float) xoffset [ic]);
            lxy [1] = ly - (lx - xref [ic]) * rotate [ic] + ((float) yoffset [ic]);
        }

/*************************************************************************
        ***
        *       Read the reference file and get any non-default parameters
        *************************************************************************
        **/
        read_adp_file ()
        {
            int     j, ic;
            long    xcent, ycent, dmy;

if (debug & 128) printf ("Entering routine read_adp_file\n");
            sprintf (stemp, "%s.adp", dirname);
            if (debug & 1) printf ("Reading file %s\n", stemp);
            if (NULL == (fadp = fopen (stemp, "r"))) {
                printf ("Error: Cannot open file %s for input c.line 1229\n",
        stemp);
                errorlog(1);
                exit (1);
            }
            fscanf (fadp, "%d %f", &maxic, &fxydif);
            for (ic = 0; ic < maxic; ic++) {
                fscanf (fadp, "%ld %ld %ld %ld", &xadbnd [ic] [0], &xadbnd [ic] [1],
                    &xadbnd [ic] [2], &xadbnd [ic] [3]);
                if (extra_width!=0) {
                  xadbnd [ic] [0]+=extra_width; xadbnd [ic] [1]-=extra_width;
                  xadbnd [ic] [2]+=extra_width; xadbnd [ic] [3]-=extra_width;
                  }
                fscanf (fadp, "%ld %ld %ld %ld", &yadbnd [ic] [0], &yadbnd [ic] [1],
                    &yadbnd [ic] [2], &yadbnd [ic] [3]);
                if (extra_width!=0) {
                  yadbnd [ic] [0]+=extra_width; yadbnd [ic] [1]-=extra_width;
                  yadbnd [ic] [2]+=extra_width; yadbnd [ic] [3]-=extra_width;
                  }
                fscanf (fadp, "%ld %ld", &xcent, &ycent);
            }
            fscanf (fadp, "%ld %ld %ld %ld %ld", &dmy, &dmy, &dmy, &dmy, &dmy);
            fscanf (fadp, "%ld %ld", &xdiv, &ydiv);
            lxlchunk = 0;
            chnkx = movchnkx = dmy = sizx * xdiv;
            if (aperture) {
```

RD-23,619

- 142 -

```
        ap_holdoff  = unlinearx (lxlchunk + 48L * aperture);
        ap_earlyoff = unlinearx (lxlchunk + chnkx - 48L * aperture);
        movchnkx = ap_earlyoff - ap_holdoff - reduce_width;
        chnkx = chnkx + chnkx - linearx (chnkx);
        printf ("Aperture holdoff is %d microns, chunk x %ld microns\n",
            ap_holdoff, chnkx);
        printf ("Aperture earlyoff is %d microns, movchunk x %ld microns\n",
            ap_earlyoff, movchnkx);
    }
    else {
        chnkx = movchnkx = chnkx + chnkx - linearx (chnkx);
    }
    chnky = sizy * ydiv;
    printf ("Scan swath now %ld microns instead of %ld microns\n",
movchnkx,
        dmy);
    fclose (fadp);
    xmax = xmin + 1. / fxydif;
    ymax = ymin + 1. / fxydif;
    if (fadp_format) sprintf (stemp, "%s.%03ld", dirname, subnum);
    else            sprintf (stemp, "%s.aln", basedir);
    if (debug & 1) printf ("Reading file %s\n", stemp);
    if (NULL == (fadp = fopen (stemp, "r"))) {
        printf ("Cannot open file %s for input c.line 1267\n", stemp);
        printf ("Defaulting to no rotation or translation\n");
        for (ic = 0; ic < maxic; ic++) {
            xoffset [ic] = yoffset [ic] = rotate [ic] = 0;
            xref [ic] = yref [ic] = 0;
        }
    }
    else {
        if (fadp_format) {
            for (ic = 0; ic < maxic; ic++) {
                fscanf (fadp, "%d %ld %ld %f", &j, &xoffset[ic],
&yoffset[ic],
                    &rotate [ic]);
                fscanf (fadp, "%ld %ld", &xref [ic], &yref [ic]);
            }
            fclose (fadp);
        }
        else {
            fgets (stemp, 100, fadp);
            fgets (stemp, 100, fadp);
            fgets (stemp, 100, fadp);
            fgets (stemp, 100, fadp);
            for (ic = 0; ic < maxic; ic++) {
                fscanf (fadp, "%ld %ld", &xoffset [ic], &yoffset [ic]);
                fgets (stemp, 100, fadp);
                fscanf (fadp, "%ld %ld %f", &xref [ic], &yref [ic],
                    &rotate [ic]);
                fgets (stemp, 100, fadp);
            }
            fclose (fadp);
        }
    }
    if (partition>1) printf("Y Partition Size Factor = %d\n",partition);
}

/*******************************************************************
***
```

HD-23,619

- 143 -

```
        *       Get the parameters entered on the command line
        ************************************************************************
        **/
        get_params (argc, argv)
5             int     argc;
              char        *argv [];
        {
              int   i;
              float w;
10            FILE  *ftemp;
              long  atol ();    / external routine from standard library */ btest = debug = 0;
              fdiag = 0;
15            basename [0] = 0;
              trap_level = 0;
              for (i = 1; i < argc; i++) {
                    if (argv [i] [0] == '-') {
                          switch (argv [i] [1]) {
20                            case 'a': case 'A':
                                aperture = 2.56 * (100 - atoi (&argv [i] [2]));
                                printf ("Reducing size by %d words each end\n", aperture);
                                break;
                              case 'b': case 'B':
25                              btest = atoi (&argv [i] [2]);
                                break;
                              case 'c': case 'C':
                                column_break = atoi (&argv [i] [2]);
                                break;
30                            case 'd': case 'D':
                                debug = atoi (&argv [i] [2]);
                                break;
                              case 'e': case 'E':
                                extra_width = atol (&argv [i] [2]);
35                              break;
                              case 'f': case 'F':
                                if (NULL == (fdiag = fopen ("diagnost.kgv", "w")))
                                    printf ("Unable to open diagnost.kgv c.line 1330\n");
                                break;
40                            case 'i': case 'I':
                                invert = 1;
                                break;
                              case 'k': case 'K':
                                maxmove = atol (&argv [i] [2]);
45                              /* enter 10000 for very large adaption offsets: microwave */
                                break;
                              case 'l': case 'L':
                                trap_level = atoi (&argv [i] [2]);
                                break;
50                            case 'm': case 'M':
                                metal_only = atoi (&argv [i] [2]);
                                break;
                              case 'o': case 'O':
                                fadp_format = 1;
55                              break;
                              case 'p': case 'P':
                                partition = abs(atoi(&argv [i] [2]));
                                break;
                              case 'q': case 'Q':
60                              quit_early = 1;
```

- 144 -

```
        break;
    case 'r': case 'R':
        reverse = 1;
        break;
    case 's': case 'S':
        subnum = atol (&argv [i] [2]);
        break;
    case 't': case 'T':
        if (NULL == (ftemp = fopen ("lgvtest.xy", "r"))) {
            printf ("Unable to read test values\n");
            break;
        }
        fscanf (ftemp, "%ld %ld %ld %ld", &x1_debug, &y1_debug,
            &x2_debug, &y2_debug);
        fclose (ftemp);
        x1_debug /= xdiv;
        x2_debug /= xdiv;
        y1_debug /= ydiv;
        y2_debug /= ydiv;
        if (NULL == (falarm = fopen ("alarm.out", "w"))) {
            printf ("Unable to write test values\n");
            x1_debug = 0;
            break;
        }
        break;
    case 'u': case 'U':
        uni_directional = 0;
        break;
    case 'w': case 'W':
        reduce_width = atol (&argv [i] [2]);
        break;
    case 'x': case 'X':
        sizx = atoi (&argv [i] [2]);
        if (sizx > SIZX) {
            printf ("X swath of %d is too large, using %d\n",
                sizx, SIZX);
            sizx = SIZX;
        }
        sizx_16 = (sizx + 15) / 16;
        break;
    case 'y': case 'Y':
        sizy = atoi (&argv [i] [2]);
        if (sizy > 512) printf ("TOO LARGE A Y\n");
        break;
    case 'z': case 'Z':
        skip_linear = 1;
        break;
    default:
        printf ("Unrecognized switch %s as parameter %d\n",argv[i],i);
        break;
    }
  }
  else sprintf (basename, "%s", argv [i]);
}
sprintf (dirname, "%s%s%s%s", dirroot, basename, dirsep, basename);
sprintf (basedir, "%s%s%s%06ld", dirroot, basename, dirsep, subnum);
}
```

HD-23,619

- 145 -

```
/***********************************************************************
***
*       Initialize the system
***********************************************************************
**/
initsys ()
{
    int     i, j;
    char    stmp [40];
    FILE    *ftemp;

for (i = 0; i < 256; i++) trap_type [i] = 0;
    for (i = 0; i < sizy; i++) {
        j = i;
        if (btest & 256) j = sizy - 1 - i;
        if (NULL == (bit_map [j] = malloc (2 * SIZX_16))) {
            printf ("Error: Unable to allocate enough memory c.line 1391\n");
            errorlog(2);
            exit (2);
        }
    }
    icnumber = maxic = 0;
    xmin = ymin = 0;
    xmax = ymax = 1000;
    rll_count = 0;
    sprintf (stmp, "c:\\hdi2\\ref\\linearty.map");
    ftemp = fopen (stmp, "r");
    if (debug & 1) printf ("Opened %s for input\n", stmp);
    if (NULL == ftemp) maxlin = 0;
    else {
        fgets (stmp, 80, ftemp);
        fscanf (ftemp, "%d", &maxlin);
        for (i = 0; i < maxlin; i++)
            fscanf (ftemp, "%ld %ld %ld", &xlin[i], &xerr[i], &yerr[i]);
        fclose (ftemp);
        err_dx = 1.0 / (SMQ * ((float) (xlin [1] - xlin [0])));
        if (debug & 2048) printf ("Correcting %3d steps at %f\n", maxlin,
            err_dx);
    }
}

/***********************************************************************
***
        errorlog() - system call for error file creation
***********************************************************************
**/ int errorlog(errlevel)
int errlevel;

{
FILE *ftemp;

sprintf (stemp, "%s.err",basedir);
    if (NULL==(ftemp=fopen(stemp, "w"))) {
      printf("Error: unable to open error log\n");
      }
    else {
      fprintf(ftemp,"LGV_NEW.C exit code %d detected\n",errlevel);
```

RD-23,619

- 146 -

```
        fprintf(ftemp,"file: %s, metal level: %d\n",basedir,metal_only);
        fclose(ftemp);
        }
    }
```

What is claimed is:

1. An adaptive method of providing electrical interconnections for a plurality of feed-through lines, each of the feed-through lines having a respective end extending to at least one substrate surface, the method comprising:

generating an artwork representation for the electrical interconnections using specified feed-through line end positions on the at least one substrate surface;

determining actual positions of at least two of the feed-through line ends;

estimating a scale factor using the actual positions of the at least two of the feed-through line ends;

performing calculations to estimate actual positions of others of the feed-through line ends using the scale factor and the determined actual positions of the at least two of the feed-through line ends;

modifying the artwork representation to properly include electrical interconnections to ones of the feed-through line ends which are not in their specified positions; and forming the electrical interconnections for the feed-through lines using the modified artwork.

2. The method of claim 1 wherein the at least one substrate surface comprises a surface of a stack of substrates with at least two substrates having feed-through line ends facing a common direction.

3. The method of claim 2 wherein the specified positions of the feed-through line ends are stored in a first database and the step of generating the artwork representation comprises the steps of:

providing a circuit layout of a pattern of electrical conductors including the specified feed-through line end positions; and storing a representation of the circuit layout in a second database describing an electrical interconnection structure for providing the electrical interconnections for the feed-through line ends in their specified positions.

4. The method of claim 3 wherein the step of storing the representation of the circuit is performed by storing a turn point polygon representation of the circuit layout in the second database.

5. The method of claim 4, wherein the step of modifying the artwork representation comprises:

comparing the positions of the at least two of the feed-through line ends with respective specified positions; and after performing calculations to estimate the actual positions of the others of the feed-through line ends, calculating a translation and rotation for each of the feed-through line ends based on the comparing step.

6. The method of claim 5 wherein the step of modifying the artwork representation further includes generating a third database describing the actual locations of each of the feed-through line ends with respect to the at least one substrate surface and wherein said step of comparing compares entries in the first and third databases.

7. The method of claim 6 wherein the step of modifying the artwork representation further comprises producing a fourth database by altering the second database according to the scale factor estimation and the translation and rotation calculations for each of the feed-through line ends to produce a fourth database storing a turn point polygon representation of the modified artwork.

8. The method of claim 7 wherein the step of forming the electrical interconnections comprises converting the turn point polygon representation of the modified artwork in the fourth database to a rectangular representation; and controlling a laser in accordance with the rectangular representation of the modified artwork.

9. The method of claim 1 wherein the specified feed-through line end positions are situated in a row and the at least two of the feed-through line ends for which actual positions are determined are situated at opposite ends of the row.

10. An adaptive system for providing electrical interconnections for a plurality of feed-through lines, each of the feed-through lines having a respective end extending to at least one substrate surface, the system comprising:

means for generating an artwork representation for the electrical interconnections using specified feed-through line end positions on the at least one substrate surface;

means for determining actual positions of at least two of the feed-through line ends;

means for estimating a scale factor using the actual positions of the at least two of the feed-through line ends;

means for performing calculations to estimate actual positions of others of the feed-through line ends using the scale factor and the determined actual positions of the at least two of the feed-through line ends;

means for modifying the artwork representation to properly include electrical interconnections to ones of the feed-through line ends which are not in their specified positions; and means for forming the electrical interconnections for the feed-through lines using the modified artwork.

11. The system of claim 10 wherein the at least one substrate surface comprises a surface of a stack of substrates with at least two substrates having feed-through line ends facing a common direction.

12. The system of claim 11 wherein the means for generating the artwork representation for the electrical interconnections using specified feed-through line end positions on the at least one substrate surface include means for storing the specified positions of the feed-through line ends in a first database, and wherein the means for generating an artwork representation for the electrical interconnections using specified feed-through line end positions on the at least one substrate surface include:

means for providing a circuit layout of a pattern of electrical conductors including the specified feed-through line end positions; and means for storing a representation of the circuit layout in a second database describing an electrical interconnection structure for providing the electrical interconnections for the feed-through line ends in their specified positions.

13. The system of claim 12 wherein the means for storing the representation of the circuit layout in the second database comprise means for storing a turn point polygon representation of the circuit layout in the second database.

14. The system of claim 10 wherein the specified feed-through line end positions are situated in a row and the means for determining actual positions of the at least two of the feed-through line ends include means for determining actual positions of two of the feed-through line ends which are situated at opposite ends of the row.

* * * * *